(12) United States Patent
Masuoka et al.

(10) Patent No.: US 9,076,767 B2
(45) Date of Patent: Jul. 7, 2015

(54) SEMICONDUCTOR DEVICE HAVING A SURROUND GATE TRANSISTOR

(71) Applicant: Unisantis Electronics Singapore Pte.Ltd., Peninsula Plaza (SG)

(72) Inventors: Fujio Masuoka, Tokyo (JP); Tomohiko Kudo, Tokyo (JP)

(73) Assignee: UNISANTIS ELECTRONICS SINGAPORE PTE LTD., Peninsula Plaza (SG)

( * ) Notice: Subject to any disclaimer, the term of this patent is extended or adjusted under 35 U.S.C. 154(b) by 0 days.

(21) Appl. No.: 14/478,339

(22) Filed: Sep. 5, 2014

(65) Prior Publication Data

US 2015/0001614 A1 Jan. 1, 2015

Related U.S. Application Data

(62) Division of application No. 13/933,650, filed on Jul. 2, 2013, now Pat. No. 8,860,128, which is a division of application No. 12/787,929, filed on May 26, 2010, now Pat. No. 8,502,303.

(60) Provisional application No. 61/217,595, filed on Jun. 2, 2009.

(30) Foreign Application Priority Data

May 29, 2009 (JP) .................................. 2009130583

(51) Int. Cl.
*H01L 29/78* (2006.01)
*H01L 29/66* (2006.01)
(Continued)

(52) U.S. Cl.
CPC ...... *H01L 29/4238* (2013.01); *H01L 21/26586* (2013.01); *H01L 29/086* (2013.01);
(Continued)

(58) Field of Classification Search
CPC .................... H01L 29/0676; H01L 29/66666; H01L 29/7827; H01L 29/7828

USPC .......... 257/327–346, 296–313, 365, E29.131, 257/E29.262, E21.375, E21.41, E29.274; 977/936, 938

See application file for complete search history.

(56) References Cited

U.S. PATENT DOCUMENTS 4,941,026 A 7/1990 Temple
5,929,477 A 7/1999 McAllister Burns et al.
(Continued)

FOREIGN PATENT DOCUMENTS

EP 1148552 10/2001
GB 2366449 3/2002
(Continued)

OTHER PUBLICATIONS

Office Action for counterpart Japanese Application No. 2009-130583, dated Jul. 17, 2009, 22 pages.
(Continued)

*Primary Examiner* — Steven J Fulk
*Assistant Examiner* — Eric Ward
(74) *Attorney, Agent, or Firm* — Brinks Gilson & Lione

(57) ABSTRACT

A semiconductor device includes a first-conductive type first pillar, a first dielectric surrounding the first pillar, a gate surrounding the dielectric, a second pillar underneath the first pillar, and a third pillar on a top of the first pillar. The second pillar has a second-conductive type region in a surface thereof except at least a part of a contact surface with the first pillar, and a first-conductive type region surrounded by the second-conductive type region. The third pillar has a second-conductive type impurity region in a surface thereof except a part of a contact surface with the first pillar, and a first-conductive type region therein and surrounded by the second-conductive type region of the third pillar. The first-conductive type region of each of the second and third pillars has a length greater than that of a depletion layer extending from a base of the second-conductive type region of one of the second and third pillars.

23 Claims, 70 Drawing Sheets

(51) Int. Cl.
  *H01L 29/423* (2006.01)
  *H01L 21/265* (2006.01)
  *H01L 29/08* (2006.01)
  *H01L 29/786* (2006.01)

(52) U.S. Cl.
  CPC ...... *H01L29/0878* (2013.01); *H01L 29/42356* (2013.01); *H01L 29/42392* (2013.01); *H01L 29/66666* (2013.01); *H01L 29/66742* (2013.01); *H01L 29/7827* (2013.01); *H01L 29/78618* (2013.01); *H01L 29/78642* (2013.01)

(56) References Cited

U.S. PATENT DOCUMENTS

| | | | |
|---|---|---|---|
| 6,060,746 | A | 5/2000 | Bertin et al. |
| 6,436,770 | B1 | 8/2002 | Leung et al. |
| 6,603,168 | B1 | 8/2003 | Choi |
| 7,115,971 | B2 | 10/2006 | Stumbo et al. |
| 7,378,702 | B2 | 5/2008 | Lee |
| 7,598,134 | B2 | 10/2009 | Mouli |
| 8,343,832 | B2 | 1/2013 | Nishi et al. |
| 2004/0262681 | A1 | 12/2004 | Masuoka et al. |
| 2006/0046392 | A1 | 3/2006 | Manning et al. |
| 2008/0149914 | A1* | 6/2008 | Samuelson et al. ............... 257/9 |
| 2008/0169503 | A1 | 7/2008 | Appenzeller et al. |
| 2008/0251825 | A1 | 10/2008 | Lee |
| 2011/0303973 | A1 | 12/2011 | Masuoka et al. |

FOREIGN PATENT DOCUMENTS

| | | |
|---|---|---|
| JP | 2007-123415 | 5/2007 |
| KR | 10-2001-0098730 | 11/2001 |

OTHER PUBLICATIONS

Final Rejection for counterpart Japanese Application No. 2009-130583, dated Nov. 13, 2009, 10 pages.

Nishi et al., "Concave Source SGT for Suppressing Punch-Through Effect", Journal C of the Institute of Electronics, Information and Communication Engineers (IEICE), vol. J86-C, No. 2, Feb. 2003, pp. 200-201.

Takato, Hiroshi et al., "Impact of Surrounding Gate Trasistor (SGT) for Ultra-High-Density LSI's," IEEE Transactions on Electron Devices, vol. 38, No. 3, Mar. 1991, pp. 573-578.

Iwai et al., "High-Performance Buried-Gate Surrounding Gate Transistor for Future Three-Dimensional Devices" Japanese Journal of Applied Physics, vol. 43, No. 10, 2004, pp. 6904-6906.

Oh et al., "50 nm Vertical Replacement-Gate (VRG) pMOSFETs," IEEE, 2000, pp. 65-68.

Extended European Search Report for European Application No. 10005650.6, dated Jul. 19, 2011, 8 pages.

Notice of Allowance for U.S. Appl. No. 13/933,650 dated Jul. 25, 2014, 10 pages.

* cited by examiner

Prior art

Prior art

Prior art

PRIOR ART

SEMICONDUCTOR DEVICE HAVING A SURROUND GATE TRANSISTOR

RELATED APPLICATIONS

This application is a divisional patent application of U.S. patent application Ser. No. 13/933,650, filed Jul. 2, 2013, which is a divisional patent application of U.S. Ser. No. 12/787,929, filed May 26, 2010, which pursuant to 35 U.S.C. §119(e) claims the benefit of the filing date of Provisional U.S. Patent Application Ser. No. 61/217,595 filed on Jun. 2, 2009. This application also claims priority under 35 U.S.C. §119(a) to JP2009-130583 filed on May 29, 2009. The entire contents of these applications are hereby incorporated by reference.

BACKGROUND OF THE INVENTION

1. Field of the Invention

The present invention relates to a semiconductor device, and more specifically to a semiconductor device having a surrounding gate transistor (SGT) which is a three-dimensional semiconductor.

2. Description of the Related Art

Based on miniaturization, a planar transistor is used in a wide range of fields, such as computers, communication devices, measurement devices, automatic control devices and domestic devices, as a low-power consumption, low-cost, high-throughput microprocessor, ASIC or microcomputer, and a low-cost, large-capacity memory. However, the planar transistor is two-dimensionally formed on a semiconductor substrate. Specifically, in the planar transistor, a source, a gate and a drain are horizontally structured on a surface of a silicon substrate. In contrast, an SGT is formed in a structure where a source, a gate and a drain are arranged in a vertical direction with respect to a silicon substrate, wherein the gate is formed to surround a convex semiconductor layer (see, for example, the following Non-Patent Document 1, FIG. 144). Thus, in the SGT, an occupancy area can be largely reduced as compared with the planar transistor.

However, in the SGT, a gate length becomes shorter along with miniaturization of ultra-large-scale integrated (ULSI) circuits, so that an off-leak current, i.e., a drain current when a voltage is applied to a drain electrode under a condition that a voltage applied to each of a gate electrode and a source electrode is zero V, becomes larger.

As means to reduce such an off-leak current, there has been known a technique of forming a source and a drain in a cup-like or concave structure, as disclosed, for example, in the following Non-Patent Document 2 and Patent Document 1.

An SGT structure having a conventional source/drain structure as disclosed in the Non-Patent Document 2 is shown in FIGS. 139 and 140. As is clear, particularly, from FIG. 140, the conventional source/drain structure has a horizontally flat distribution. Differently, in a source formed in a concave structure as shown in FIGS. 141 and 142, a potential barrier between the source and a pillar body during application of a voltage to a drain can be increased as compared with the conventional structure, to provide a higher punch-through voltage. Particularly, a much higher punch-through voltage can be provided by reducing a length X which is a depth of a source or drain.

Further, as disclosed in the Patent Document 1, it is also studied to form each of a source and a drain in a concave structure (FIG. 143).

PRIOR ART DOCUMENT

[Patent Document 1] JP 2007-123415A
[Non-Patent Document 1] H. Takato et al., IEEE Transaction on Electron Devices, Vol. 38, No. 3, March 1991, pp. 573-578
[Non-Patent Document 2] R. Nishi, Journal C of the Institute of Electronics, Information and Communication Engineers (IEICE), Vol. J86-C, No. 2, February 2003, pp. 200-201,

SUMMARY OF THE INVENTION

The above conventional SGT structure is designed such that only a source region having a concave structure is sufficiently small, or each of a source region and a drain region has a concave structure. Practically, in a source or drain region having a concave structure, it is desirable that a region surrounded by the concave source or drain region is sufficiently large.

The present invention has been made in view of the above circumstances, and it is an object thereof to provide a semiconductor device designed such that a source and/or a drain are formed in a concave shape to solve a problem that power consumption of an SGT is increased due to an increase in off-leak current.

In order to achieve the above object, according to one aspect of the present invention, there is provided a semiconductor device which comprises: a first-conductive type first silicon pillar: a first dielectric surrounding a side surface of the first silicon pillar; a gate surrounding the dielectric; a second silicon pillar provided underneath the first silicon pillar; and a third silicon pillar provided on a top of the first silicon pillar, wherein: the second silicon pillar has a second-conductive type high-concentration impurity region formed in a surface thereof except at least a part of a contact surface region with the first silicon pillar, and a first-conductive type impurity region formed therein and surrounded by the second-conductive type high-concentration impurity region; and the third silicon pillar has a second-conductive type high-concentration impurity region formed in a surface thereof except at least a part of a contact surface region with the first silicon pillar, and a first-conductive type impurity region formed therein and surrounded by the second-conductive type high-concentration impurity region of the third silicon pillar, and wherein the first-conductive type impurity region of each of the second silicon pillar and the third silicon pillar has a length greater than that of a depletion layer extending from a base portion of a respective one of the second silicon pillar and the third silicon pillar.

BRIEF DESCRIPTION OF THE DRAWINGS

FIG. 120 is a sectional view of the semiconductor device, taken along the cutting-plane line d-d' in FIG. 117.

FIG. 121 is a bird's-eye view showing a semiconductor device according to a twenty-first embodiment of the present invention.

FIG. 122 is a sectional view of the semiconductor device, taken along the cutting-plane line a-a' in FIG. 121.

FIG. 123 is a sectional view of the semiconductor device, taken along the cutting-plane line b-b' in FIG. 122.

FIG. 124 is a sectional view of the semiconductor device, taken along the cutting-plane line c-c' in FIG. 122.

FIG. 125 is a sectional view of the semiconductor device, taken along the cutting-plane line d-d' in FIG. 122.

FIG. 126 is a bird's-eye view showing a semiconductor device according to a twenty-second embodiment of the present invention.

FIG. 127 is a sectional view of the semiconductor device, taken along the cutting-plane line a-a' in FIG. 126.

FIG. 128 is a sectional view of the semiconductor device, taken along the cutting-plane line b-b' in FIG. 127.

FIG. 129 is a sectional view of the semiconductor device, taken along the cutting-plane line c-c' in FIG. 127.

FIG. 130 is a sectional view of the semiconductor device, taken along the cutting-plane line d-d' in FIG. 127.

FIG. 131 is a bird's-eye view showing a semiconductor device according to a twenty-third embodiment of the present invention.

Figure 131:
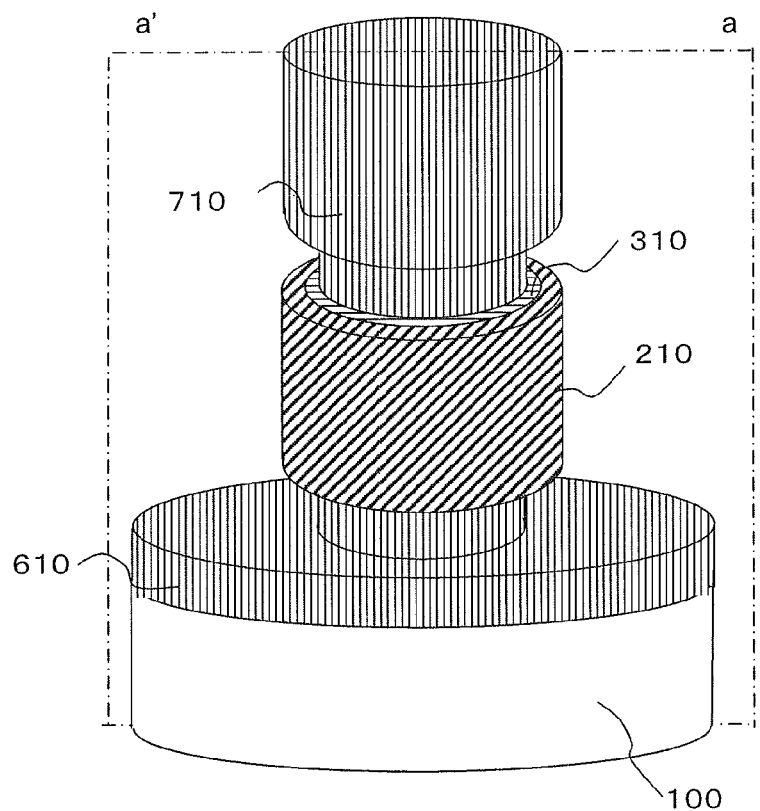
Figure 132:
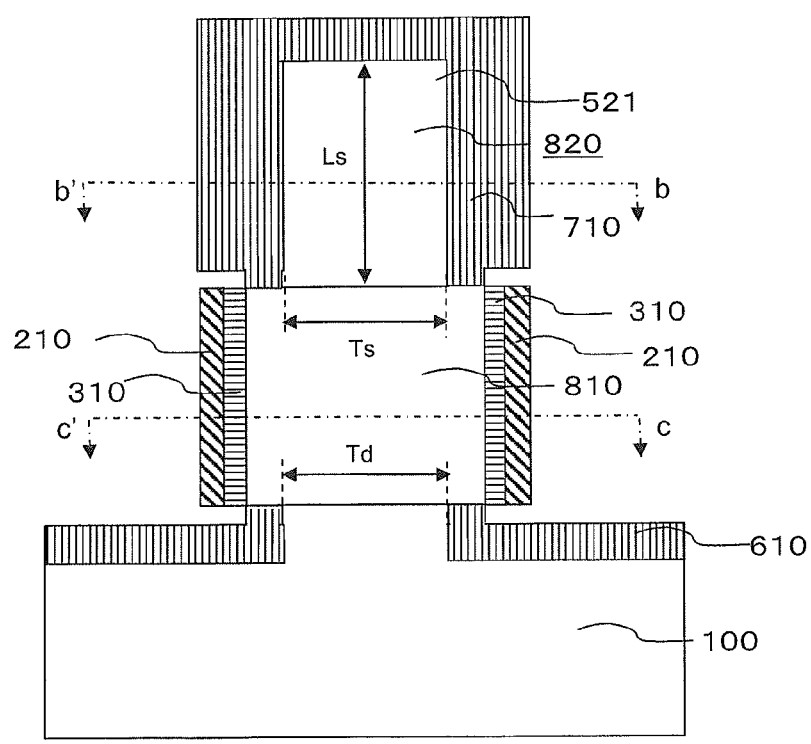

FIG. 132 is a sectional view of the semiconductor device, taken along the cutting-plane line a-a' in FIG. 131.

Figure 133:
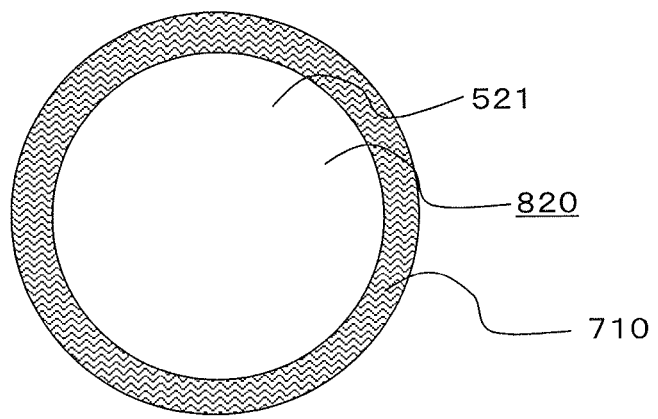

FIG. 133 is a sectional view of the semiconductor device, taken along the cutting-plane line b-b' in FIG. 132.

Figure 134:
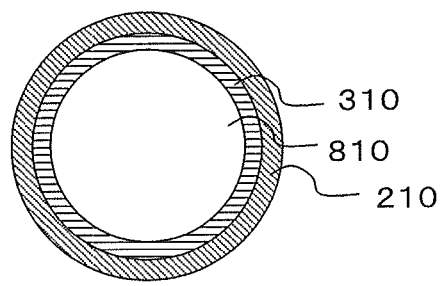

FIG. 134 is a sectional view of the semiconductor device, taken along the cutting-plane line c-c' in FIG. 132.

Figure 135:
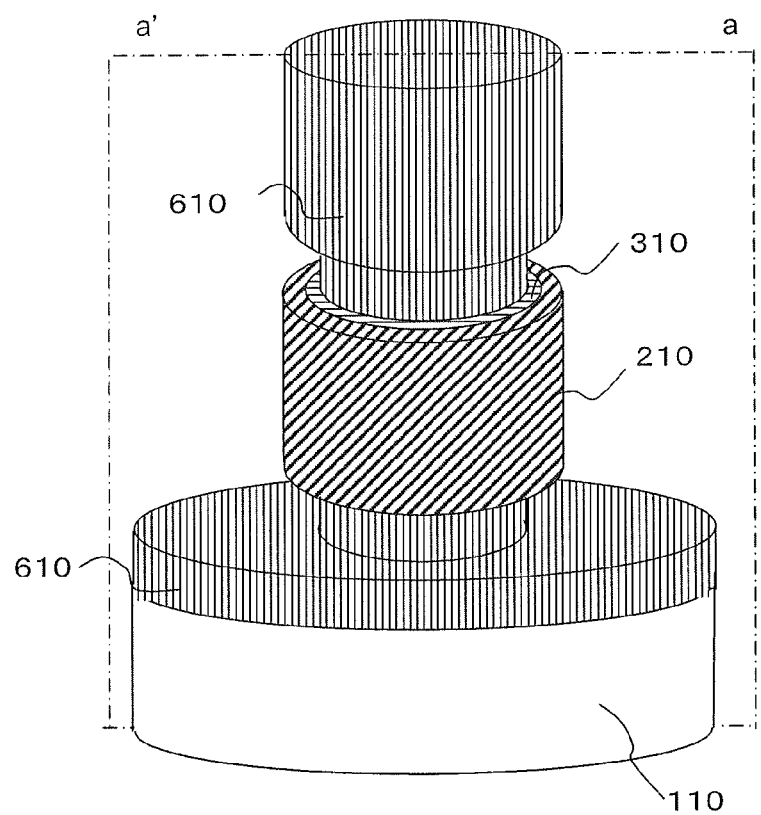

FIG. 135 is a bird's-eye view showing a semiconductor device according to a twenty-fourth embodiment of the present invention.

Figure 136:
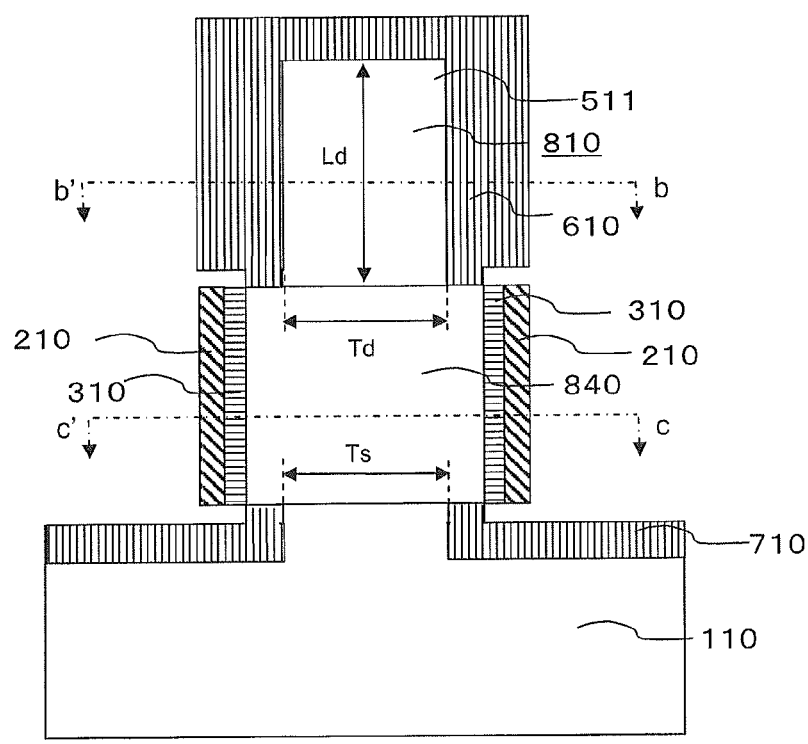

FIG. 136 is a sectional view of the semiconductor device, taken along the cutting-plane line a-a' in FIG. 135.

Figure 137:
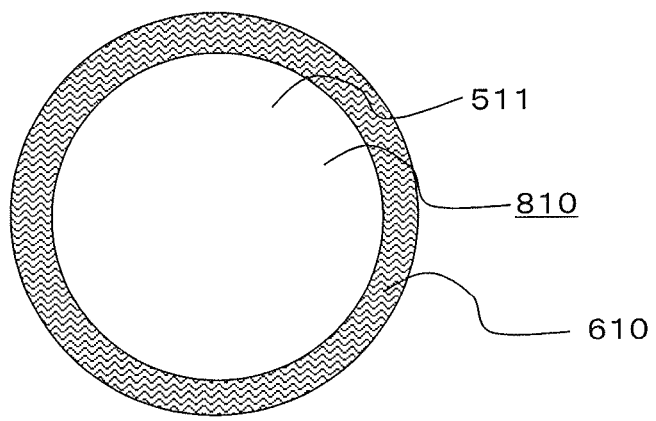

FIG. 137 is a sectional view of the semiconductor device, taken along the cutting-plane line b-b' in FIG. 136.

Figure 138:
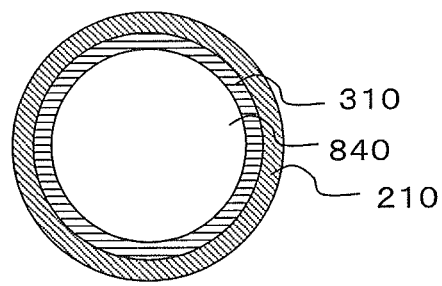

FIG. 138 is a sectional view of the semiconductor device, taken along the cutting-plane line c-c' in FIG. 136.

Figure 139:
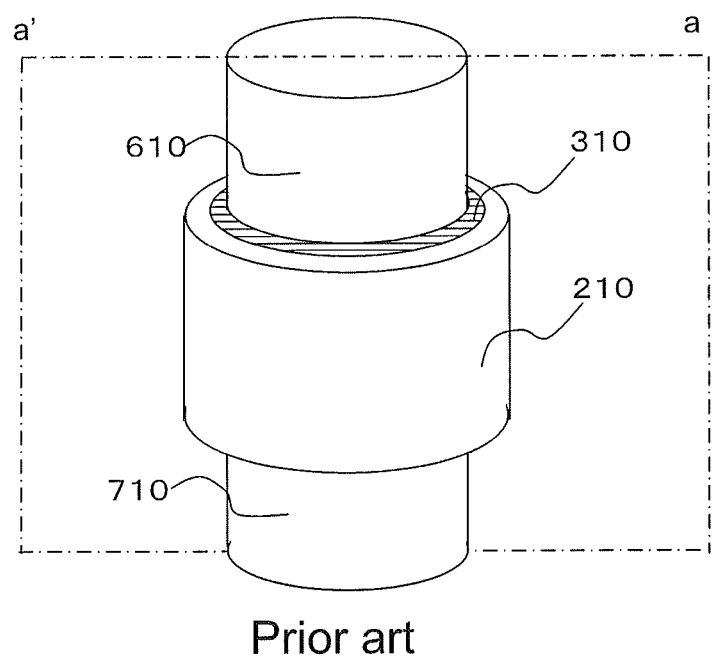

FIG. 139 is a perspective view showing a structure of one example of a conventional SGT.

Figure 140:
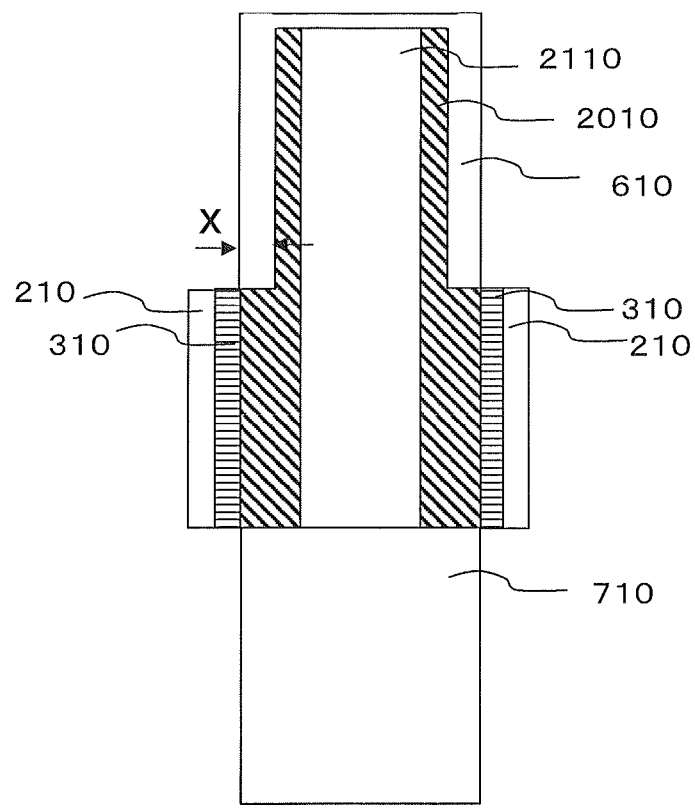

FIG. 140 is a sectional view showing the structure of the conventional SGT.

Figure 141:
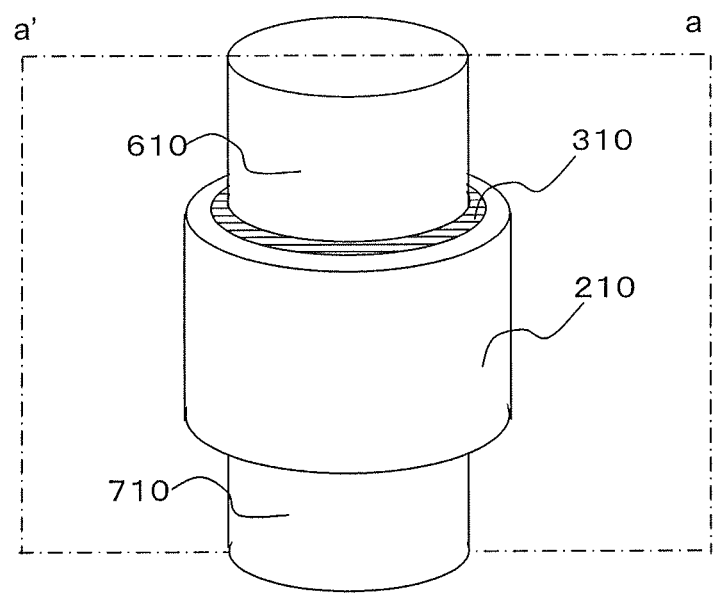

FIG. 141 is a perspective view showing a structure of another example of the conventional SGT.

Figure 142:
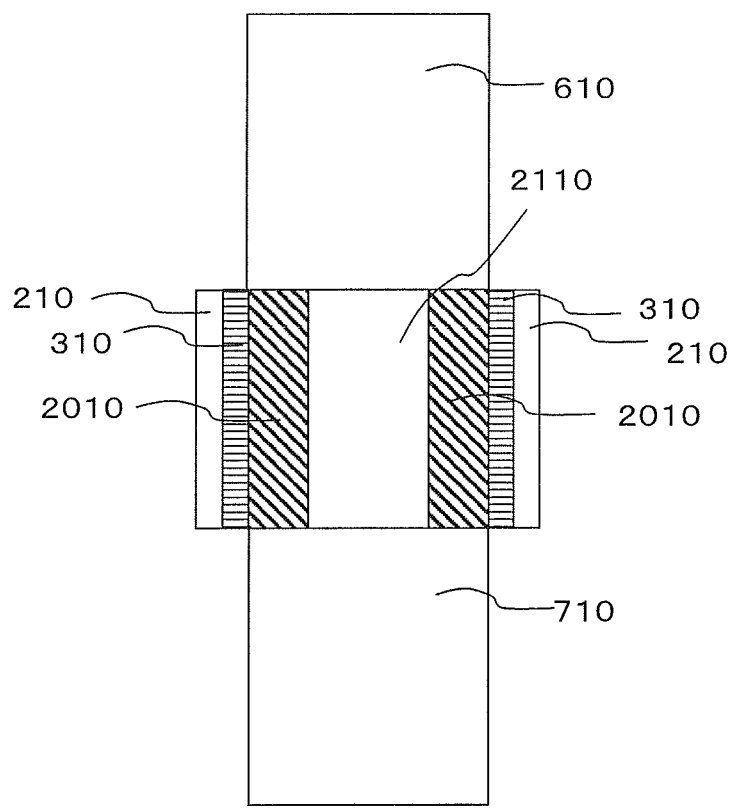

FIG. 142 is a sectional view showing the structure of the conventional SGT.

Figure 143:
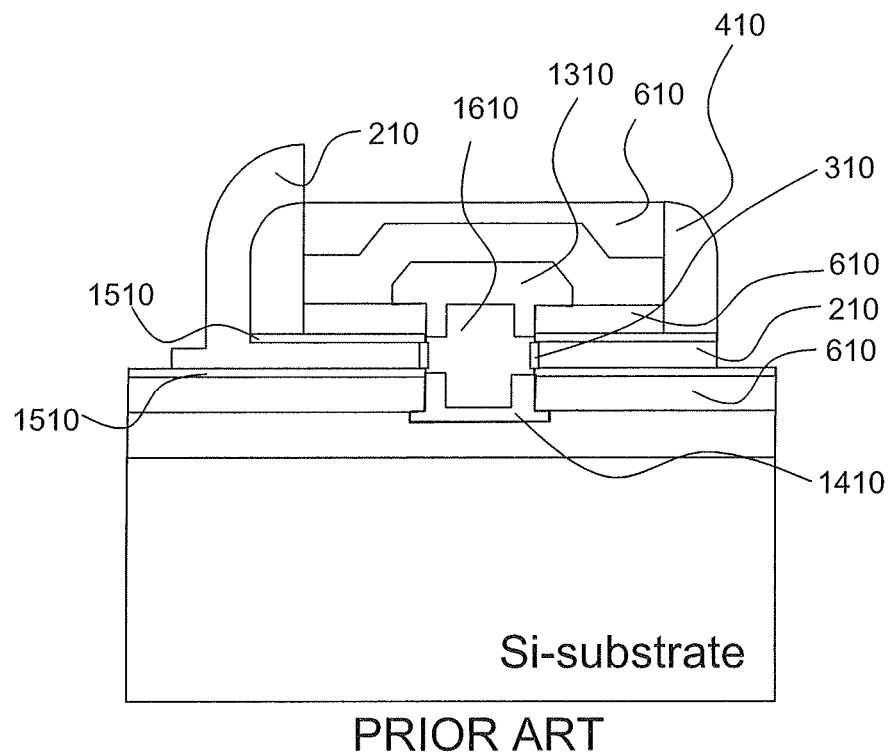

FIG. 143 is a perspective view showing a structure of yet another example of the conventional SGT.

Figure 144:
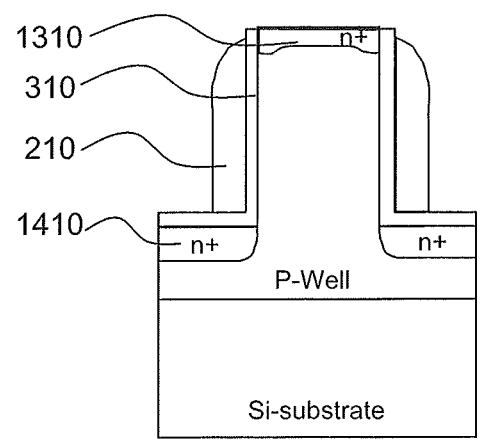

FIG. 144 is a perspective view showing a structure of still another example of the conventional SGT.

DETAILED DESCRIPTION OF THE PREFERRED EMBODIMENTS

With reference to the drawings, a semiconductor device of the present invention will now be specifically described.

(First Embodiment) Semiconductor Device

Figure 1:
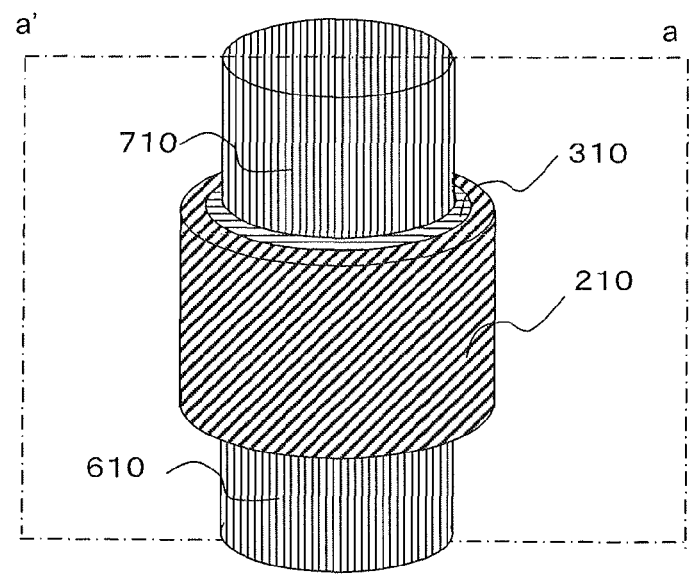
FIG. 1 is a bird's-eye view showing a semiconductor device according to a first embodiment of the present invention.
Figure 2:
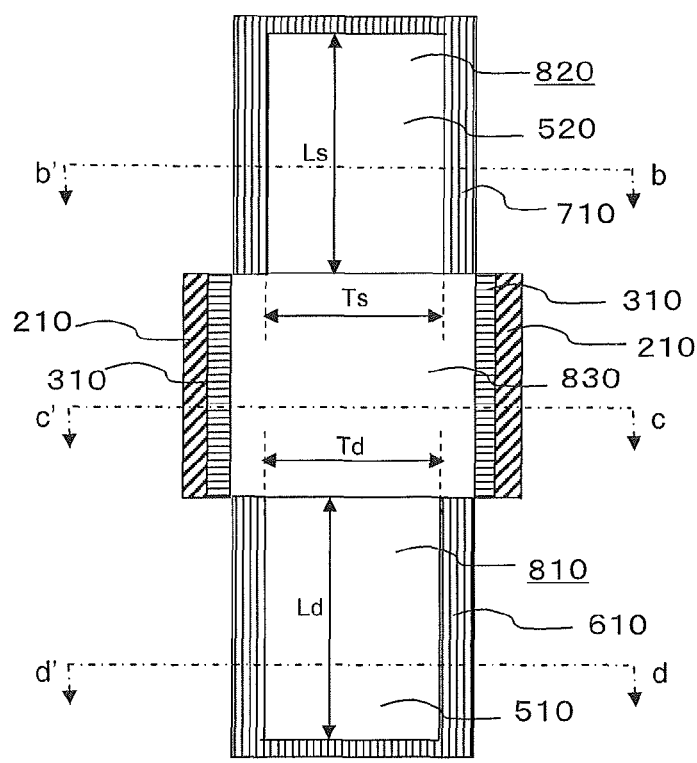
FIG. 2 is a sectional view of the semiconductor device, taken along the cutting-plane line a-a' in FIG. 1.
Figure 3:
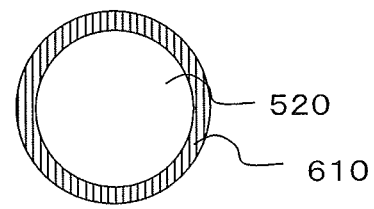
FIG. 3 is a sectional view of the semiconductor device, taken along the cutting-plane line b-b' in FIG. 2.
Figure 4:
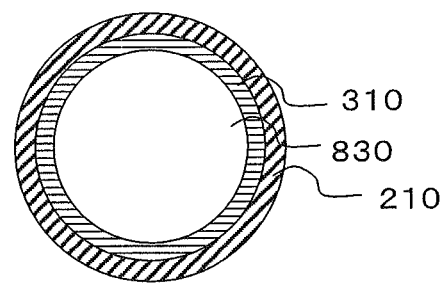
FIG. 4 is a sectional view of the semiconductor device, taken along the cutting-plane line c-c' in FIG. 2.
Figure 5:
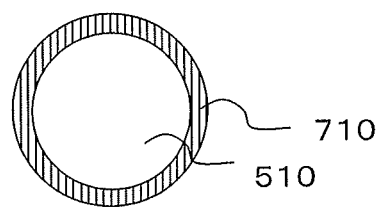
FIG. 5 is a sectional view of the semiconductor device, taken along the cutting-plane line d-d' in FIG. 2.

FIG. 1 is a bird's-eye view showing a semiconductor device according to a first embodiment of the present invention. FIG. 2 is a schematic sectional view taken along the cutting-plane line a-a' in FIG. 1. FIG. 3 is a schematic sectional view taken along the cutting-plane line b-b' in FIG. 2. FIG. 4 is a schematic sectional view taken along the cutting-plane line c-c' in FIG. 2. FIG. 5 is a schematic sectional view taken along the cutting-plane line d-d' in FIG. 2.

The semiconductor device according to the first embodiment comprises a first-conductive type third silicon pillar 830, a first dielectric 310 surrounding a side surface of the third silicon pillar 830, a gate 210 surrounding the dielectric 310, a first silicon pillar 810 provided underneath the third silicon pillar 830, and a second silicon pillar 820 provided on a top of the third silicon pillar 830, wherein: the first silicon pillar 810 has a second-conductive type high-concentration impurity region 610 (i.e., concave drain diffusion layer 610) formed in a surface thereof except at least a part of a contact surface region with the third silicon pillar 830, and a first-conductive type impurity region 510 formed therein and surrounded by the second-conductive type high-concentration impurity region 610; and the second silicon pillar 820 has a second-conductive type high-concentration impurity region 710 (i.e., concave source diffusion layer 710) formed in a surface thereof except at least a part of a contact surface region with the third silicon pillar 830, and a first-conductive type impurity region 520 formed therein and surrounded by the second-conductive type high-concentration impurity region 710.

In this configuration, as for the impurity region 510 of the first silicon pillar 810 having a circular columnar shape, an outer peripheral surface except an upper surface thereof is covered by an inner surface of the drain diffusion layer 610 having an angular-U shape in vertical section. Similarly, as for the impurity region 520 of the second silicon pillar 820 having a circular columnar shape, an outer peripheral surface except a lower surface thereof is covered by an inner surface of the source diffusion layer 710 having an inversed angular-U shape in vertical section.

In the first embodiment, in view of providing a higher punch-through voltage, it is desirable that each of the first-conductive type impurity region 510 of the first silicon pillar 810 and the first-conductive type impurity region 520 of the second silicon pillar 820 has a sufficiently-large area. In other words, it is desirable that a diameter Td and a height (height dimension) Ld of the first-conductive type impurity region 510, and a diameter Ts and a height (height dimension) Ls of the first-conductive type impurity region 520, are sufficiently large.

As a specific example, assuming a structure in which: a length of the gate 210 is 100 nm; a film thickness of the gate dielectric is 2 nm; a diameter of the first silicon pillar 810 is 100 nm; a height (height dimension) of each of the second silicon pillar 820 and the third silicon pillar 830 is 100 nm; and the diameter Td of the impurity region 510 and the diameter Ts of the impurity region 520 is fixed to 80 nm, a simulation was performed. As a simulation result on this structure, FIG. 22 shows a structure dependence of the punch-through voltage.

Figure 22:
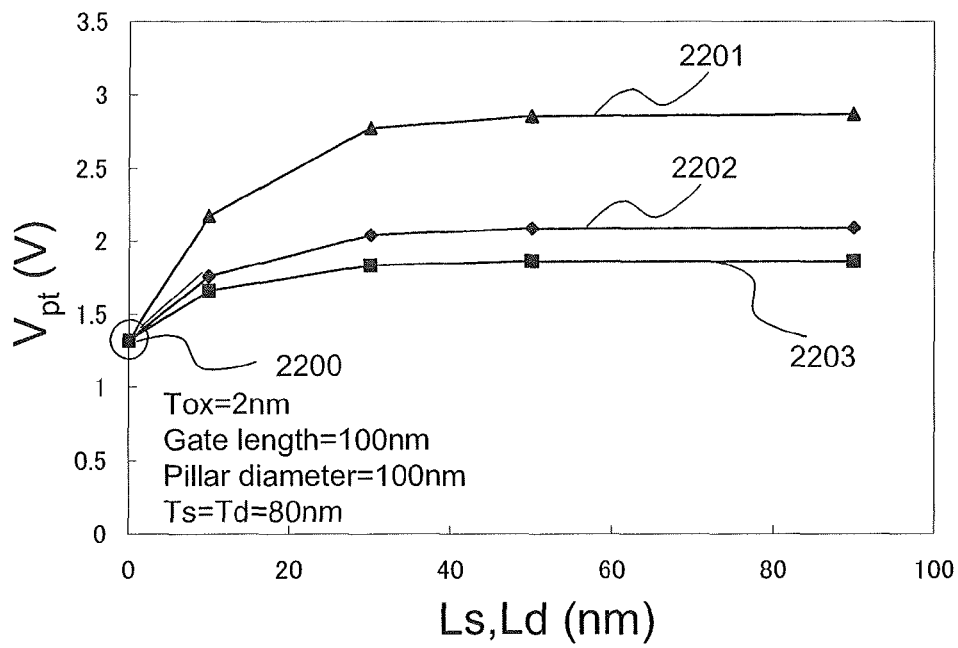
FIG. 22 is a graph showing a relationship between a punch-through voltage and a length Ls (Ld) in each of the semiconductor devices illustrated in FIGS. 1, 8 and 15.
Figure 123:
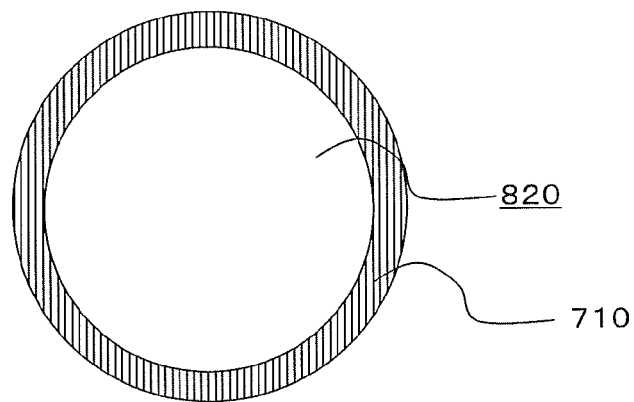
Figure 124:
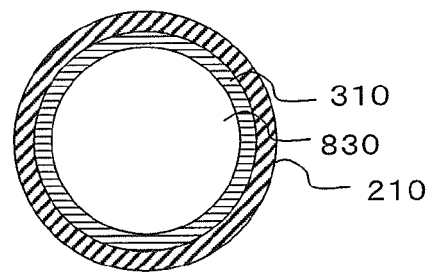
Figure 125:
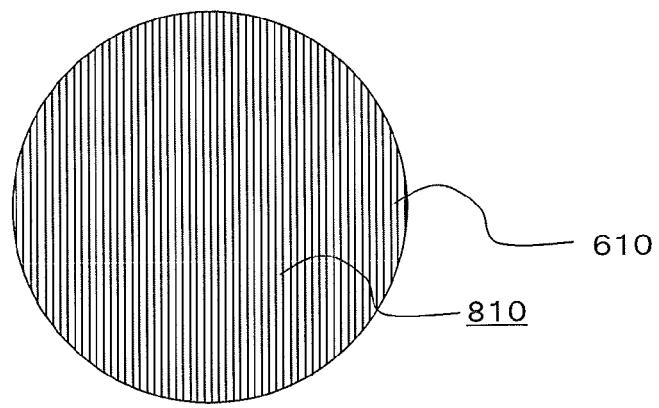

The vertical axis of FIG. 22 represents the punch-through voltage Vpt. As used herein, the term "punch-through voltage" means a voltage which is applied to a drain electrode so as to cause a drain current of 1e-7 A/um under a condition that a voltage applied to each of a gate electrode and a source electrode is zero V. The horizontal axis of FIG. 22 represents the height Ld of the impurity region 510 and the height Ls of the impurity region 520. Thus, FIG. 22 shows how the punch-through voltage is changed when each of the height Ld of the impurity region 510 and the height Ls of the impurity region 520 is changed, i.e., shows a dependence of the punch-through voltage on each of the heights Ld, Ls. In FIG. 22, a polygonal line 2201 indicates the simulation result on the semiconductor device according to the first embodiment, and each of two polygonal lines 2202, 2203 indicates a simulation result on a respective one of two semiconductor devices according to after-mentioned second and third embodiments of the present invention. Further, a point 2200 indicates a simulation result on a conventional SGT (SGT having horizontally flat source and drain diffusion layers) as shown in FIGS. 123 and 124.

The simulation result illustrated in FIG. 22 indicates that, in the semiconductor device according to the first embodiment (polygonal line 2201), a higher punch-through voltage as compared with the conventional SGT (point 2200) is provided at any value of each of the heights Ls, Ld other than zero. In other words, it is proven that the semiconductor device according to the first embodiment has an SGT structure with a smaller off-leak current than that in the conventional SGT.

Figure 23:
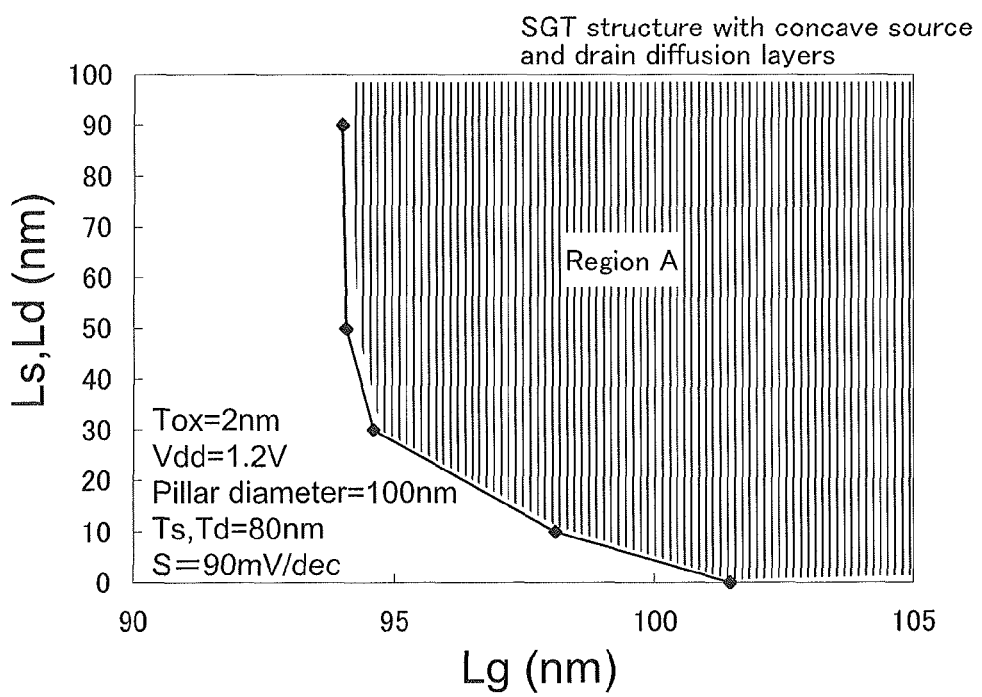
FIG. 23 is graph showing a relationship between a length Ls (Ld) and a length Lg in the semiconductor device illustrated in FIG. 1.

FIG. 23 is a graph showing a dependence of each of the heights Ld, Ls on the gate length Lg, in the semiconductor device according to the first embodiment. In FIG. 23, a region A expressed by a plurality of vertical lines corresponds to a region where a Sub threshold swing is equal to or less than 90 mV/dec. As used herein, the term "Sub threshold swing" means a gate voltage value at a sub-threshold area which changes a drain current by one decade with a drain voltage held constant.

As is clear from FIG. 23, in the conventional SGT (having a SGT structure with horizontally flat source and drain diffusion layers) where Ls=Ld=zero, it is necessary to set the gate length Lg to 102 nm or more, in order to allow the Sub threshold swing to fall within the region where it is equal to or less than 90 mV/dec. In contrast, in the semiconductor device according to the first embodiment, for example, as long as each of the heights Ls, Ld is equal to or greater than 50 nm, the gate length Lg may be set to 94 nm or more to allow the Sub threshold swing to become equal to or less than 90 mV/dec.

Figure 24:
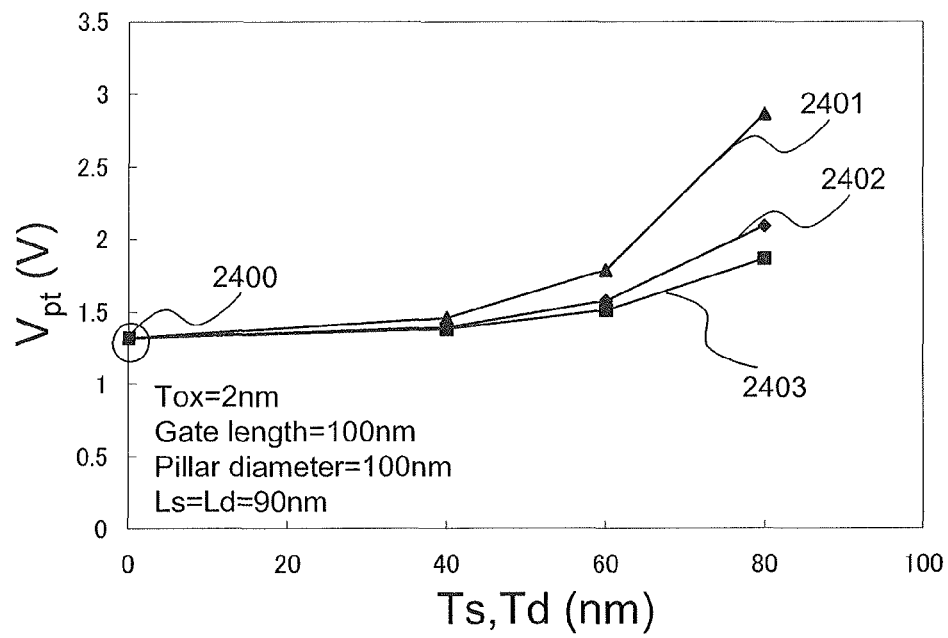
FIG. 24 is a graph showing a relationship between a punch-through voltage and a diameter Ts or Td in each of the semiconductor devices illustrated in FIGS. 1, 8 and 15.

FIG. 24 is a graph showing a dependence of the punch-through voltage on each of the diameters Ts, Td, in the semiconductor device according to the first embodiment, by comparison with the conventional SGT. In FIG. 24, the vertical axis represents the punch-through voltage, and the horizontal axis represents the diameter Td of the impurity region 510 and the diameter Ts of the impurity region 520. In FIG. 24, a polygonal line 2401 indicates the simulation result on the semiconductor device according to the first embodiment, and each of two polygonal lines 2402, 2403 indicates the simulation result on a respective one of the two semiconductor devices according to the after-mentioned second and third embodiments. Further, a point 2400 indicates the simulation result on the conventional SGT (SGT having horizontally flat source and drain diffusion layers) as shown in FIGS. 123 and 124.

As is clear from FIG. 24, in the semiconductor device according to the first embodiment, a higher punch-through voltage is provided at any value of each of the diameters Ts, Td other than zero. In other words, it is proven that the semiconductor device according to the first embodiment (polygonal line 2401) has an SGT structure with a smaller off-leak current than that in the conventional SGT (point 2400).

Figure 25:
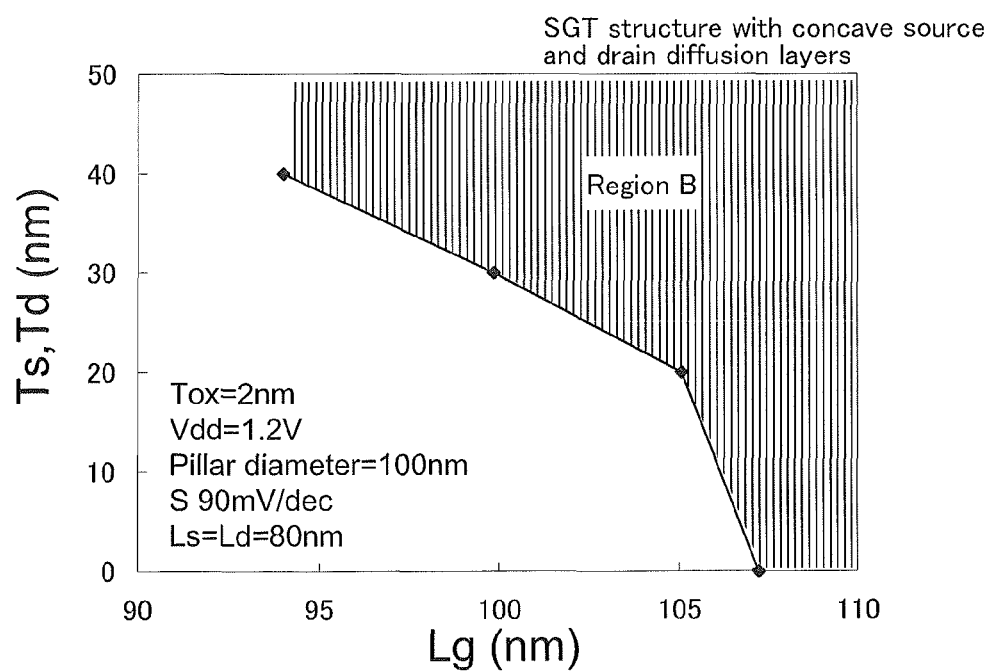
FIG. 25 is graph showing a relationship between a diameter Ts (Td) and a length Lg in the semiconductor device illustrated in FIG. 1.

FIG. 25 shows a dependence of each of the diameters Td, Ts on the gate length Lg, in the semiconductor device according to the first embodiment. In FIG. 25, a region B expressed by a plurality of vertical lines corresponds to the region where the Sub threshold swing is equal to or less than 90 mV/dec.

As is clear from FIG. 25, in the conventional SGT (having a SGT structure with horizontally flat source and drain diffusion layers) where Ts=Td=zero, it is necessary to set the gate length Lg to 107 nm or more, in order to allow the Sub threshold swing to fall within the region where it is equal to or less than 90 mV/dec. In contrast, in the semiconductor device according to the first embodiment, for example, as long as each of the heights Ls, Ld is equal to or greater than 80 nm, the gate length Lg may be set to 94 nm or more to allow the Sub threshold swing to become equal to or less than 90 mV/dec.

Figure 6:
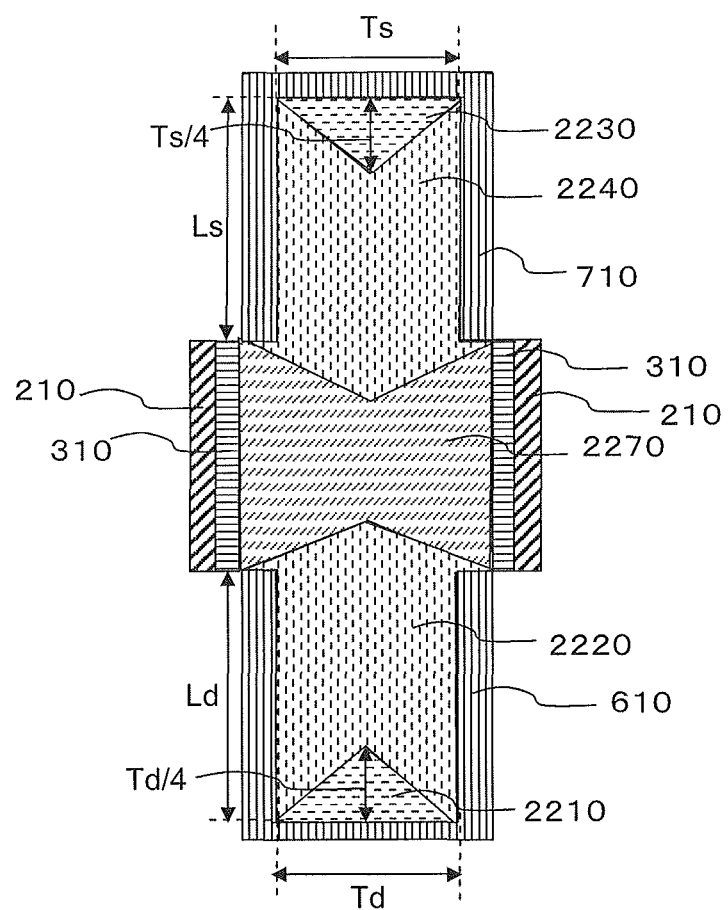
FIG. 6 is a diagram showing a depletion layer in a silicon pillar of the semiconductor device illustrated in FIG. 1, wherein the depletion layer is divided into a plurality of elements extending from respective ones of a gate, a base portion and a side portion of a concave source diffusion layer, and a base portion and a side portion of a concave drain diffusion layer.

The following discussion will be made based on a structure illustrated in FIG. 6 to show a preferred value of each of the diameter Td and the height Ld of the impurity region 510 and the diameter Ts and the height Ls of the impurity region 520. In a complete depletion-type SGT, a depletion layer in the entire silicon pillar is divided into a depletion layer 2270 extending from the gate, a depletion layer 2230 extending from a base portion of the concave source diffusion layer, a depletion layer 2240 extending from a side portion of the concave source diffusion layer, a diffusion layer 2210 extending from a base portion of the concave drain diffusion layer, and a depletion layer 2220 extending from a side portion of the concave drain diffusion layer. When an applied voltage is zero V, a depth of the depletion layer 2230 extending from the base portion of the concave source diffusion layer is Ts/4. Thus, as a prerequisite to suppressing a punch-through effect due to contact between the depletion layer 2230 extending from the base portion of the concave source diffusion layer and each of the depletion layers 2210, 2220 extending from the concave drain diffusion layer, it is essential that the height Ls is greater than the depth "Ts/4" of the depletion layer. In other words, it is essential to satisfy the following relation (1-1):

$$Ls > \frac{Ts}{4} \quad (1\text{-}1)$$

Similarly, a depth of the depletion layer 2220 extending from the base portion of the concave drain diffusion layer is Td/4. Thus, as a prerequisite to suppressing a punch-through effect due to contact between the depletion layer 2210 extending from the base portion of the concave drain diffusion layer and each of the depletion layers 2230, 2240 extending from the concave source diffusion layer, it is essential that the height Ld is greater than the depth "Td/4" of the depletion layer. In other words, it is essential to satisfy the following relation (1-2):

$$Ld > \frac{Td}{4} \quad (1\text{-}2)$$

Figure 7:
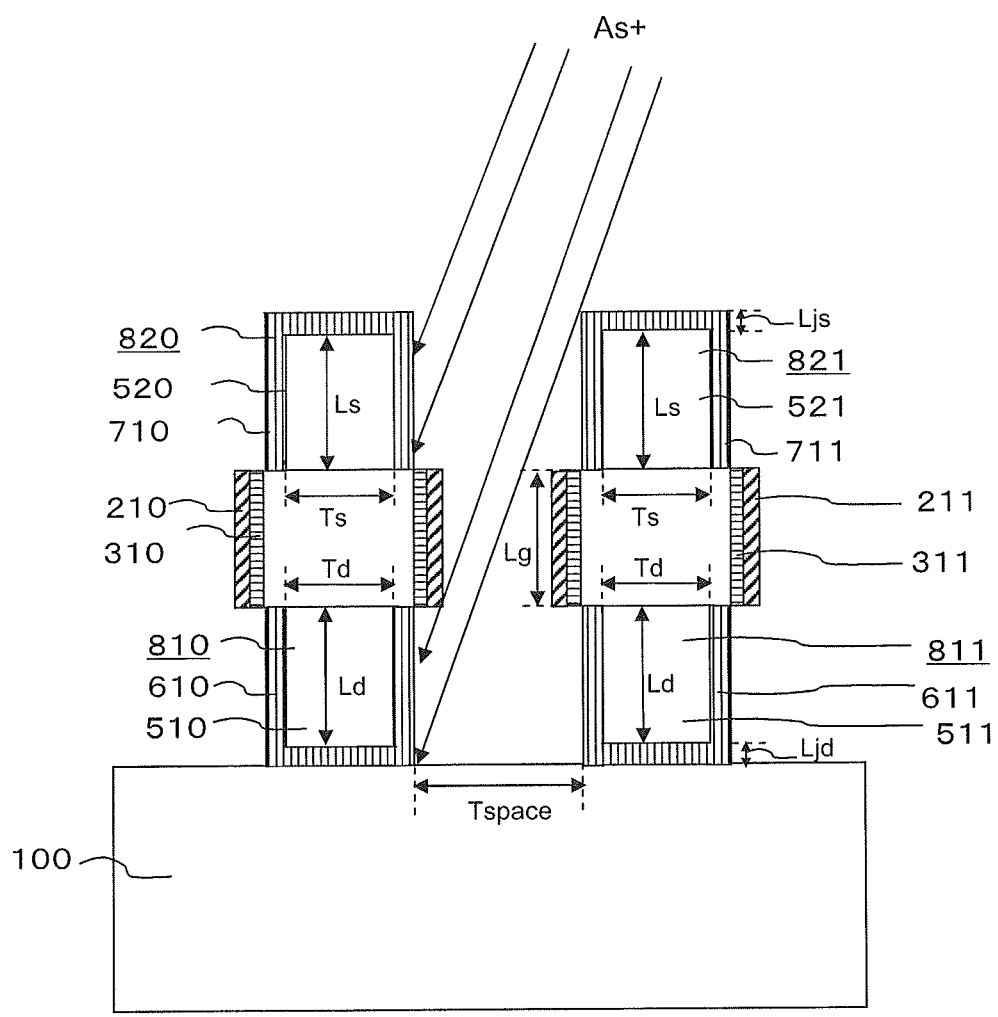
FIG. 7 is a diagram showing a process for performing ion implantation at an oblique angle to form the concave diffusion layers of the semiconductor device illustrated in FIG. 1.

Further, in a process for making the concave diffusion layer-type SGT structure illustrated in FIG. 2, it is necessary to perform ion implantation at an oblique angle as shown in FIG. 7 so as to form the concave diffusion layers. During the ion implantation, for example, when As$^+$ is implanted into an NMOSFET, a silicon pillar of an NMOSFET adjacent to the target NMOSFET is likely to disturb the ion implantation. Thus, it is essential to satisfy the following relation (1-3):

$$\tan\left(\frac{\pi}{36}\right) > \frac{Ls + Ld + Lg + Ljs + Ljd}{Tspace} \quad (1\text{-}3)$$

wherein: Ld is a height of the first-conductive type impurity region 510;
Ls is a height of the first-conductive type impurity region 520;
Lg is a length of the gate;
Ljd is a depth of the second-conductive type high-concentration impurity region 610;
Ljs is a depth of the second-conductive type high-concentration impurity region 620; and
Tspace is a distance between silicon pillars of adjacent two SGTs.

Thus, based on the relation (1-3), (Ls+Ld) is required to satisfy the following relation (1-4):

$$\tan\left(\frac{\pi}{36}\right) \cdot Tspace - (Lg + Ljs + Ljd) > Ls + Ld \quad (1\text{-}4)$$

(Second Embodiment) Semiconductor Device

Figure 8:
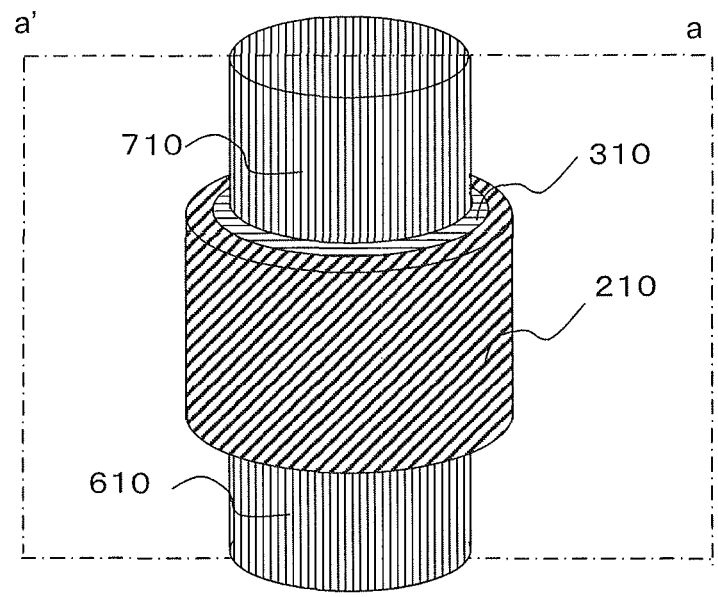
FIG. 8 is a bird's-eye view showing a semiconductor device according to a second embodiment of the present invention.
Figure 9:
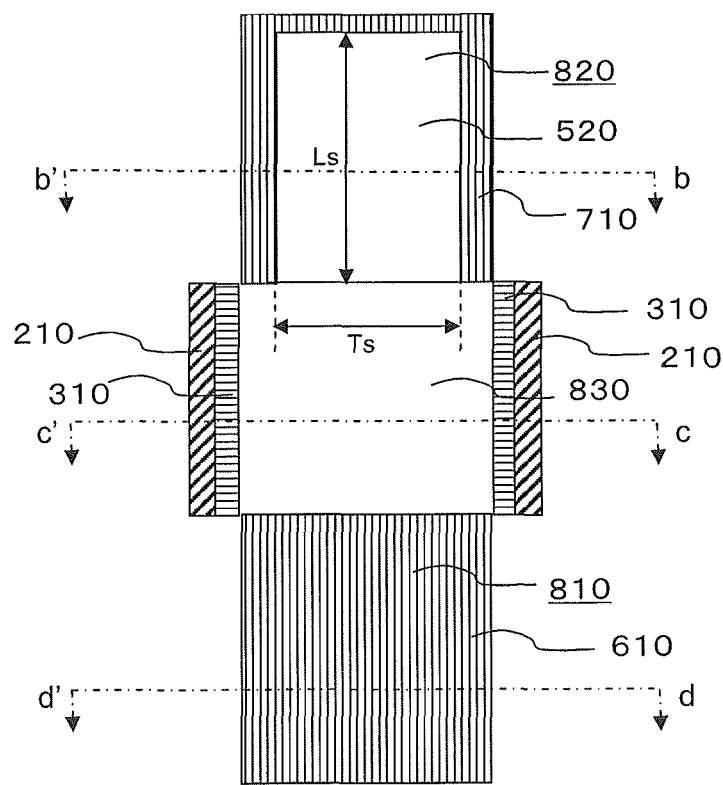
FIG. 9 is a sectional view of the semiconductor device, taken along the cutting-plane line a-a' in FIG. 8.
Figure 10:
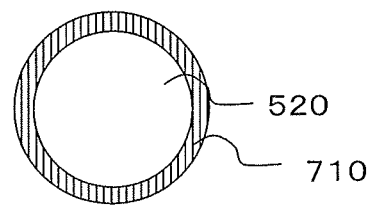
FIG. 10 is a sectional view of the semiconductor device, taken along the cutting-plane line b-b' in FIG. 9.
Figure 11:
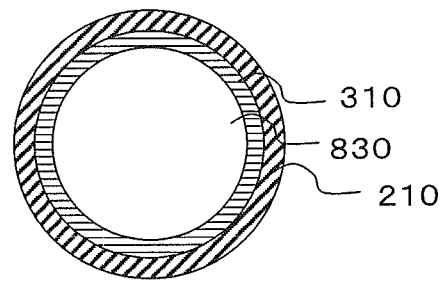
FIG. 11 is a sectional view of the semiconductor device, taken along the cutting-plane line c-c' in FIG. 9.
Figure 12:
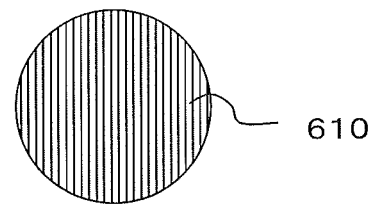
FIG. 12 is a sectional view of the semiconductor device, taken along the cutting-plane line d-d' in FIG. 9.

FIG. 8 is a schematic bird's-eye view of a transistor as a semiconductor device of the present invention, wherein the first-conductive type impurity region 510 of the first silicon pillar 810 in the first embodiment is also formed as a second-conductive type high-concentration impurity region, in addition to the second-conductive type high-concentration impurity region 610 of the first silicon pillar 810. FIG. 9 is a schematic sectional view taken along the cutting-plane line a-a' in FIG. 8, and FIG. 10 is a schematic sectional view taken along the cutting-plane line b-b' in FIG. 9. FIG. 11 is a schematic sectional view taken along the cutting-plane line c-c' in FIG. 9, and FIG. 12 is a schematic sectional view taken along the cutting-plane line d-d' in FIG. 9.

In the second embodiment, in view of providing a higher punch-through voltage, it is desirable that a first-conductive type impurity region 520 provided in a second silicon pillar 820 has a sufficiently-large area. In other words, it is desirable that a diameter Ts and a height Ls of the first-conductive type impurity region 520 are sufficiently large.

Specifically, assuming a structure in which: a length of a gate 210 is 100 nm; a film thickness of a gate dielectric is 2 nm; a diameter of a first silicon pillar is 100 nm; and a height of each of the second silicon pillar 820 and a third silicon pillar 830 is 100 nm, a simulation was performed. As a simulation result on this structure, FIG. 22 shows a structure dependence of the punch-through voltage. The vertical axis of FIG. 22 represents the punch-through voltage (Vpt) which is a voltage applied to a drain electrode so as to cause a drain current of 1e-7 A/um under a condition that a voltage applied to each of a gate electrode and a source electrode is zero V. The horizontal axis represents the height Ls which varies according to a change in shape of a concave source diffusion layer. As see in FIG. 22, in the concave source diffusion layer-type SGT structure (polygonal line 2202), a higher punch-through voltage as compared with the horizontally flat source/drain diffusion layer-type SGT structure (conventional SGT structure indicated by the point 2200) is provided at any value of the height Ls other than zero, which is proven that the SGT structure has a small off-leak current.

FIG. 24 shows a dependence of the punch-through voltage on Ts, Td which varies according to a change in shape of the concave source diffusion layer. As seen in FIG. 24, in the concave source diffusion layer-type SGT structure (polygonal line 2402), a higher punch-through voltage as compared with the horizontally flat source/drain diffusion layer-type SGT structure (conventional SGT structure indicated by the point 2400) is also provided at any value of the diameter Ts other than zero, which is proven that the SGT structure has a small off-leak current.

Figure 13:
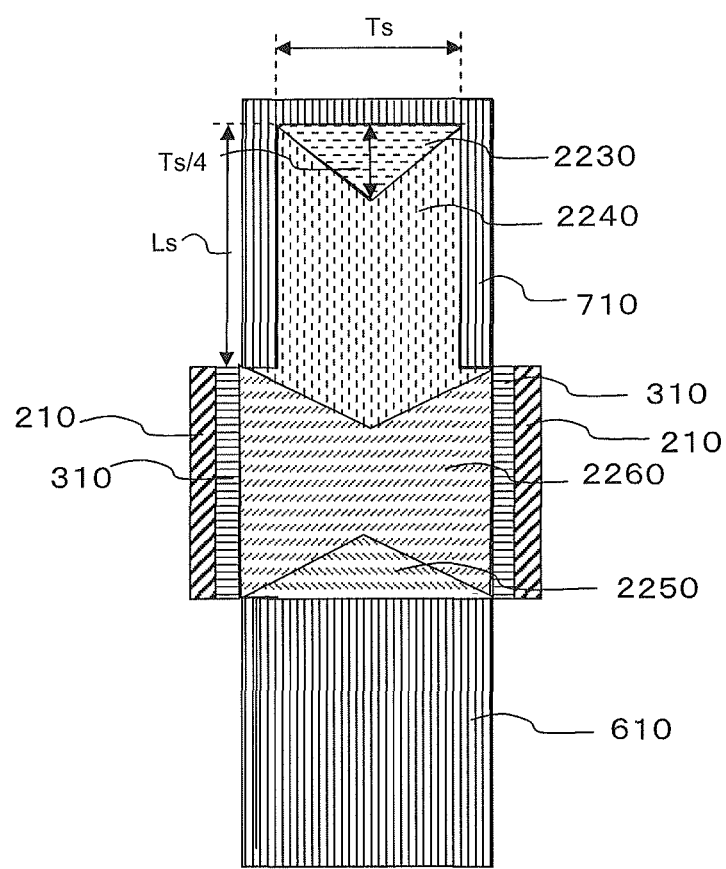
FIG. 13 is a diagram showing a depletion layer in a silicon pillar of the semiconductor device illustrated in FIG. 8, wherein the depletion layer is divided into a plurality of elements extending from respective ones of a gate, a base portion and a side portion of a concave source diffusion layer, and a drain diffusion layer.

Based on a structure illustrated in FIG. 13, the following discussion will be made about the height Ls. In a complete depletion-type SGT, a depletion layer in the entire silicon pillar is divided into four depletion layers extending from respective ones of the gate, a base portion and a side portion of the concave source diffusion layer, and a drain diffusion layer. When an applied voltage is zero V, a depth of the depletion layer 2230 extending from the base portion of the concave source diffusion layer is Ts/4. Thus, as a prerequisite to suppressing a punch-through effect due to contact between the depletion layer 2230 extending from the base portion of the concave source diffusion layer and the depletion layer 2250 extending from the drain diffusion layer, it is essential that the height Ls is greater than the depth "Ts/4" of the depletion layer. In other words, it is essential to satisfy the following relation (2-1):

$$Ls > \frac{Ts}{4} \quad (2\text{-}1)$$

Figure 14:
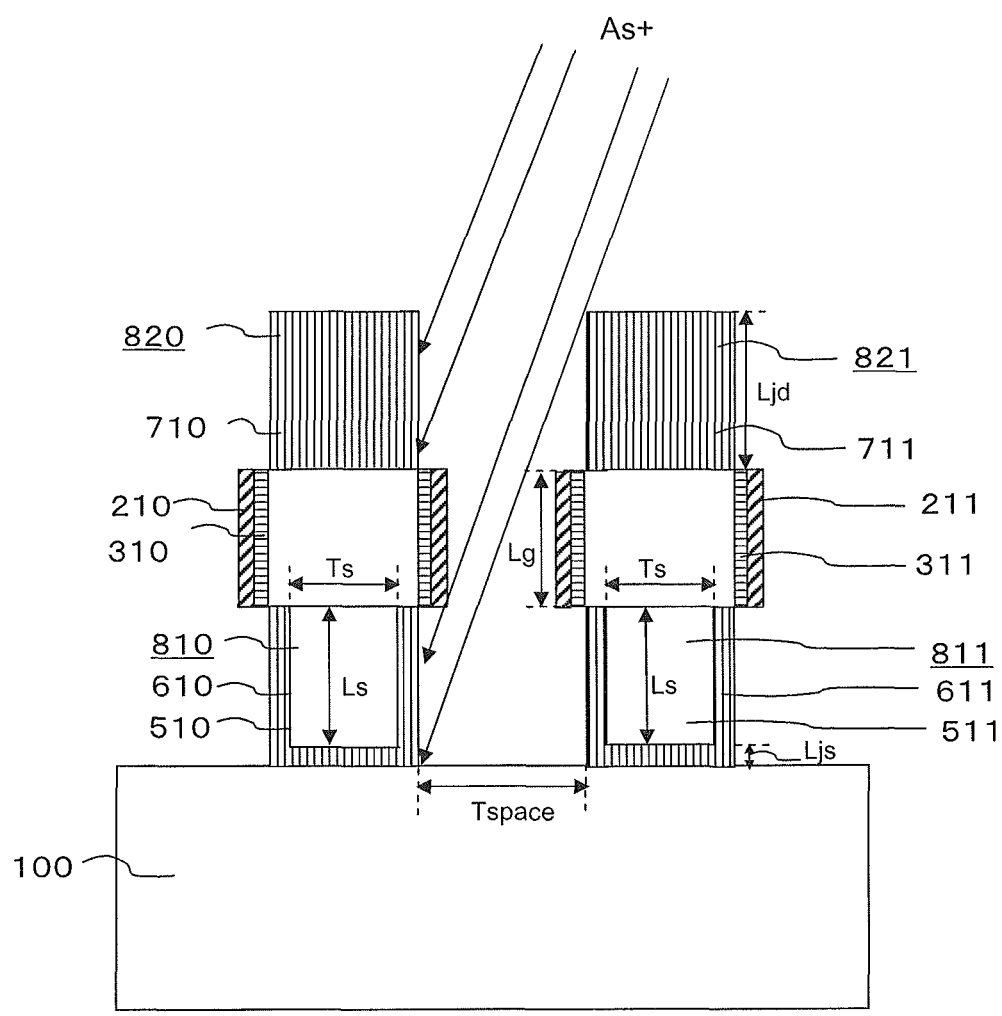
FIG. 14 is a diagram showing a process for performing ion implantation at an oblique angle to form the concave diffusion layer of the semiconductor device illustrated in FIG. 8.

Further, in a process for making the concave diffusion layer-type SGT structure illustrated in FIG. 9, it is necessary to perform ion implantation at an oblique angle as shown in FIG. 14 so as to form the concave diffusion layer. During the ion implantation, for example, when As$^+$ is implanted into an NMOSFET, a silicon pillar of an NMOSFET adjacent to the target NMOSFET is likely to disturb the ion implantation. Thus, it is essential to satisfy the following relation (2-2):

$$\tan\left(\frac{\pi}{36}\right) > \frac{Ls + Lg + Ljs + Ljd}{Tspace}, \quad (2\text{-}2)$$

wherein: Ls is a height of the first-conductive type impurity region 510;
Lg is a length of the gate;
Ljd is a depth of the second-conductive type high-concentration impurity region 610;

Ljs is a depth of the second-conductive type high-concentration impurity region 620; and Tspace is a distance between silicon pillars of adjacent two SGTs;

Thus, based on the relation (2-2), Ls is required to satisfy the following relation (2-3):

$$\tan\left(\frac{\pi}{36}\right) \cdot Tspace - (Lg + Ljs + Ljd) > Ls \tag{2-3}$$

(Third Embodiment) Semiconductor Device

Figure 15:
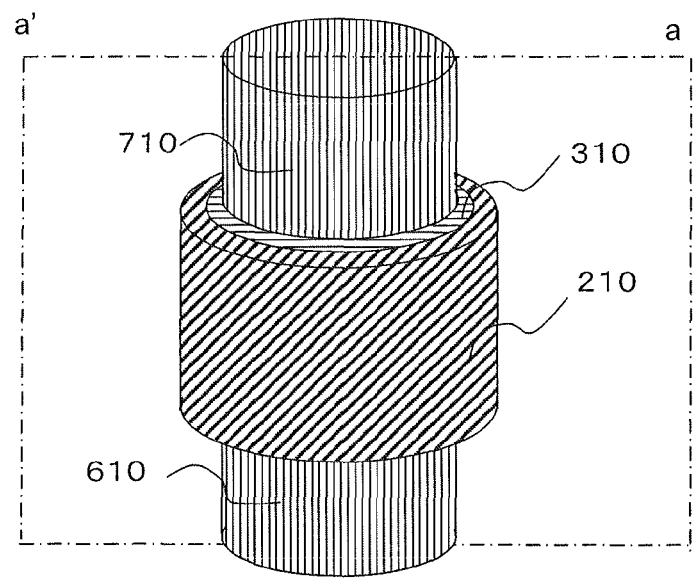
FIG. 15 is a bird's-eye view showing a semiconductor device according to a third embodiment of the present invention.
Figure 16:
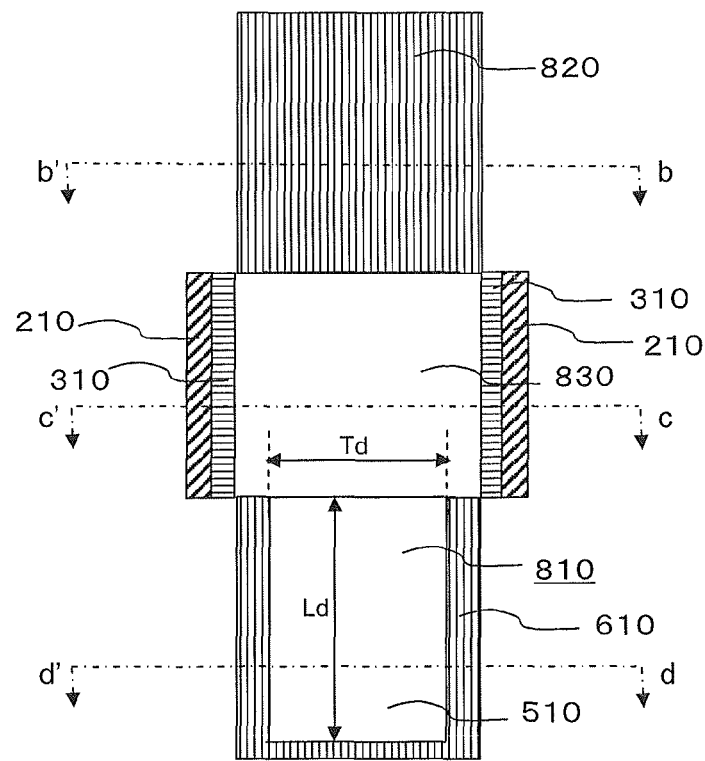
FIG. 16 is a sectional view of the semiconductor device, taken along the cutting-plane line a-a' in FIG. 15.
Figure 17:
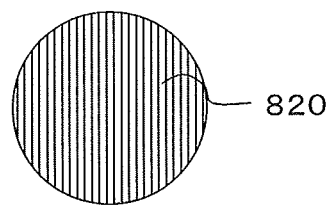
FIG. 17 is a sectional view of the semiconductor device, taken along the cutting-plane line b-b' in FIG. 16.
Figure 18:
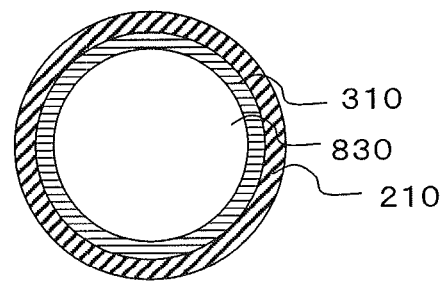
FIG. 18 is a sectional view of the semiconductor device, taken along the cutting-plane line c-c' in FIG. 16.
Figure 19:
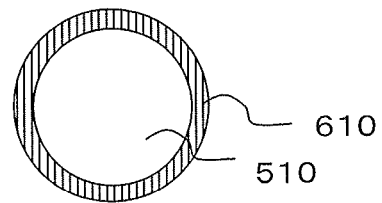
FIG. 19 is a sectional view of the semiconductor device, taken along the cutting-plane line d-d' in FIG. 16.

FIG. 15 is a schematic bird's-eye view of a transistor as a semiconductor device of the present invention, wherein the first-conductive type impurity region 520 of the second silicon pillar 820 in the first embodiment is also formed as a second-conductive type high-concentration impurity region, in addition to the second-conductive type high-concentration impurity region 710 of the second silicon pillar 820. FIG. 16 is a schematic sectional view taken along the cutting-plane line a-a' in FIG. 15, and FIG. 17 is a schematic sectional view taken along the cutting-plane line b-b' in FIG. 16. FIG. 18 is a schematic sectional view taken along the cutting-plane line c-c' in FIG. 16, and FIG. 19 is a schematic sectional view taken along the cutting-plane line d-d' in FIG. 16.

In the third embodiment, in view of providing a higher punch-through voltage, it is desirable that a first-conductive type impurity region 510 provided in a first silicon pillar 810 has a sufficiently-large area. In other words, it is desirable that a diameter Td and a height Ld of the first-conductive type impurity region 510 are sufficiently large.

Specifically, assuming a structure in which: a length of a gate 210 is 100 nm; a film thickness of a gate dielectric 310 is 2 nm; a diameter of the first silicon pillar 810 is 100 nm; and a height of each of a second silicon pillar 820 and a third silicon pillar 830 is 100 nm, a simulation was performed. As a simulation result on this structure, FIG. 22 shows a structure dependence of the punch-through voltage. The vertical axis of FIG. 22 represents the punch-through voltage which is a voltage applied to a drain electrode so as to cause a drain current of 1e-7 A/um under a condition that a voltage applied to each of a gate electrode and a source electrode is zero V. The horizontal axis represents the height Ld which varies according to a change in shape of a concave drain diffusion layer. As seen in FIG. 22, in the concave drain diffusion layer-type SGT structure, a higher punch-through voltage as compared with the horizontally flat source/drain diffusion layer-type SGT structure (conventional SGT structure indicated by the point 2200) is provided at any value of the height Ld other than zero, which is proven that the SGT structure has a small off-leak current.

FIG. 24 shows a dependence of the punch-through voltage on the diameter Td which varies according to a change in shape of the concave drain diffusion layer. As seen in FIG. 24, in the concave drain diffusion layer-type SGT structure, a higher punch-through voltage as compared with the horizontally flat source/drain diffusion layer-type SGT structure (conventional SGT structure indicated by the point 2400) is also provided at any value of the diameter Td other than zero, which is proven that the SGT structure has a small off-leak current.

Figure 20:
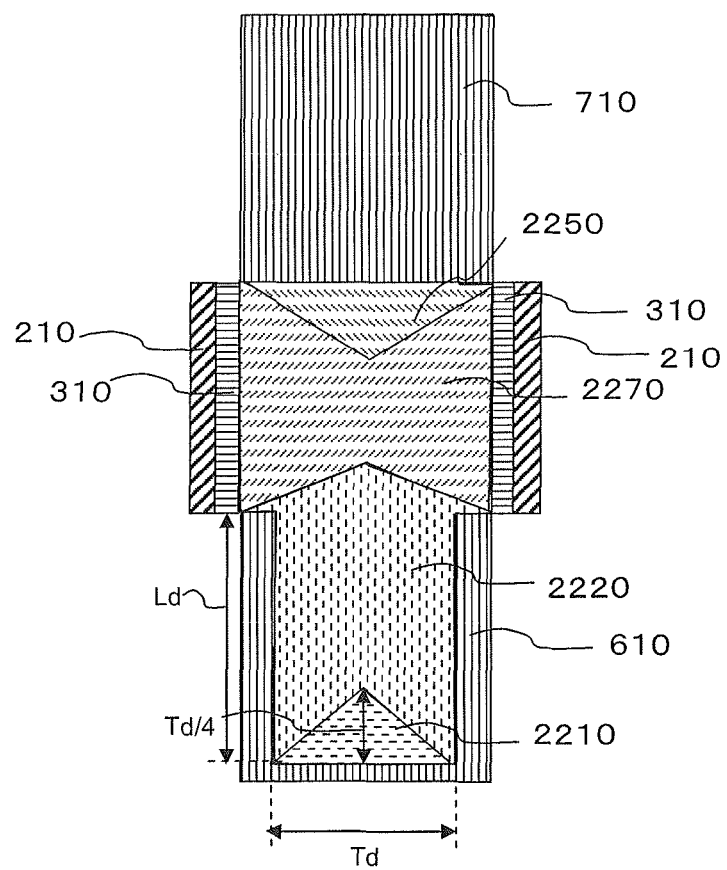
FIG. 20 is a diagram showing a depletion layer in a silicon pillar of the semiconductor device illustrated in FIG. 15, wherein the depletion layer is divided into a plurality of elements extending from respective ones of a gate, a base portion and a side portion of a concave source diffusion layer, and a drain diffusion layer.

Based on a structure illustrated in FIG. 20, the following discussion will be made about the height Ls. In a complete depletion-type SGT, a depletion layer in the entire silicon pillar is divided into four depletion layers extending from respective ones of the gate, a source diffusion layer, and a base portion and a side portion of the concave drain diffusion layer. When an applied voltage is zero V, a depth of the depletion layer 2210 extending from the base portion of the concave drain diffusion layer is Td/4. Thus, as a prerequisite to suppressing a punch-through effect due to contact between the depletion layer 2210 extending from the base portion of the concave drain diffusion layer and the depletion layer 2250 extending from the source diffusion layer, it is essential that the height Ld is greater than the depth "Td/4" of the depletion layer. In other words, it is essential to satisfy the following relation (3-1):

$$Ld > \frac{Td}{4} \tag{3-1}$$

Figure 21:
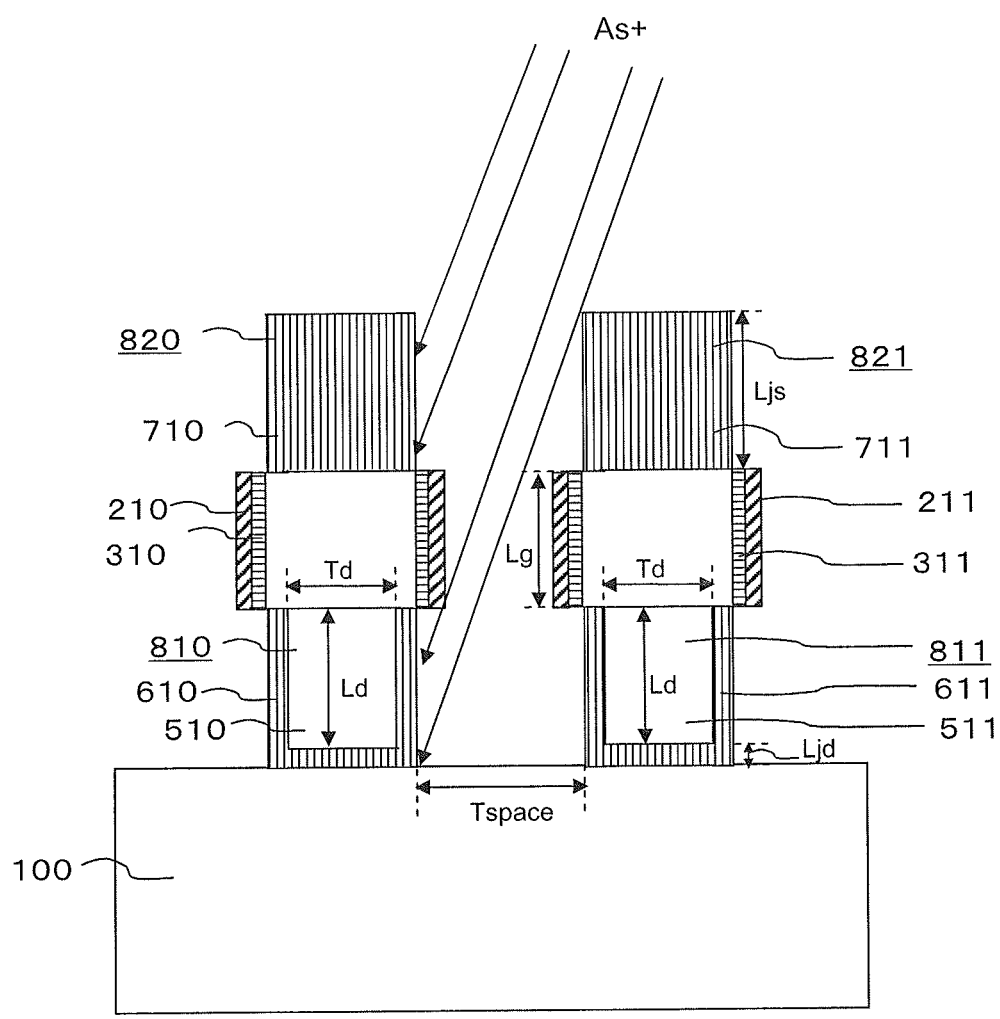
FIG. 21 is a diagram showing a process for performing ion implantation at an oblique angle to form the concave diffusion layer of the semiconductor device illustrated in FIG. 15.

Further, in a process for making the concave diffusion layer-type SGT structure illustrated in FIG. 16, it is necessary to perform ion implantation at an oblique angle as shown in FIG. 21 so as to form the concave diffusion layer. During the ion implantation, for example, when $As^+$ is implanted into an NMOSFET, a silicon pillar of an NMOSFET adjacent to the target NMOSFET is likely to disturb the ion implantation. Thus, it is essential to satisfy the following relation (3-2):

$$\tan\left(\frac{\pi}{36}\right) > \frac{Ld + Lg + Ljs + Ljd}{Tspace}, \tag{3-2}$$

wherein: Ld is a height of the first-conductive type impurity region 610;

Lg is a length of the gate;

Ljd is a depth of the second-conductive type high-concentration impurity region 610; and Ljs is a depth of the second-conductive type high-concentration impurity region 620; and Tspace is a distance between silicon pillars of adjacent two SGTs.

Thus, based on the relation (3-2), Ld is required to satisfy the following relation (3-3):

$$\tan\left(\frac{\pi}{36}\right) \cdot Tspace - (Lg + Ljs + Ljd) > Ld \tag{3-3}$$

(Fourth Embodiment) Semiconductor Device

Figure 26:
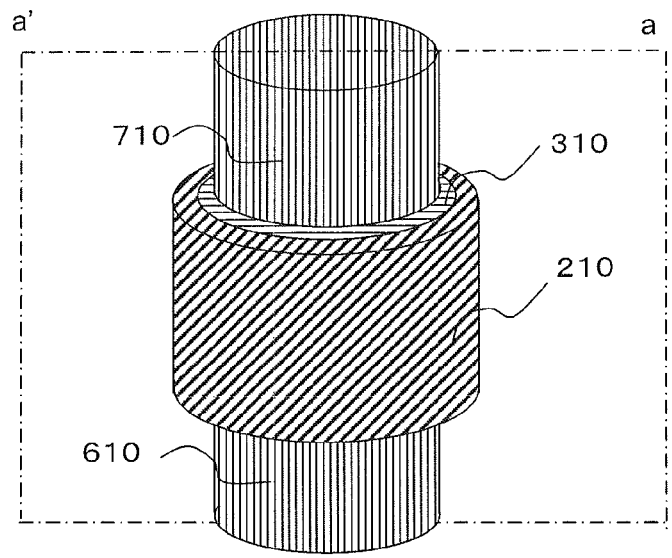
FIG. 26 is a bird's-eye view showing a semiconductor device according to a fourth embodiment of the present invention.
Figure 27:
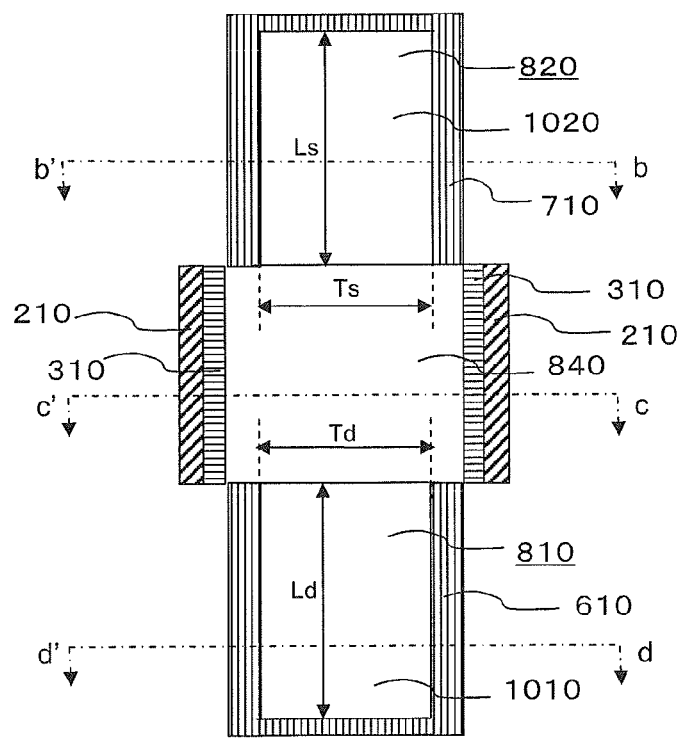
FIG. 27 is a sectional view of the semiconductor device, taken along the cutting-plane line a-a' in FIG. 26.
Figure 28:
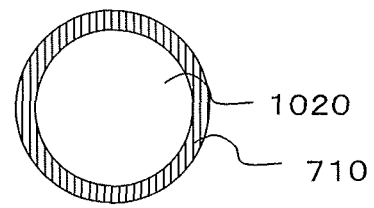
FIG. 28 is a sectional view of the semiconductor device, taken along the cutting-plane line b-b' in FIG. 27.
Figure 29:
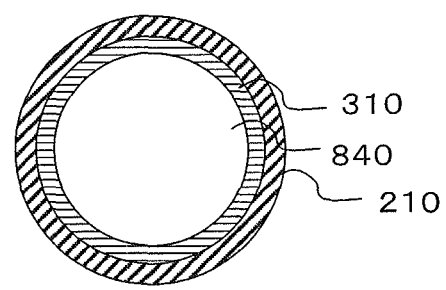
FIG. 29 is a sectional view of the semiconductor device, taken along the cutting-plane line c-c' in FIG. 27.
Figure 30:
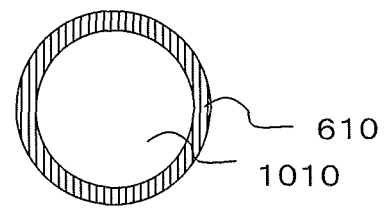
FIG. 30 is a sectional view of the semiconductor device, taken along the cutting-plane line d-d' in FIG. 27.

FIG. 26 is a schematic bird's-eye view of a transistor as a semiconductor device of the present invention, wherein the third silicon pillar 830 in the first embodiment is formed as a high resistance region, instead of a first-conductive type impurity region, and each of the first-conductive type impurity region of the first silicon pillar 810 and the first-conductive type impurity region of the second silicon pillar 820 in the first embodiment is formed as a high resistance region. FIG. 27 is a schematic sectional view taken along the cutting-plane line a-a' in FIG. 26, and FIG. 28 is a schematic sectional view taken along the cutting-plane line b-b' in FIG. 27. FIG. 29 is a schematic sectional view taken along the cutting-plane line c-c' in FIG. 27, and FIG. 30 is a schematic sectional view taken along the cutting-plane line d-d' in FIG. 27. In the semiconductor device according to the fourth embodiment, in view of providing a higher punch-through voltage, it is desirable that each of a high resistance region 1010 provided in a first silicon pillar 810, and a high resistance region 1020 provided in a second silicon pillar 820, has a sufficiently-large area. In other words, it is desirable that a diameter Td and a height Ld of the high resistance region 1010, and a diameter Ts and a height Ls of the high resistance region 1020, are sufficiently large.

Figure 41:
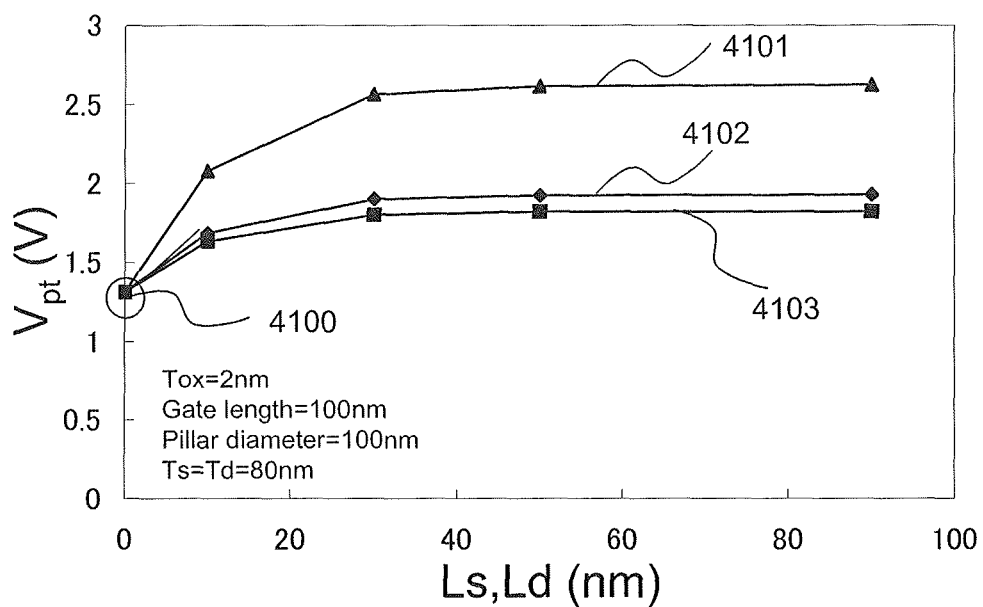
FIG. 41 is a graph showing a relationship between a punch-through voltage and a length Ls (Ld) in each of the semiconductor devices illustrated in FIGS. 26, 31 and 36.

Specifically, assuming a structure in which: a length of a gate 210 is 100 nm; a film thickness of a gate dielectric is 2 nm; a diameter of the first silicon pillar 810 is 100 nm; and a height of each of the second silicon pillar 820 and a third silicon pillar 840 is 100 nm, a simulation was performed. As a simulation result on this structure, FIG. 41 shows a structure dependence of the punch-through voltage. The vertical axis of FIG. 41 represents the punch-through voltage Vpt which is a voltage applied to a drain electrode so as to cause a drain current of 1e-7 A/um under a condition that a voltage applied to each of a gate electrode and a source electrode is zero V. The horizontal axis represents the heights Ls, Ld which vary according to a change in shape of respective ones of a concave source diffusion layer and a concave drain diffusion layer. As seen in FIG. 41, in the concave source/drain diffusion layer-type SGT structure (polygonal line 4101), a higher punch-through voltage as compared with the horizontally flat source/drain diffusion layer-type SGT structure (conventional SGT structure indicated by the point 4100) is provided at any value of each of the heights Ls, Ld other than zero, which is proven that the SGT structure has a small off-leak current. FIG. 17 shows a dependence of each of the heights Ls, Ld on the gate length Lg.

Figure 42:
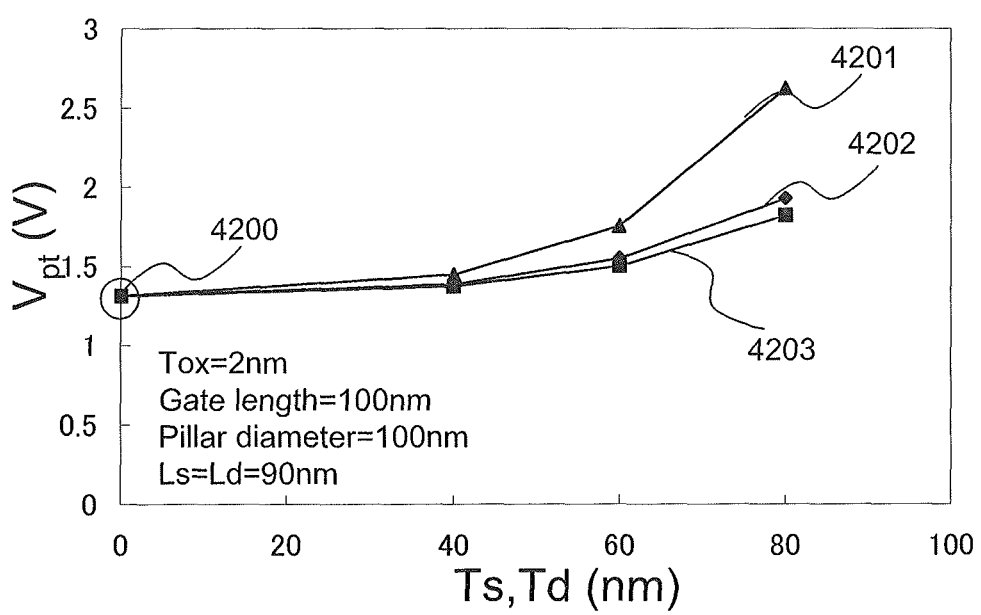
FIG. 42 is a graph showing a relationship between a punch-through voltage and a diameter Ts (Td) in each of the semiconductor devices illustrated in FIGS. 26, 31 and 36.

FIG. 42 shows a dependence of the punch-through voltage (vertical axis) on each of the diameters Ts, Td (horizontal axis) which vary according to a change in shape of respective ones of the concave source diffusion layer and the concave drain diffusion layer. As seen in FIG. 42, in the concave source/drain diffusion layer-type SGT structure (polygonal line 4201), a higher punch-through voltage as compared with the horizontally flat source/drain diffusion layer-type SGT structure (conventional SGT structure indicated by the point 4200) is also provided at any value of each of the diameters Ts, Td other than zero, which is proven that the SGT structure has a small off-leak current.

In the fourth embodiment, as with the first embodiment, it is desirable to satisfy the following relations (4-1) and (4-2) to provide a higher punch-through voltage:

$$Ls > \frac{Ts}{4} \quad (4\text{-}1)$$

$$Ld > \frac{Td}{4} \quad (4\text{-}2)$$

Further, in the fourth embodiment, it is necessary to satisfy the following relation (4-3), as with the first embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ls + Ld \quad (4\text{-}3)$$

(Fifth Embodiment) Semiconductor Device

Figure 31:
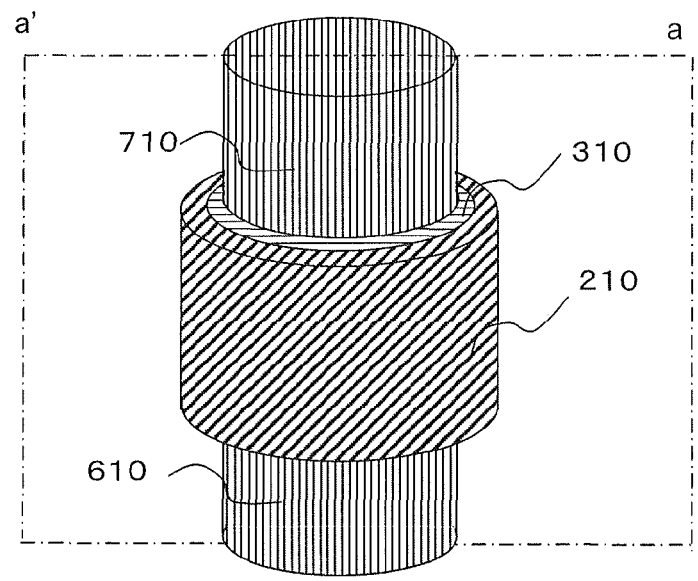
FIG. 31 is a bird's-eye view showing a semiconductor device according to a fifth embodiment of the present invention.
Figure 32:
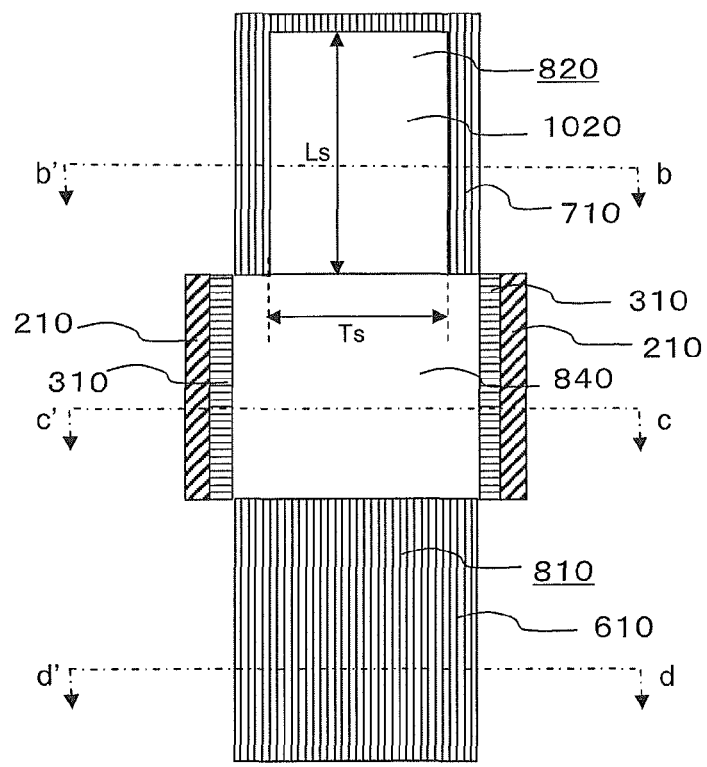
FIG. 32 is a sectional view of the semiconductor device, taken along the cutting-plane line a-a' in FIG. 31.
Figure 33:
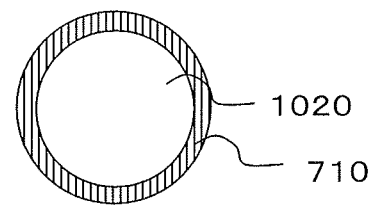
FIG. 33 is a sectional view of the semiconductor device, taken along the cutting-plane line b-b' in FIG. 32.
Figure 34:
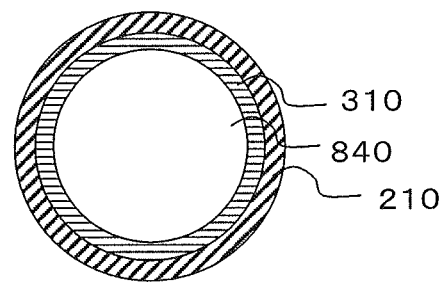
FIG. 34 is a sectional view of the semiconductor device, taken along the cutting-plane line c-c' in FIG. 32.
Figure 35:
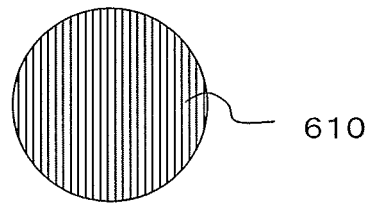
FIG. 35 is a sectional view of the semiconductor device, taken along the cutting-plane line d-d' in FIG. 32.

FIG. 31 is a schematic bird's-eye view of a transistor as a semiconductor device of the present invention, wherein the silicon pillar 830 in the second embodiment is formed as a high resistance region, instead of a first-conductive type impurity region, and the first-conductive type impurity region of the silicon pillar 820 in the second embodiment is formed as a high resistance region. FIG. 32 is a schematic sectional view taken along the cutting-plane line a-a' in FIG. 31, and FIG. 33 is a schematic sectional view taken along the cutting-plane line b-b' in FIG. 32. FIG. 34 is a schematic sectional view taken along the cutting-plane line c-c' in FIG. 32, and FIG. 35 is a schematic sectional view taken along the cutting-plane line d-d' in FIG. 32. In the fifth embodiment, in view of providing a higher punch-through voltage, it is desirable that a high resistance region 520 provided in a second silicon pillar 820 has a sufficiently-large area. In other words, it is desirable that a diameter Ts and a height Ls are sufficiently large.

Specifically, assuming a structure in which: a length of a gate 210 is 100 nm; a film thickness of a gate dielectric is 2 nm; a diameter of a first silicon pillar 810 is 100 nm; and a height of each of the second silicon pillar 820 and a third silicon pillar 840 is 100 nm, a simulation was performed. As a simulation result on this structure, FIG. 41 shows a structure dependence of the punch-through voltage. The vertical axis of FIG. 41 represents the punch-through voltage Vpt which is a voltage applied to a drain electrode so as to cause a drain current of 1e-7 A/um under a condition that a voltage applied to each of a gate electrode and a source electrode is zero V. The horizontal axis represents the height Ls which varies according to a change in shape of a concave source diffusion layer. As seen in FIG. 41, in the concave source diffusion layer-type SGT structure (polygonal line 4102), a higher punch-through voltage as compared with the horizontally flat source/drain diffusion layer-type SGT structure (conventional SGT structure indicated by the point 4100) is provided at any value of the height Ls other than zero, which is proven that the SGT structure has a small off-leak current.

FIG. 42 shows a dependence of the punch-through voltage on the Ts and Td which varies according to a change in shape of the concave source diffusion layer. As seen in FIG. 42, in the concave source diffusion layer-type SGT structure (polygonal line 4202), a higher punch-through voltage as compared with the horizontally flat source/drain diffusion layer-type SGT structure (conventional SGT structure indicated by the point 4200) is also provided at any value of the diameter Ts other than zero, which is proven that the SGT structure has a small off-leak current.

In the fifth embodiment, as with the second embodiment, it is desirable to satisfy the following relation (5-1) to provide a higher punch-through voltage:

$$Ls > \frac{Ts}{4} \quad (5\text{-}1)$$

Further, in the fifth embodiment, it is necessary to satisfy the following relation (5-2), as with the second embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ls \quad (5\text{-}2)$$

(Sixth Embodiment) Semiconductor Device

Figure 36:
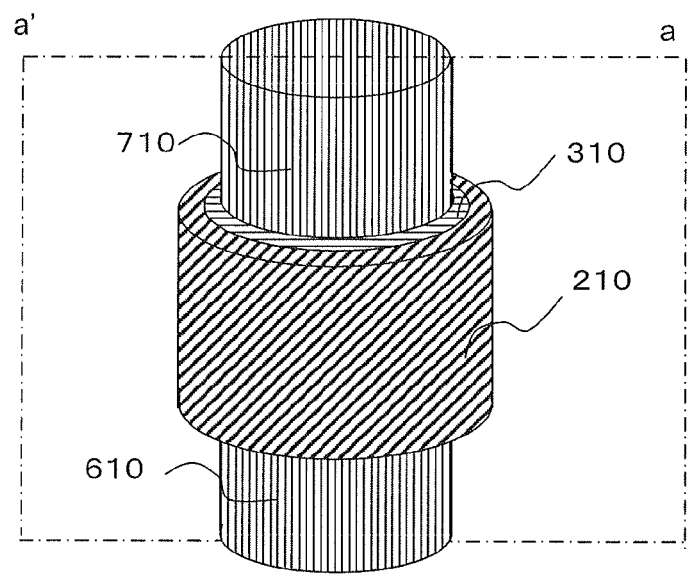
FIG. 36 is a bird's-eye view showing a semiconductor device according to a sixth embodiment of the present invention.
Figure 37:
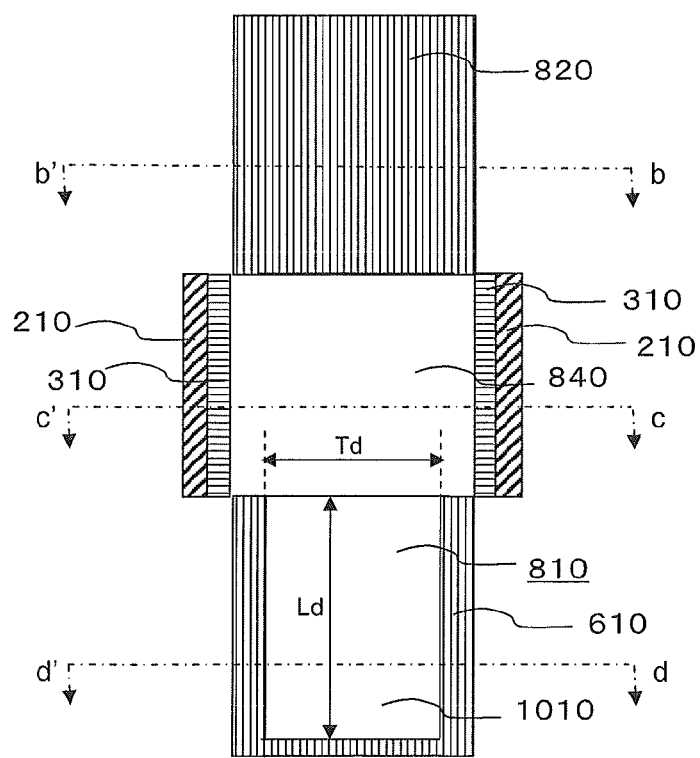
FIG. 37 is a sectional view of the semiconductor device, taken along the cutting-plane line a-a' in FIG. 36.
Figure 38:
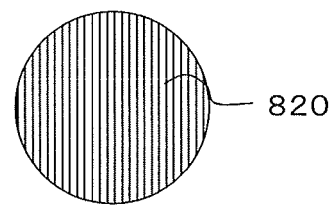
FIG. 38 is a sectional view of the semiconductor device, taken along the cutting-plane line b-b' in FIG. 37.
Figure 39:
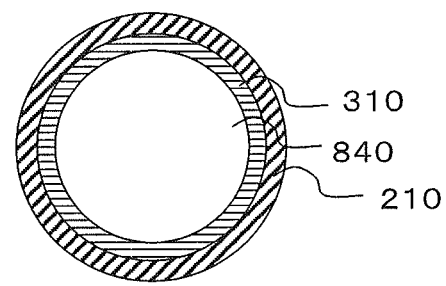
FIG. 39 is a sectional view of the semiconductor device, taken along the cutting-plane line c-c' in FIG. 37.
Figure 40:
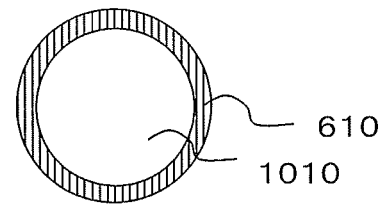
FIG. 40 is a sectional view of the semiconductor device, taken along the cutting-plane line d-d' in FIG. 37.

FIG. 36 is a schematic bird's-eye view of a transistor as a semiconductor device of the present invention, wherein the silicon pillar 830 in the third embodiment is formed as a high resistance region, instead of a first-conductive type impurity region, and the first-conductive type impurity region of the silicon pillar 810 in the third embodiment is formed as a high resistance region. FIG. 37 is a schematic sectional view taken along the cutting-plane line a-a' in FIG. 36, and FIG. 38 is a schematic sectional view taken along the cutting-plane line b-b' in FIG. 37. FIG. 39 is a schematic sectional view taken along the cutting-plane line c-c' in FIG. 37, and FIG. 40 is a schematic sectional view taken along the cutting-plane line d-d' in FIG. 37. The semiconductor device according to the sixth embodiment comprises a first-conductive type third silicon pillar 840, a first dielectric 310 surrounding a side surface of the third silicon pillar 840, a gate 210 surrounding the dielectric 310, a first silicon layer 810 provided underneath the third silicon pillar 840, and a second silicon pillar 820 provided on a top of the third silicon pillar 840, wherein: the first silicon pillar 810 has a second-conductive type high-concentration impurity region 610, and a high resistance region 1010 formed therein and surrounded by the second-conductive type high-concentration impurity region 610; and the second silicon pillar 820 is formed as a second-conductive type high-concentration impurity region 710.

In the sixth embodiment, in view of providing a higher punch-through voltage, it is desirable that the high resistance region 1010 of the first silicon pillar 810 has a sufficiently-large area. In other words, it is desirable that a diameter Td and a height Ld of the high resistance region 1010 are sufficiently large.

Specifically, assuming a structure in which: a length of the gate 210 is 100 nm; a film thickness of the gate dielectric is 2 nm; a diameter of the first silicon pillar 810 is 100 nm; and a height of each of the second silicon pillar 820 and the third silicon pillar 840 is 100 nm, a simulation was performed. As a simulation result on this structure, FIG. 41 shows a structure dependence of the punch-through voltage. The vertical axis of FIG. 41 represents the punch-through voltage Vpt which is a voltage applied to a drain electrode so as to cause a drain current of 1e-7 A/um under a condition that a voltage applied to each of a gate electrode and a source electrode is zero V. The horizontal axis represents the height Ld which varies according to a change in shape of the concave drain diffusion layer. As seen in FIG. 41, in the concave drain diffusion layer-type SGT structure (polygonal line 4103), a higher punch-through voltage as compared with the horizontally flat source/drain diffusion layer-type SGT structure (conventional SGT structure indicated by the point 4100) is provided at any value of the height Ld other than zero, which is proven that the SGT structure has a small off-leak current.

FIG. 42 shows a dependence of the punch-through voltage on the diameter Td which varies according to a change in shape of the concave drain diffusion layer. As seen in FIG. 42, in the concave drain diffusion layer-type SGT structure (polygonal line 4203), a higher punch-through voltage as compared with the horizontally flat source/drain diffusion layer-type SGT structure (conventional SGT structure indicated by the point 4200) is also provided at any value of the diameter Td other than zero, which is proven that the SGT structure has a small off-leak current.

In the sixth embodiment, as with the third embodiment, it is desirable to satisfy the following relation (6-1) to provide a higher punch-through voltage, $$Ld > \frac{Td}{4} \quad (6\text{-}1)$$

Further, in the sixth embodiment, it is necessary to satisfy the following relation (6-2), as with the third embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ld \quad (6\text{-}2)$$

(Seventh Embodiment) Semiconductor Device

Figure 43:
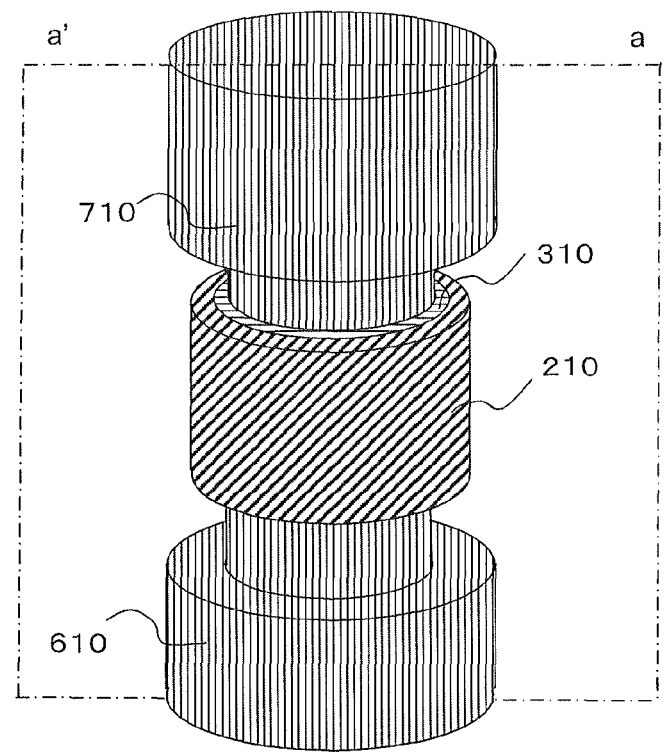
FIG. 43 is a bird's-eye view showing a semiconductor device according to a seventh embodiment of the present invention.
Figure 44:
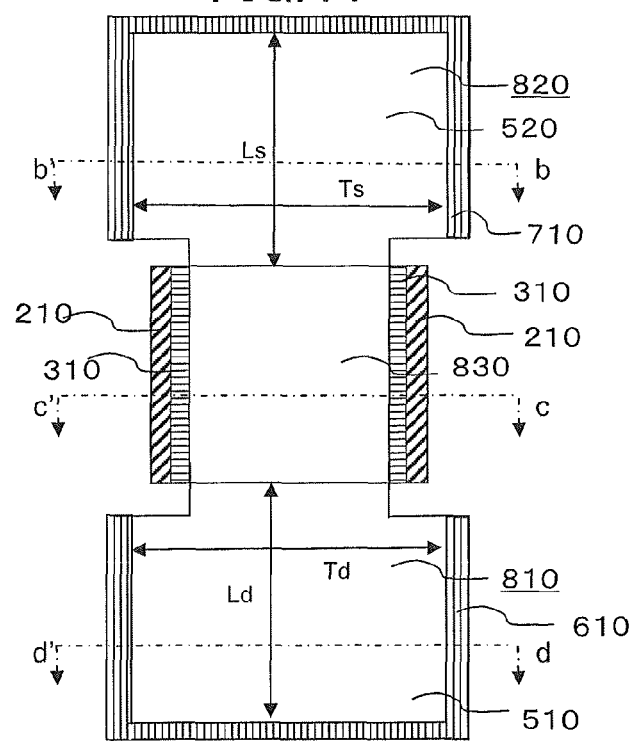
FIG. 44 is a sectional view of the semiconductor device, taken along the cutting-plane line a-a' in FIG. 43.
Figure 45:
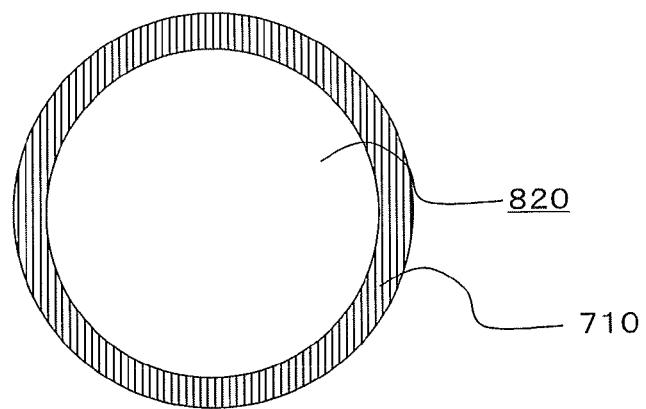
FIG. 45 is a sectional view of the semiconductor device, taken along the cutting-plane line b-b' in FIG. 44.
Figure 46:
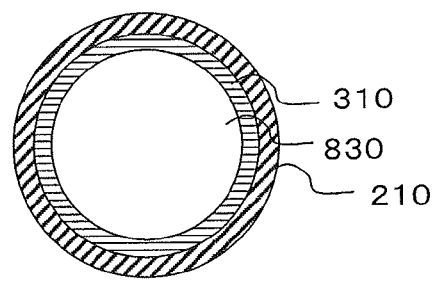
FIG. 46 is a sectional view of the semiconductor device, taken along the cutting-plane line c-c' in FIG. 44.
Figure 47:
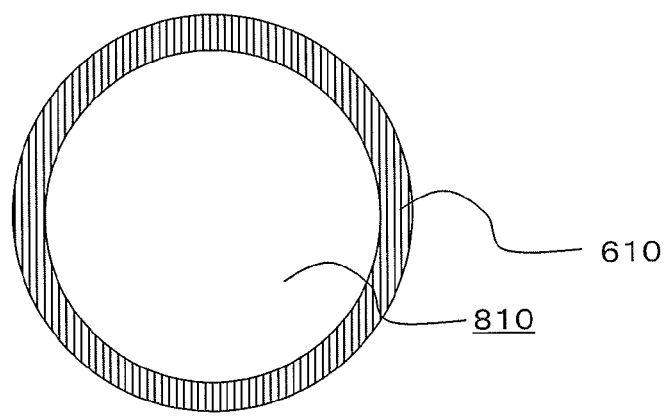
FIG. 47 is a sectional view of the semiconductor device, taken along the cutting-plane line d-d' in FIG. 44.

FIG. 43 is a bird's-eye view showing a transistor as a semiconductor device of the present invention. FIG. 44 is a schematic sectional view taken along the cutting-plane line a-a' in FIG. 43, and FIG. 45 is a schematic sectional view taken along the cutting-plane line b-b' in FIG. 44. FIG. 46 is a schematic sectional view taken along the cutting-plane line c-c' in FIG. 44, and FIG. 47 is a schematic sectional view taken along the cutting-plane line d-d' in FIG. 44. The semiconductor device according to the seventh embodiment comprises a first-conductive type first silicon pillar 830, a first dielectric 310 surrounding a side surface of the third silicon pillar 830, a gate 210 surrounding the dielectric 310, a first silicon pillar 810 provided underneath the third silicon pillar 830 to partially have a diameter greater than that of the third silicon pillar 830, and a second silicon pillar 820 provided on a top of the third silicon pillar 830 to partially have a diameter greater than that of the third silicon pillar 830, wherein: the first silicon pillar 810 has a second-conductive type high-concentration impurity region 610 formed in a surface thereof except at least a part of a contact surface region with the third silicon pillar 830, and a first-conductive type impurity region 510 formed therein and surrounded by the second-conductive type high-concentration impurity region 610; and the second silicon pillar 820 has a second-conductive type high-concentration impurity region 710 formed in a surface thereof except at least a part of a contact surface region with the third silicon pillar 830, and a first-conductive type impurity region 520 formed therein and surrounded by the second-conductive type high-concentration impurity region 710.

In the seventh embodiment, in view of providing a higher punch-through voltage, it is desirable that each of the first-conductive type impurity region 510 of the first silicon pillar 810 and the first-conductive type impurity region 520 of the second silicon pillar 820 has a sufficiently-large area. In other words, it is desirable that a diameter Td and a height Ld of the first-conductive type impurity region 510, and a diameter Ts and a height Ls of the first-conductive type impurity region 520, are sufficiently large.

Figure 58:
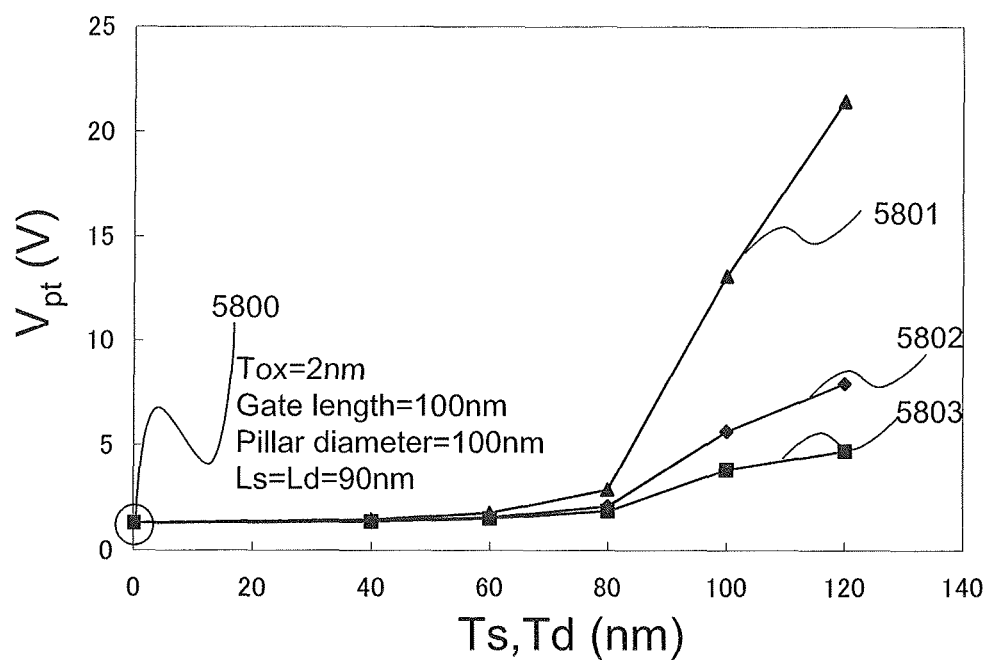
FIG. 58 is a graph showing a relationship between a punch-through voltage and a diameter Ts (Td) in each of the semiconductor devices illustrated in FIGS. 43, 48 and 53.

Specifically, assuming a structure in which: a length of the gate 210 is 100 nm; a film thickness of the gate dielectric is 2 nm; a diameter of the first silicon pillar 810 is 100 nm; and a height of each of the second silicon pillar 820 and the third silicon pillar 830 is 100 nm, a simulation was performed. As a simulation result on this structure, FIG. 58 shows a dependence of the punch-through voltage on each of the diameters Ts, Td which vary according to a change in shape of respective ones of the concave source diffusion layer and the concave drain diffusion layer. As seen in FIG. 58, in the concave drain/source diffusion layer-type SGT structure (polygonal line 5801), a higher punch-through voltage as compared with the horizontally flat source/drain diffusion layer-type SGT structure (conventional SGT structure indicated by the point 5800) is provided at any value of each of the diameters Ts, Td other than zero, which is proven that the SGT structure has a small off-leak current.

In the seventh embodiment, as with the first embodiment, it is desirable to satisfy the following relations (7-1) and (7-2) to provide a higher punch-through voltage:

$$Ls > \frac{Ts}{4} \quad (7\text{-}1)$$

$$Ld > \frac{Td}{4} \quad (7\text{-}2)$$

Further, in the seventh embodiment, it is necessary to satisfy the following relation (7-3), as with the first embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ls + Ld \quad (7\text{-}3)$$

(Eighth Embodiment) Semiconductor Device

Figure 48:
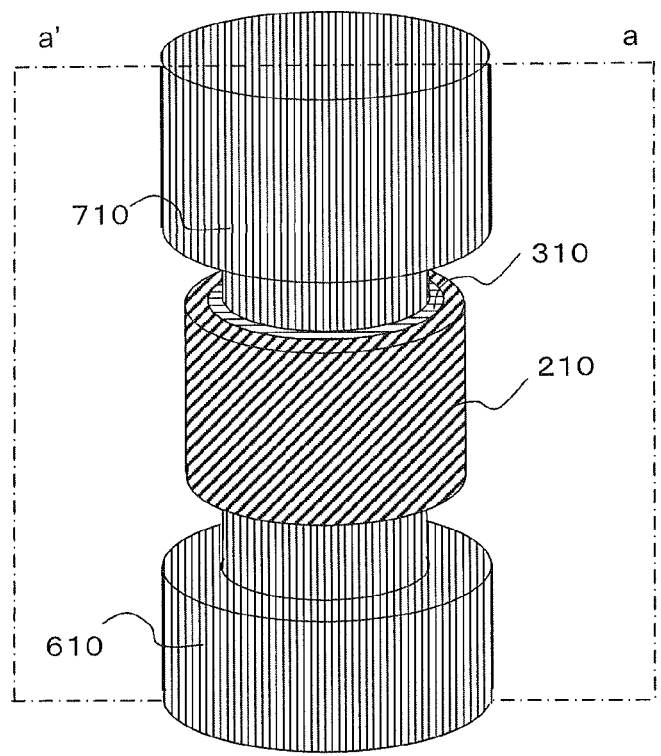
FIG. 48 is a bird's-eye view showing a semiconductor device according to an eighth embodiment of the present invention.
Figure 49:
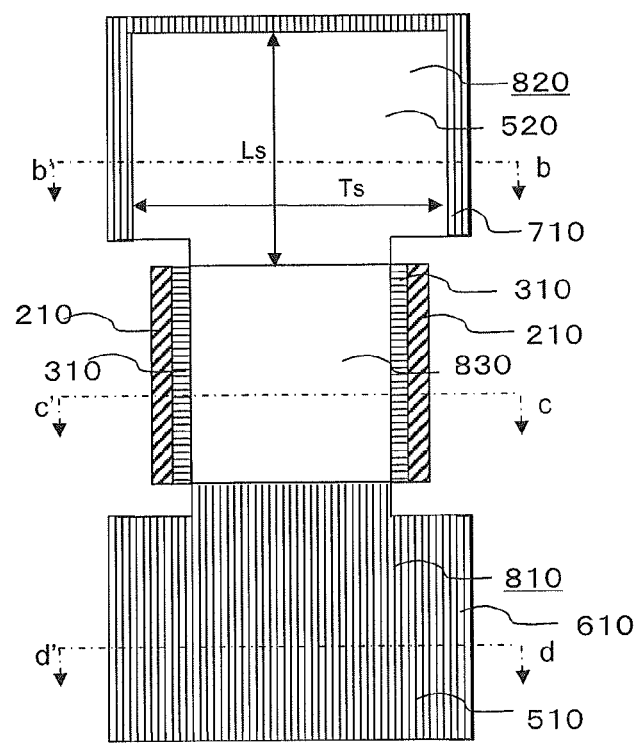
FIG. 49 is a sectional view of the semiconductor device, taken along the cutting-plane line a-a' in FIG. 48.
Figure 50:
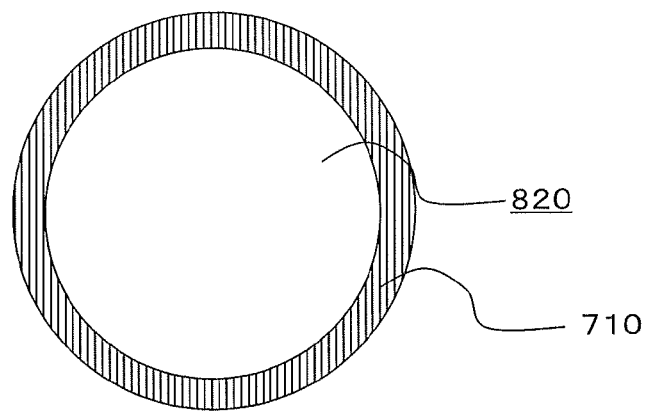
FIG. 50 is a sectional view of the semiconductor device, taken along the cutting-plane line b-b' in FIG. 49.
Figure 51:
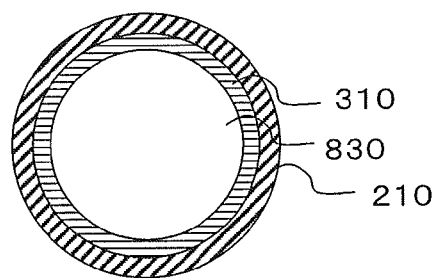
FIG. 51 is a sectional view of the semiconductor device, taken along the cutting-plane line c-c' in FIG. 49.
Figure 52:
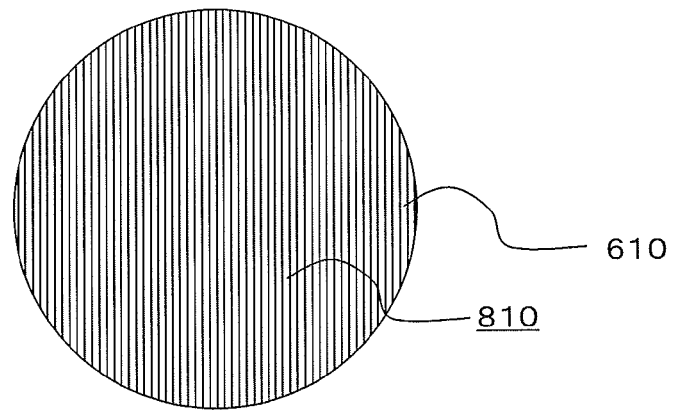
FIG. 52 is a sectional view of the semiconductor device, taken along the cutting-plane line d-d' in FIG. 49.

FIG. 48 is a bird's-eye view showing a transistor as a semiconductor device of the present invention. FIG. 49 is a schematic sectional view taken along the cutting-plane line a-a' in FIG. 48, and FIG. 50 is a schematic sectional view taken along the cutting-plane line b-b' in FIG. 48. FIG. 51 is a schematic sectional view taken along the cutting-plane line c-c' in FIG. 48, and FIG. 52 is a schematic sectional view taken along the cutting-plane line d-d' in FIG. 48. The semiconductor device according to the eighth embodiment comprises a first-conductive type third silicon pillar 830, a first dielectric 310 surrounding a side surface of the third silicon pillar 830, a gate 210 surrounding the dielectric 310, a first silicon pillar 810 provided underneath the third silicon pillar 830 to partially have a diameter greater than that of the third silicon pillar 830, and a second silicon pillar 820 provided on a top of the third silicon pillar 830 to partially have a diameter greater than that of the third silicon pillar 830, wherein: the first silicon pillar 810 is formed as a second-conductive type high-concentration impurity region 610; and the second silicon pillar 820 has a second-conductive type high-concentration impurity region 710 formed in a surface thereof except at least a part of a contact surface region with the third silicon pillar 830, and a first-conductive type impurity region 520 formed therein and surrounded by the second-conductive type high-concentration impurity region 710.

In the eighth embodiment, in view of providing a higher punch-through voltage, it is desirable that the first-conductive type impurity region 520 of the second silicon pillar 820 has a sufficiently-large area. In other words, it is desirable that a diameter Ts and a height Ls of the first-conductive type impurity region 520 are sufficiently large.

Specifically, assuming a structure in which: a length of the gate 210 is 100 nm; a film thickness of the gate dielectric is 2 nm; a diameter of the first silicon pillar 810 is 100 nm; and a height of each of the second silicon pillar 820 and the third silicon pillar 830 is 100 nm, a simulation was performed. As a simulation result on this structure, FIG. 58 shows a dependence of the punch-through voltage on the Ts, Td which varies according to a change in shape of the concave source diffusion layer. As seen in FIG. 58, in the concave source diffusion layer-type SGT structure (polygonal line 5802), a higher punch-through voltage as compared with the horizontally flat source/drain diffusion layer-type SGT structure (conventional SGT structure indicated by the point 5800) is provided at any value of the Ts, Td other than zero, which is proven that the SGT structure has a small off-leak current.

In the eighth embodiment, as with the second embodiment, it is desirable to satisfy the following relation (8-1) to provide a higher punch-through voltage:

$$Ls > \frac{Ts}{4} \quad (8\text{-}1)$$

Further, in the eighth embodiment, it is necessary to satisfy the following relation (8-2), as with the first embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ls \quad (8\text{-}2)$$

(Ninth Embodiment) Semiconductor Device

Figure 53:
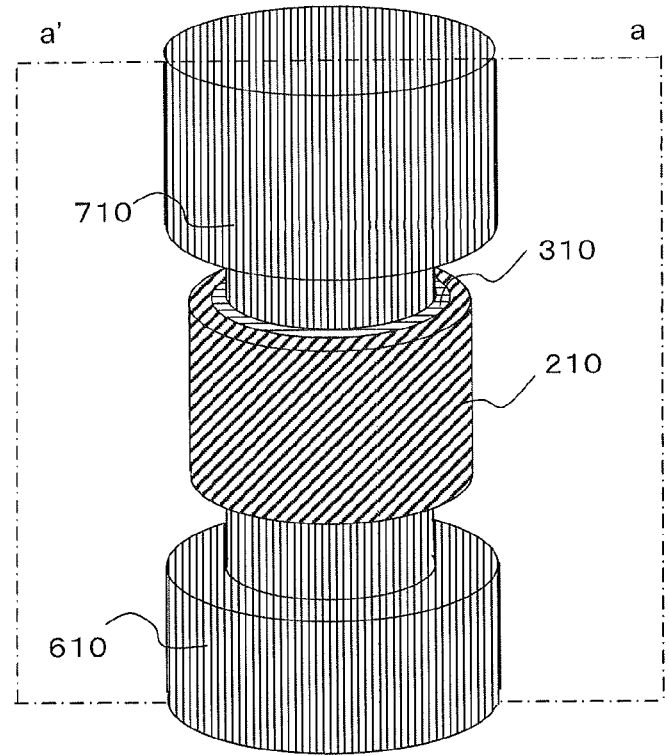
FIG. 53 is a bird's-eye view showing a semiconductor device according to a ninth embodiment of the present invention.
Figure 54:
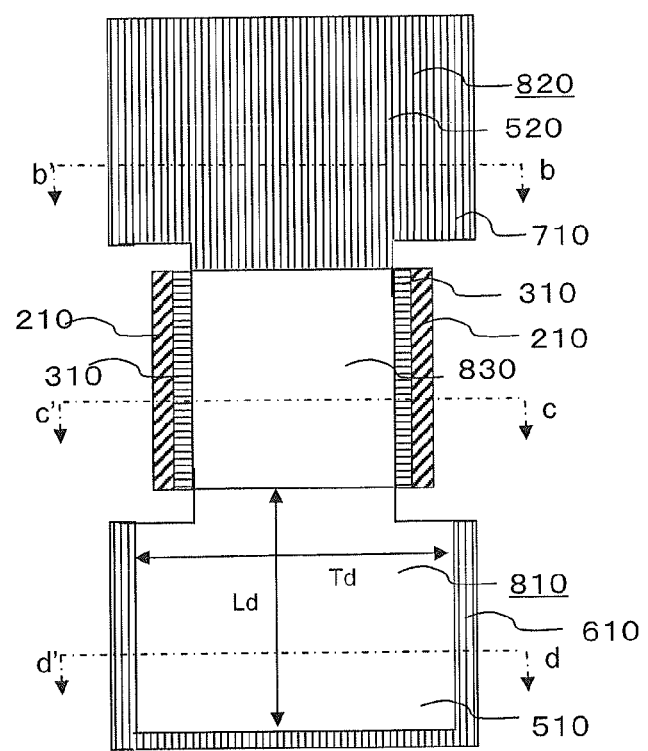
FIG. 54 is a sectional view of the semiconductor device, taken along the cutting-plane line a-a' in FIG. 53.
Figure 55:
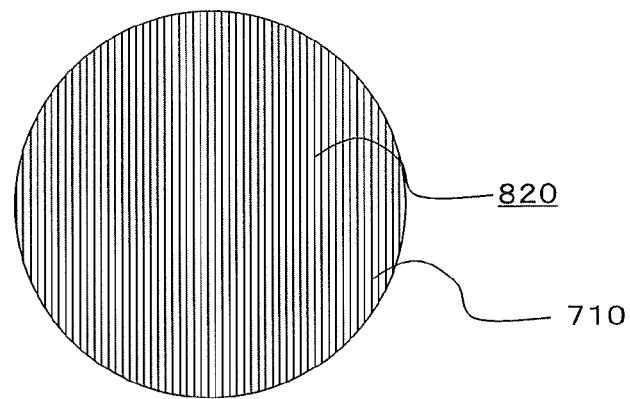
FIG. 55 is a sectional view of the semiconductor device, taken along the cutting-plane line b-b' in FIG. 54.
Figure 56:
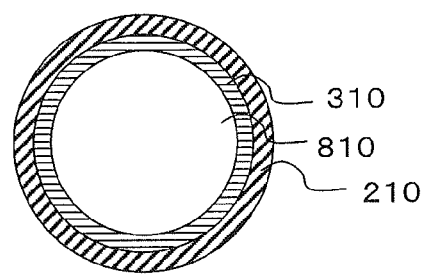
FIG. 56 is a sectional view of the semiconductor device, taken along the cutting-plane line c-c' in FIG. 54.
Figure 57:
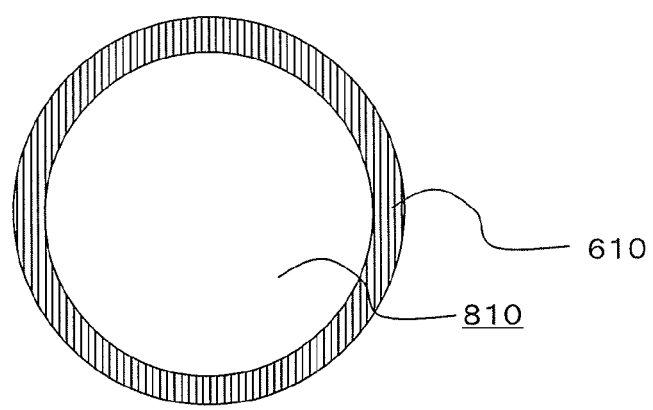
FIG. 57 is a sectional view of the semiconductor device, taken along the cutting-plane line d-d' in FIG. 54.

FIG. 53 is a bird's-eye view showing a transistor as a semiconductor device of the present invention. FIG. 54 is a schematic sectional view taken along the cutting-plane line a-a' in FIG. 53, and FIG. 55 is a schematic sectional view taken along the cutting-plane line b-b' in FIG. 54. FIG. 56 is a schematic sectional view taken along the cutting-plane line c-c' in FIG. 54, and FIG. 57 is a schematic sectional view taken along the cutting-plane line d-d' in FIG. 54. The semiconductor device according to the ninth embodiment comprises a first-conductive type third silicon pillar 830, a first dielectric 310 surrounding a side surface of the third silicon pillar 830, a gate 210 surrounding the dielectric 310, a first silicon pillar 810 provided underneath the third silicon pillar 830 to partially have a diameter greater than that of the third silicon pillar 830, and a second silicon pillar 820 provided on a top of the third silicon pillar 830 to partially have a diameter greater than that of the third silicon pillar 830, wherein: the first silicon pillar 810 has a second-conductive type high-concentration impurity region 610 formed in a surface thereof except at least a part of a contact surface region with the third silicon pillar 830, and a first-conductive type impurity region 510 formed therein and surrounded by the second-conductive type high-concentration impurity region 610; and the second silicon pillar 820 is formed as a second-conductive type high-concentration impurity region 710.

In the ninth embodiment, in view of providing a higher punch-through voltage, it is desirable that the first-conductive type impurity region 510 of the first silicon pillar 810 has a sufficiently-large area. In other words, it is desirable that a diameter Td and a height Ld of the first-conductive type impurity region 510 are sufficiently large.

Specifically, assuming a structure in which: a length of the gate 210 is 100 nm; a film thickness of the gate dielectric is 2 nm; a diameter of the first silicon pillar 810 is 100 nm; and a height of each of the second silicon pillar 820 and the third silicon pillar 830 is 100 nm, a simulation was performed. As a simulation result on this structure, FIG. 58 shows a dependence of the punch-through voltage on the Td which varies according to a change in shape of the concave drain diffusion layer. As seen in FIG. 58, in the concave drain diffusion layer-type SGT structure (polygonal line 5803), a higher punch-through voltage as compared with the horizontally flat source/drain diffusion layer-type SGT structure (conventional SGT structure indicated by the point 5800) is provided at any value of the diameter Td other than zero, which is proven that the SGT structure has a small off-leak current.

In the ninth embodiment, as with the third embodiment, it is desirable to satisfy the following relation (9-1) to provide a higher punch-through voltage:

$$Ld > \frac{Td}{4} \qquad (9\text{-}1)$$

Further, in the ninth embodiment, it is necessary to satisfy the following relation (9-2), as with the first embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ld \qquad (9\text{-}2)$$

(Tenth Embodiment) Semiconductor Device

Figure 59:
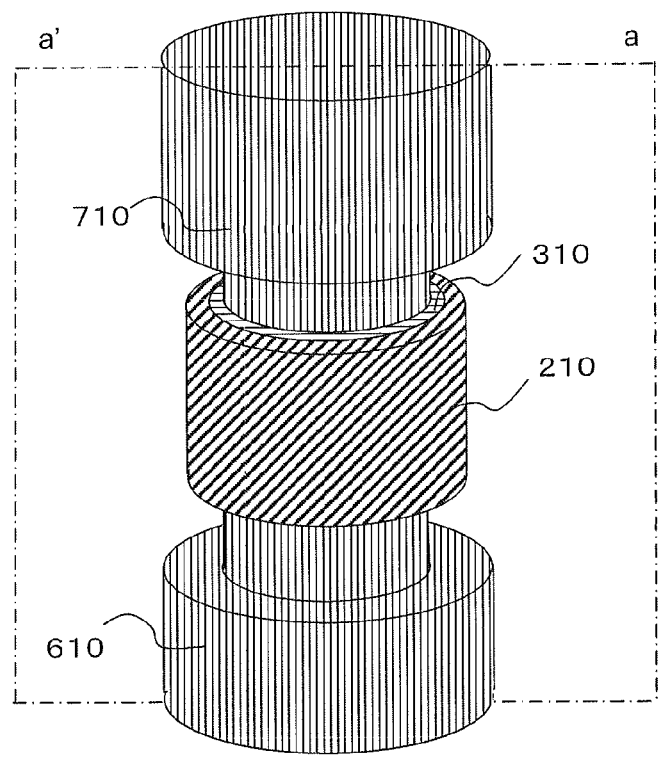
FIG. 59 is a bird's-eye view showing a semiconductor device according to a tenth embodiment of the present invention.
Figure 60:
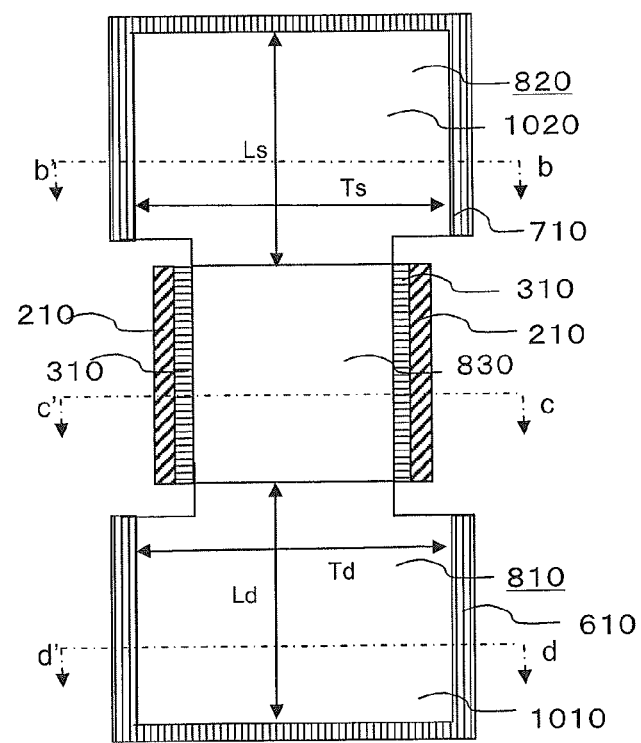
FIG. 60 is a sectional view of the semiconductor device, taken along the cutting-plane line a-a' in FIG. 59.
Figure 61:
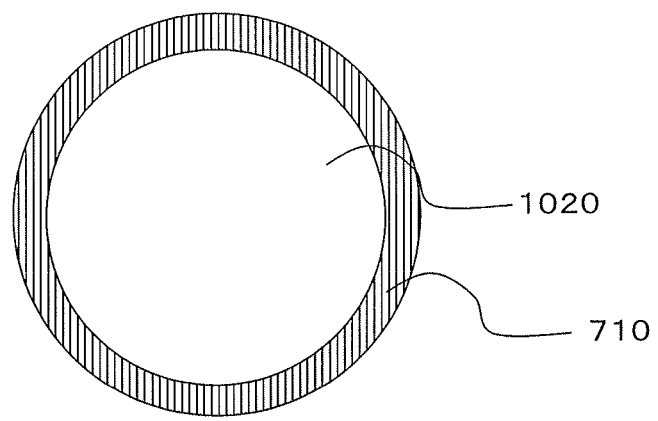
FIG. 61 is a sectional view of the semiconductor device, taken along the cutting-plane line b-b' in FIG. 60.
Figure 62:
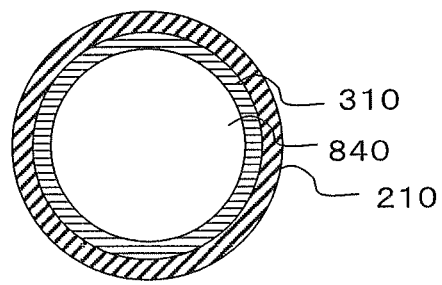
FIG. 62 is a sectional view of the semiconductor device, taken along the cutting-plane line c-c' in FIG. 60.
Figure 63:
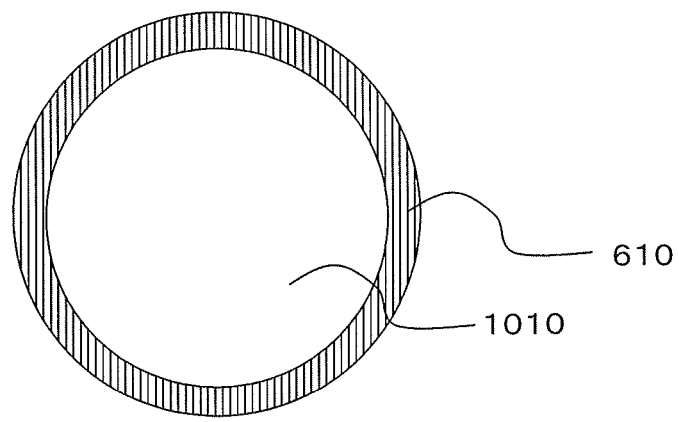
FIG. 63 is a sectional view of the semiconductor device, taken along the cutting-plane line d-d' in FIG. 60.

FIG. 59 is a schematic bird's-eye view of a transistor as a semiconductor device of the present invention, wherein the third silicon pillar 830 in the seventh embodiment is formed as a high resistance region, instead of a first-conductive type impurity region, and each of the first-conductive type impurity region of the first silicon pillar 810 and the first-conductive type impurity region of the second silicon pillar 820 in the seventh embodiment is formed as a high resistance region. FIG. 60 is a schematic sectional view taken along the cutting-plane line a-a' in FIG. 59, and FIG. 61 is a schematic sectional view taken along the cutting-plane line b-b' in FIG. 60. FIG. 62 is a schematic sectional view taken along the cutting-plane line c-c' in FIG. 60, and FIG. 63 is a schematic sectional view taken along the cutting-plane line d-d' in FIG. 60. In the semiconductor device according to the tenth embodiment, in view of providing a higher punch-through voltage, it is desirable that each of a high resistance region 1010 provided in a first silicon pillar 810, and a high resistance region 1020 provided in a second silicon pillar 820, has a sufficiently-large area. In other words, it is desirable that a diameter Td and a height Ld of the high resistance region 1010, and a diameter Ts and a height Ls of the high resistance region 1020, are sufficiently large.

Figure 74:
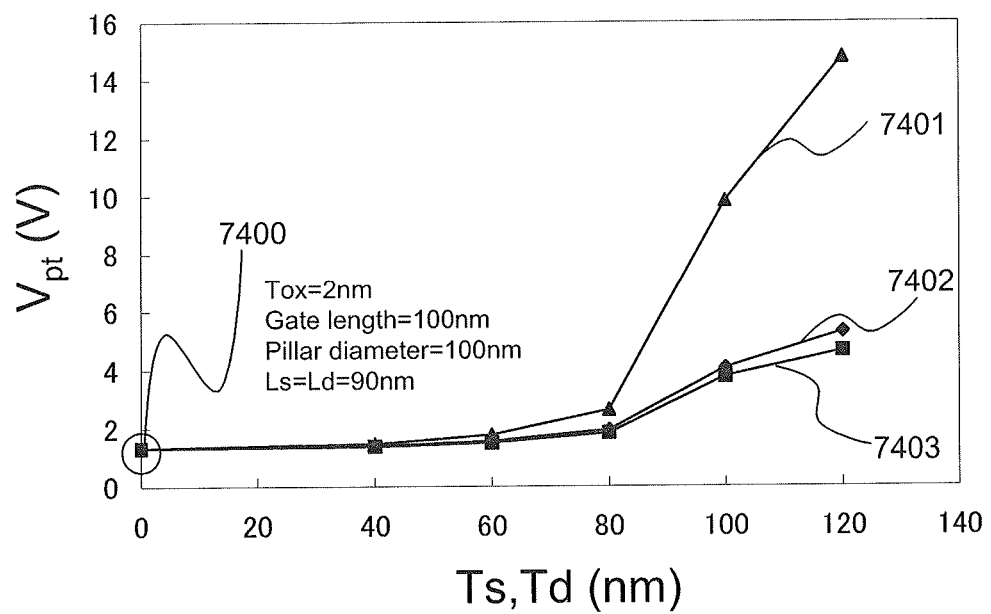
FIG. 74 is a graph showing a relationship between a punch-through voltage and a diameter Ts (Td) in each of the semiconductor devices illustrated in FIGS. 59, 64 and 69.

Specifically, assuming a structure in which: a length of a gate 210 is 100 nm; a film thickness of a gate dielectric is 2 nm; a diameter of the first silicon pillar 810 is 100 nm; and a height of each of the second silicon pillar 820 and the third silicon pillar 830 is 100 nm, a simulation was performed. As a simulation result on this structure, FIG. 74 shows a dependence of the punch-through voltage on each of the diameters Ts, Td which vary according to a change in shape of respective ones of a concave source diffusion layer and a concave drain diffusion layer. As seen in FIG. 74, in the concave source/drain diffusion layer-type SGT structure (polygonal line 7401), a higher punch-through voltage as compared with the horizontally flat source/drain diffusion layer-type SGT structure (conventional SGT structure indicated by the point 7400) is also provided at any value of each of the diameters Ts, Td other than zero, which is proven that the SGT structure has a small off-leak current.

In the tenth embodiment, as with the first embodiment, it is desirable to satisfy the following relations (10-1) and (10-2) to provide a higher punch-through voltage:

$$Ls > \frac{Ts}{4} \qquad (10\text{-}1)$$

$$Ld > \frac{Td}{4} \qquad (10\text{-}2)$$

Further, in the tenth embodiment, it is necessary to satisfy the following relation (10-3), as with the first embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ls + Ld \qquad (10\text{-}3)$$

(Eleventh Embodiment) Semiconductor Device

Figure 64:
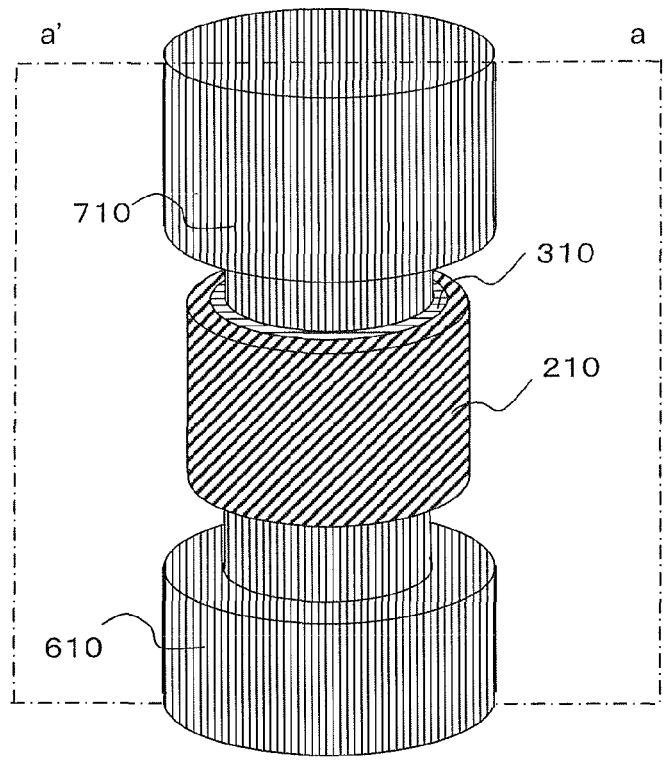
FIG. 64 is a bird's-eye view showing a semiconductor device according to an eleventh embodiment of the present invention.
Figure 65:
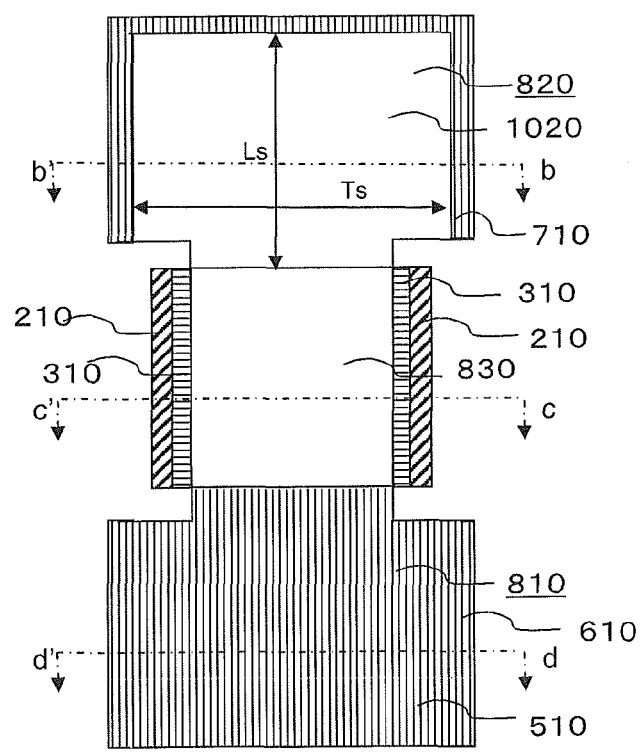
FIG. 65 is a sectional view of the semiconductor device, taken along the cutting-plane line a-a' in FIG. 64.
Figure 66:
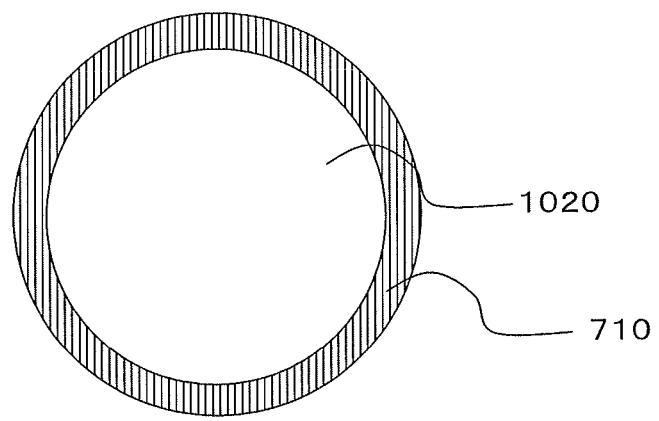
FIG. 66 is a sectional view of the semiconductor device, taken along the cutting-plane line b-b' in FIG. 65.
Figure 67:
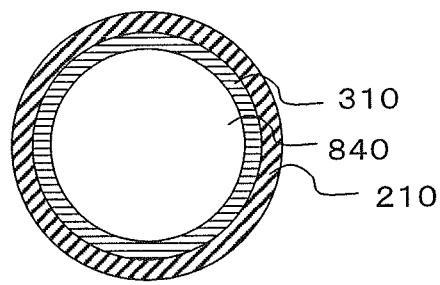
FIG. 67 is a sectional view of the semiconductor device, taken along the cutting-plane line c-c' in FIG. 65.
Figure 68:
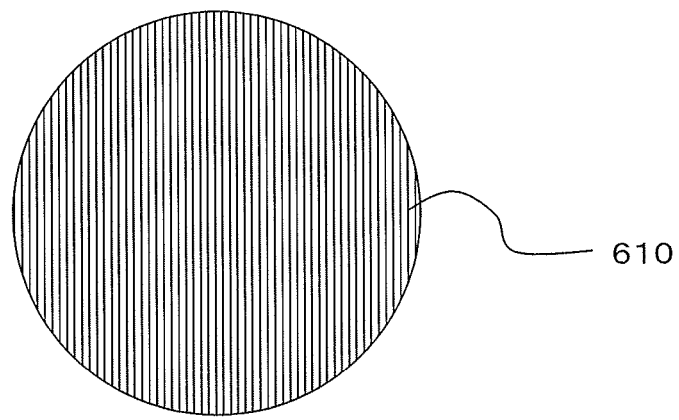
FIG. 68 is a sectional view of the semiconductor device, taken along the cutting-plane line d-d' in FIG. 65.

FIG. 64 is a schematic bird's-eye view of a transistor as a semiconductor device of the present invention, wherein the third silicon pillar 830 in the eighth embodiment is formed as a high resistance region, instead of a first-conductive type impurity region, and the first-conductive type impurity region of the second silicon pillar 820 in the eighth embodiment is formed as a high resistance region. FIG. 65 is a schematic sectional view taken along the cutting-plane line a-a' in FIG. 64, and FIG. 66 is a schematic sectional view taken along the cutting-plane line b-b' in FIG. 65. FIG. 67 is a schematic sectional view taken along the cutting-plane line c-c' in FIG. 65, and FIG. 68 is a schematic sectional view taken along the cutting-plane line d-d' in FIG. 65. In the eleventh embodiment, in view of providing a higher punch-through voltage, it is desirable that a high resistance region 1020 provided in a second silicon pillar 820 has a sufficiently-large area. In other words, it is desirable that a diameter Ts and a height Ls are sufficiently large.

Specifically, assuming a structure in which: a length of a gate 210 is 100 nm; a film thickness of a gate dielectric is 2 nm; a diameter of a first silicon pillar 810 is 100 nm; and a height of each of the second silicon pillar 820 and a third silicon pillar 830 is 100 nm, a simulation was performed. As a simulation result on this structure, FIG. 74 shows a dependence of the punch-through voltage on the Ts, Td which varies according to a change in shape of a concave source diffusion layer. As seen in FIG. 74, in the concave source drain diffusion layer-type SGT structure (polygonal line 7402), a higher punch-through voltage as compared with the horizontally flat source/drain diffusion layer-type SGT structure (conventional SGT structure indicated by the point 7400) is also provided at any value of the Ts, Td other than zero, which is proven that the SGT structure has a small off-leak current.

In the eleventh embodiment, as with the second embodiment, it is desirable to satisfy the following relation (11-1) to provide a higher punch-through voltage:

$$Ls > \frac{Ts}{4} \qquad (11\text{-}1)$$

Further, in the eleventh embodiment, it is necessary to satisfy the following relation (11-2), as with the first embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ls \quad (11\text{-}2)$$

(Twelfth Embodiment) Semiconductor Device

Figure 69:
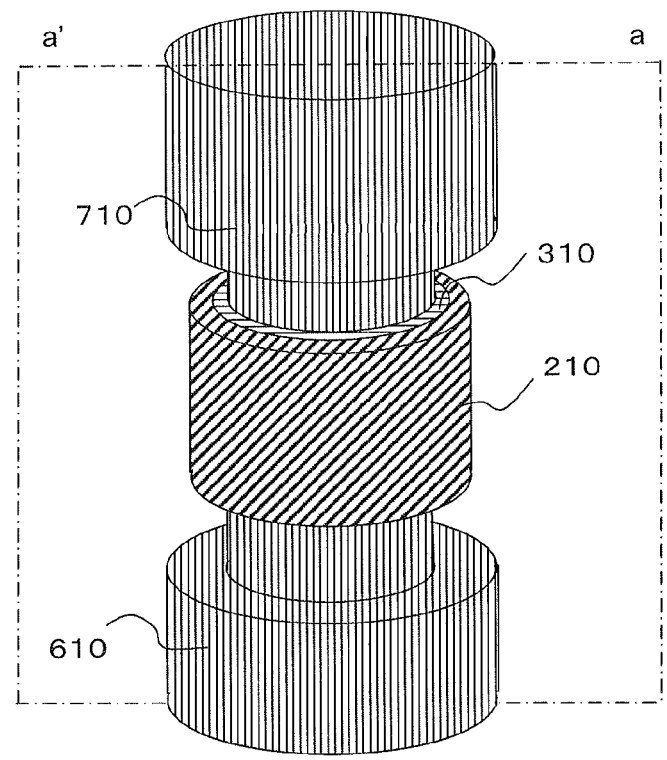
FIG. 69 is a bird's-eye view showing a semiconductor device according to a twelfth embodiment of the present invention.
Figure 70:
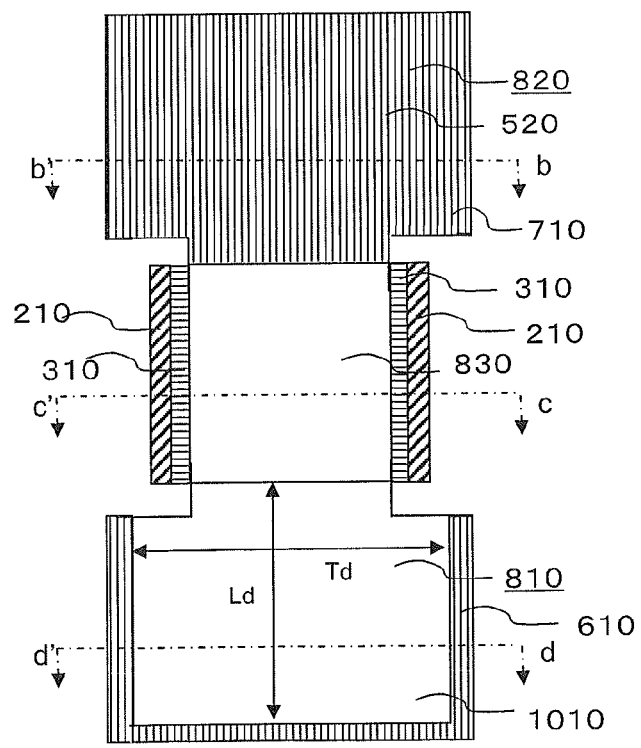
FIG. 70 is a sectional view of the semiconductor device, taken along the cutting-plane line a-a' in FIG. 69.
Figure 71:
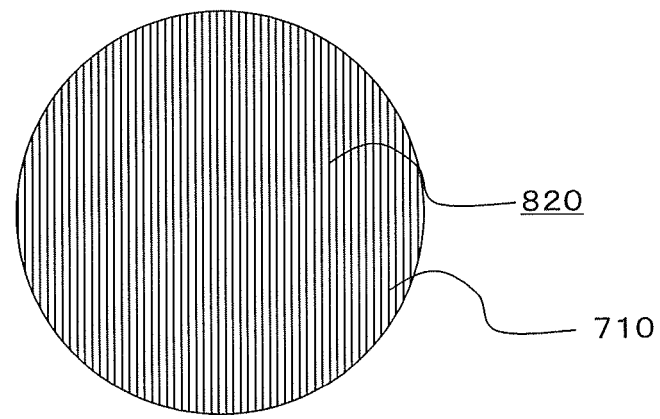
FIG. 71 is a sectional view of the semiconductor device, taken along the cutting-plane line b-b' in FIG. 70.
Figure 72:
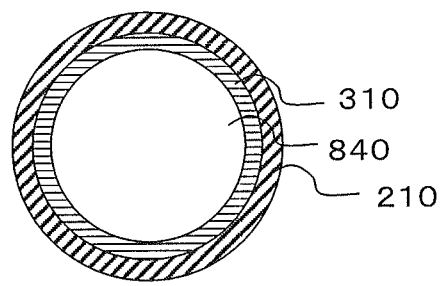
FIG. 72 is a sectional view of the semiconductor device, taken along the cutting-plane line c-c' in FIG. 70.
Figure 73:
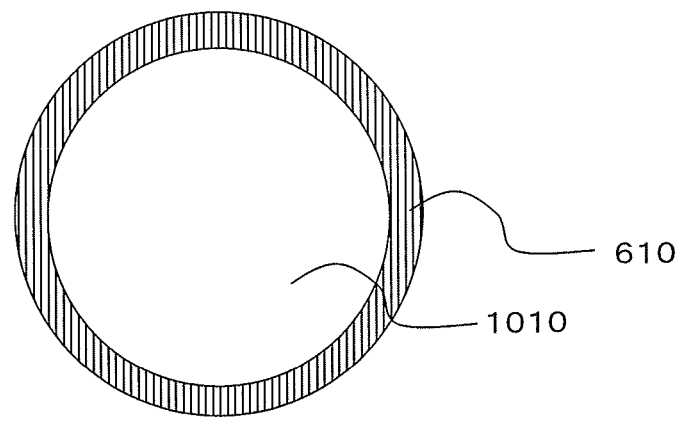
FIG. 73 is a sectional view of the semiconductor device, taken along the cutting-plane line d-d' in FIG. 70.

FIG. 69 is a schematic bird's-eye view of a transistor as a semiconductor device of the present invention, wherein the silicon pillar 830 in the ninth embodiment is formed as a high resistance region, instead of a first-conductive type impurity region, and the first-conductive type impurity region of the silicon pillar 810 in the ninth embodiment is formed as a high resistance region. FIG. 70 is a schematic sectional view taken along the cutting-plane line a-a' in FIG. 69, and FIG. 71 is a schematic sectional view taken along the cutting-plane line b-b' in FIG. 70. FIG. 72 is a schematic sectional view taken along the cutting-plane line c-c' in FIG. 70, and FIG. 73 is a schematic sectional view taken along the cutting-plane line d-d' in FIG. 70.

In the twelfth embodiment, in view of providing a higher punch-through voltage, it is desirable that a high resistance region 1010 provided in a first silicon pillar 810 has a sufficiently-large area. In other words, it is desirable that a diameter Td and a height Ld of the high resistance region 1010 are sufficiently large.

Specifically, assuming a structure in which: a length of a gate 210 is 100 nm; a film thickness of a gate dielectric 310 is 2 nm; a diameter of the first silicon pillar 810 is 100 nm; and a height of each of a second silicon pillar 820 and a third silicon pillar 840 is 100 nm, a simulation was performed. As a simulation result on this structure, FIG. 74 shows a dependence of the punch-through voltage on the diameter Td which varies according to a change in shape of a concave drain diffusion layer. As seen in FIG. 74, in the concave source and drain diffusion layer-type SGT structures (polygonal line 7403), a higher punch-through voltage as compared with the horizontally flat source/drain diffusion layer-type SGT structure (conventional SGT structure indicated by the point 7400) is also provided at any value of the diameter Td other than zero, which is proven that the SGT structure has a small off-leak current.

In the twelfth embodiment, as with the third embodiment, it is desirable to satisfy the following relation (12-1) to provide a higher punch-through voltage:

$$Ld > \frac{Td}{4} \quad (12\text{-}1)$$

Further, in the twelfth embodiment, it is necessary to satisfy the following relation (12-2), as with the third embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ld \quad (12\text{-}2)$$

(Thirteenth Embodiment) Semiconductor Device

Figure 75:
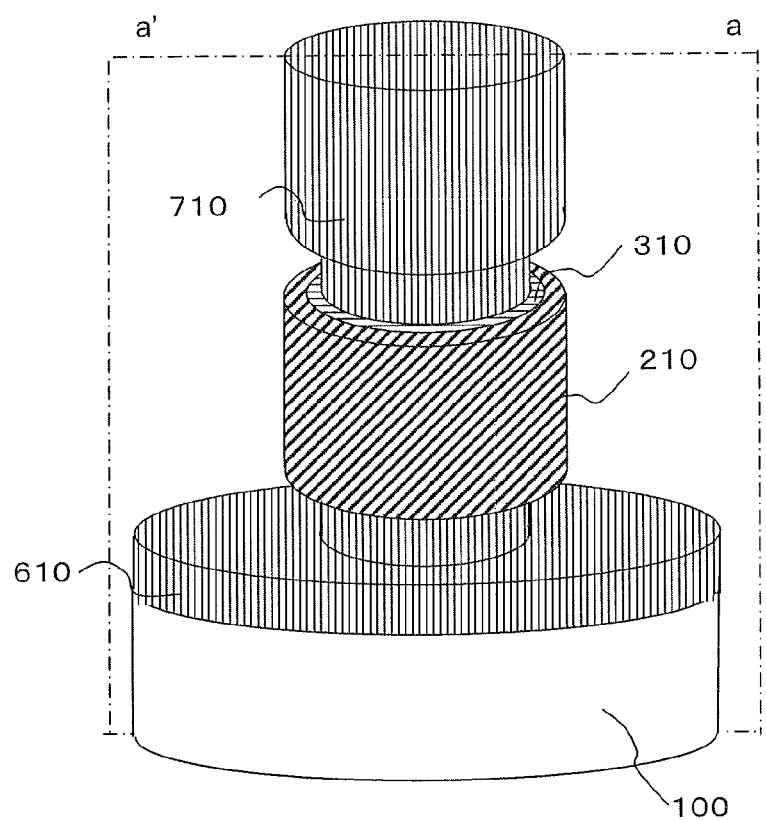
FIG. 75 is a bird's-eye view showing a semiconductor device according to a thirteenth embodiment of the present invention.
Figure 76:
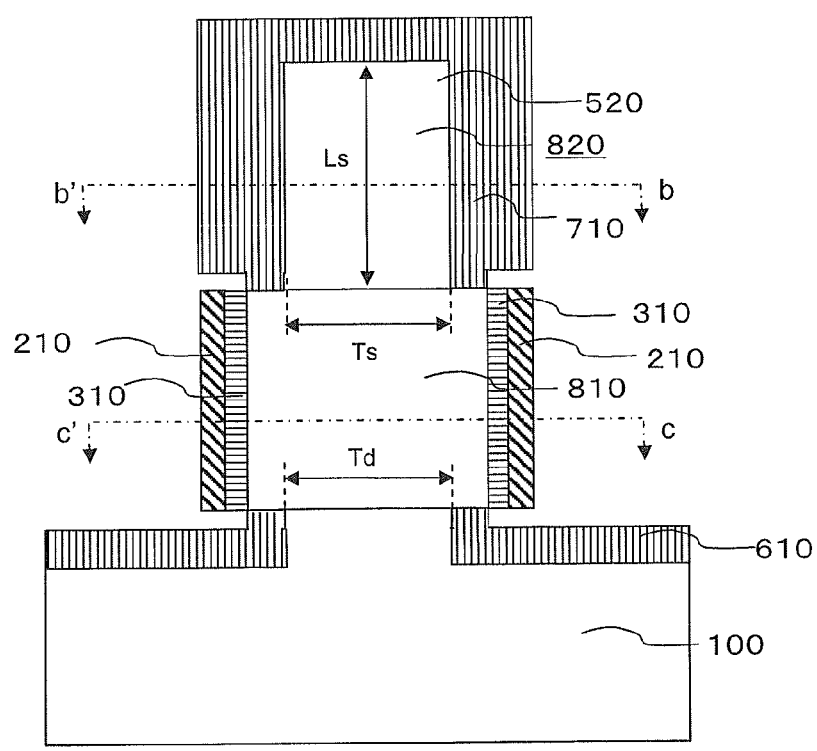
FIG. 76 is a sectional view of the semiconductor device, taken along the cutting-plane line a-a' in FIG. 75.
Figure 77:
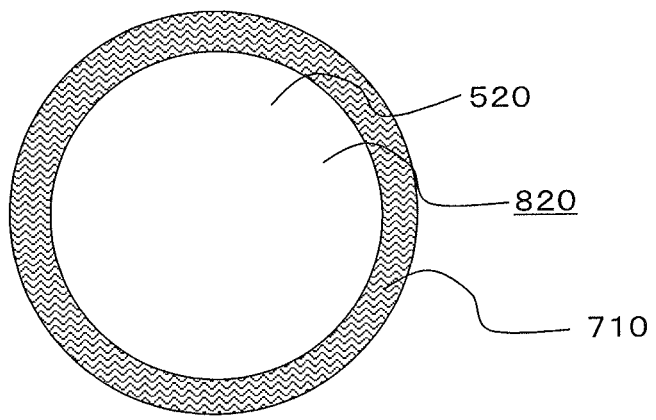
FIG. 77 is a sectional view of the semiconductor device, taken along the cutting-plane line b-b' in FIG. 76.
Figure 78:
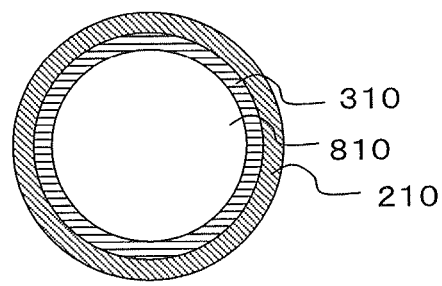
FIG. 78 is a sectional view of the semiconductor device, taken along the cutting-plane line c-c' in FIG. 76.

FIG. 75 is a schematic bird's-eye view of a transistor as a semiconductor device of the present invention. FIG. 76 is a schematic sectional view taken along the cutting-plane line a-a' in FIG. 75. FIG. 77 is a schematic sectional view taken along the cutting-plane line b-b' in FIG. 76, and FIG. 78 is a schematic sectional view taken along the cutting-plane line c-c' in FIG. 76. The semiconductor device according to the thirteenth embodiment comprises a first-conductive type first silicon pillar 810 formed on a first-conductive type silicon substrate 100, a first dielectric 310 surrounding the first silicon pillar 810, a gate 210 surrounding the dielectric 310, and a second silicon pillar 820 provided on a top of the first silicon pillar 810, wherein: the silicon substrate 100 has a second-conductive type high-concentration impurity region 610 formed in a part thereof; and the second silicon layer 820 has a second-conductive type high-concentration impurity region 710 formed in a surface thereof except at least a part of a contact surface region with the third silicon pillar 810, and a first-conductive type impurity region 520 formed therein and surrounded by the second-conductive type high-concentration impurity region 710.

In the thirteenth embodiment, in view of providing a higher punch-through voltage, it is desirable that the first-conductive type impurity region 520 of the second silicon pillar 820 has a sufficiently-large area. In other words, it is desirable that a diameter Ts and a height Ls of the first-conductive type impurity region 520 are sufficiently large.

Figure 79:
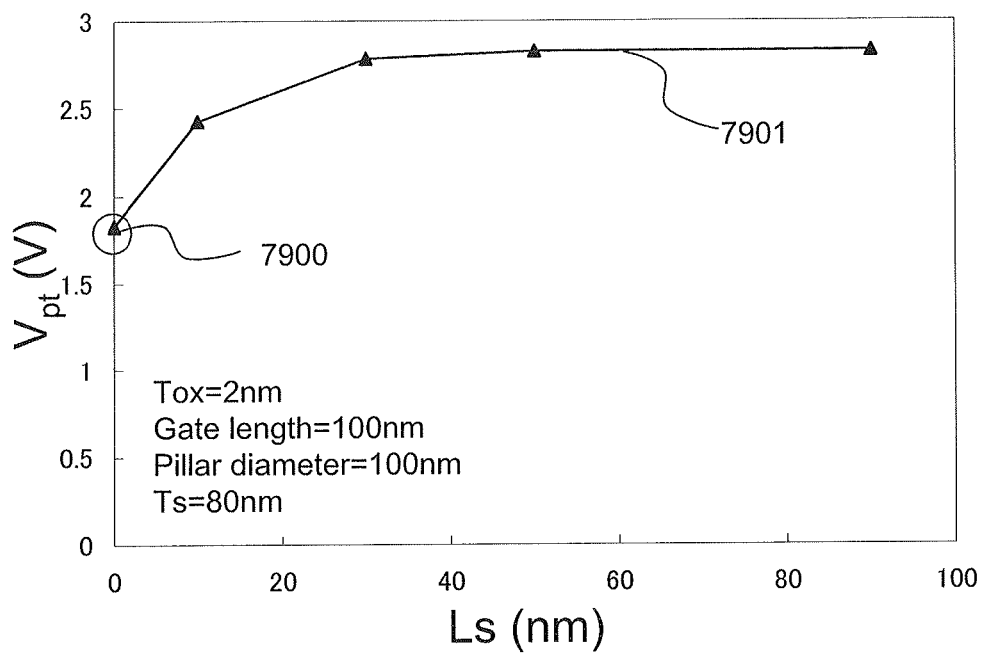
FIG. 79 is a graph showing a relationship between a punch-through voltage and a length Ls in the semiconductor device illustrated in FIG. 75.

Specifically, assuming a structure in which: a length of the gate 210 is 100 nm; a film thickness of the gate dielectric is 2 nm; and a diameter of the first silicon pillar 810 is 100 nm; a height of the second silicon pillar 820 is 100 nm, a simulation was performed. As a simulation result on this structure, FIG. 79 shows a structure dependence of the punch-through voltage. The vertical axis of FIG. 79 represents the punch-through voltage Vpt which is a voltage applied to a drain electrode so as to cause a drain current of 1e-7 A/um under a condition that a voltage applied to each of a gate electrode and a source electrode is zero V. The horizontal axis represents the height Ls which varies according to a change in shape of the concave source diffusion layer. As seen in FIG. 79, in the concave source diffusion layer-type SGT structure (polygonal line 7901), a higher punch-through voltage as compared with the horizontally flat source/drain diffusion layer-type SGT structure (conventional SGT structure indicated by the point 7900) is provided at any value of the height Ld other than zero, which is proven that the SGT structure has a small off-leak current.

Figure 80:
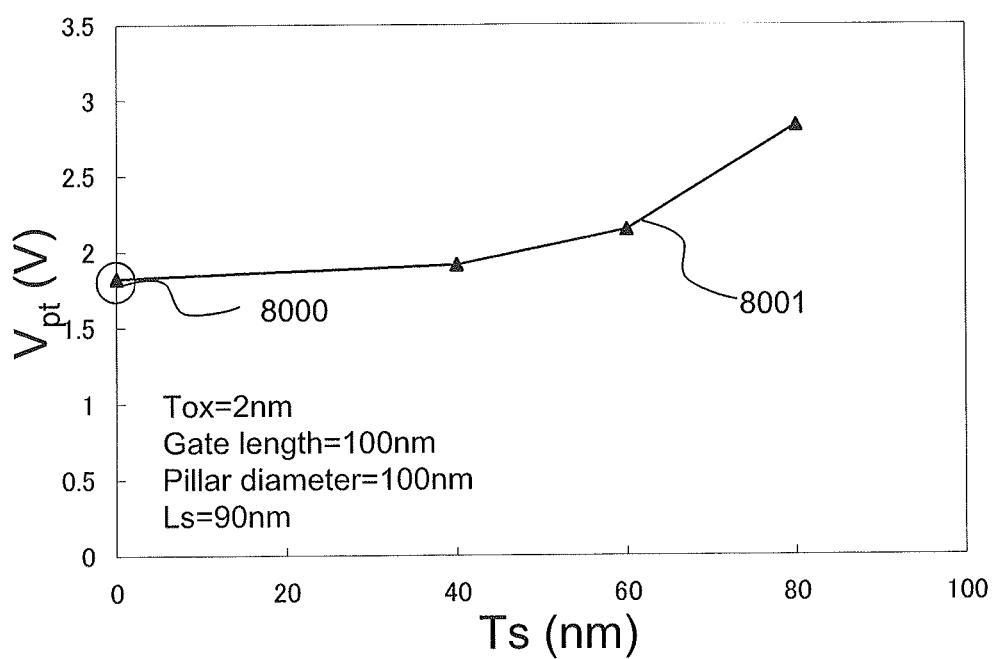
FIG. 80 is a graph showing a relationship between a punch-through voltage and a diameter Ts (Td) in the semiconductor device illustrated in FIG. 75.

FIG. 80 shows a dependence of the punch-through voltage on the diameters Ts which varies according to a change in shape of the concave source diffusion layer. As seen in FIG. 80, in the concave source diffusion layer-type SGT structure (polygonal line 8001), a higher punch-through voltage as compared with the horizontally flat source/drain diffusion layer-type SGT structure (conventional SGT structure indicated by the point 8000) is provided at any value of the diameter Ts other than zero, which is proven that the SGT structure has a small off-leak current.

In the thirteenth embodiment, it is desirable that the height Ls is greater than a depth Ts/4 of a depletion layer to suppress the punch-through effect, as with the first embodiment. In other words, it is desirable to satisfy the following relation (13-1):

$$Ls > \frac{Ts}{4} \quad (13\text{-}1)$$

Figure 81:
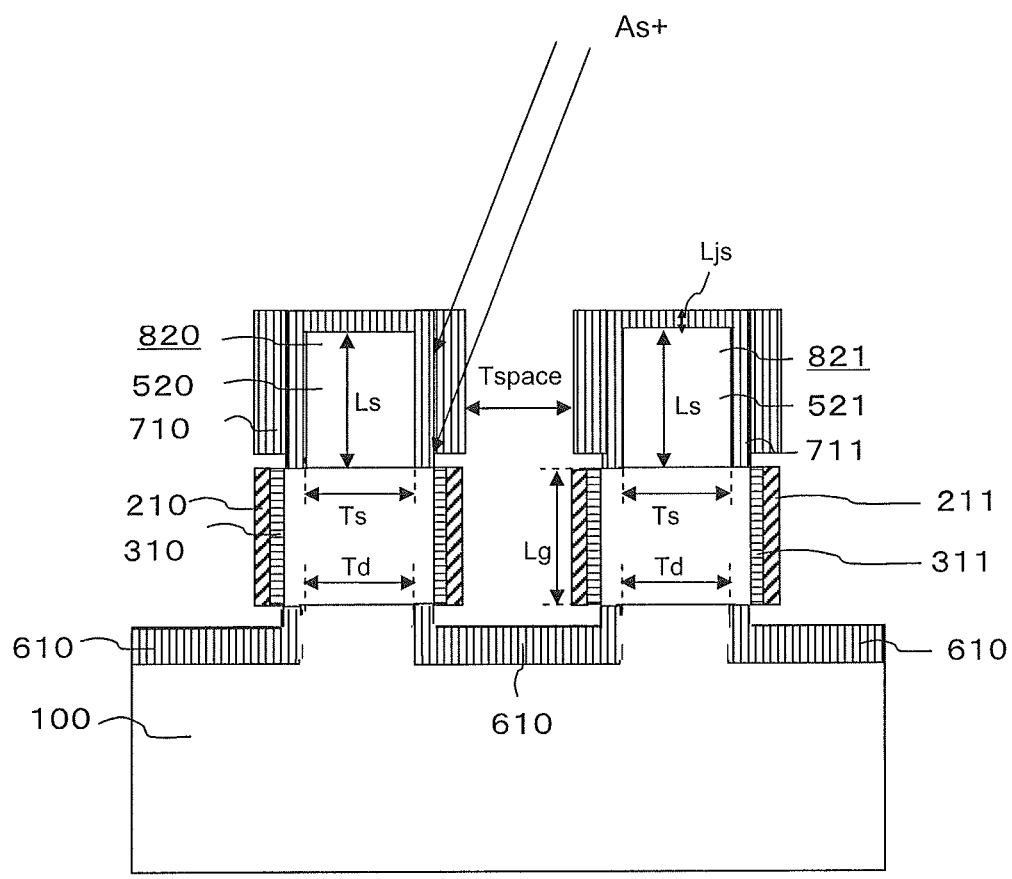
FIG. 81 is a diagram showing a process for performing ion implantation at an oblique angle to form a concave diffusion layer of the semiconductor device illustrated in FIG. 75.

Further, in a process for making the concave diffusion layer-type SGT structure illustrated in FIG. 75, it is necessary to perform ion implantation at an oblique angle as shown in FIG. 81 so as to form the concave diffusion layer. During the ion implantation, for example, when As⁺ is implanted into an NMOSFET, a silicon pillar of an NMOSFET adjacent to the target NMOSFET is likely to disturb the ion implantation. Thus, it is essential to satisfy the following relation (13-2):

$$\tan\left(\frac{\pi}{36}\right) > \frac{Ls + Ljs}{Tspace}, \qquad (13\text{-}2)$$

wherein: Ls is a height of the first-conductive type impurity region 610;
Ljs is a depth of the second-conductive type high-concentration impurity region 620; and
Tspace is a distance between silicon pillars of adjacent two SGTs;
Thus, based on the relation (13-2), Ls is required to satisfy the following relation (12-3):

$$\tan\left(\frac{\pi}{36}\right) \cdot Tspace - Ljs > Ls \qquad (13\text{-}3)$$

(Fourteenth Embodiment) Semiconductor Device

Figure 82:
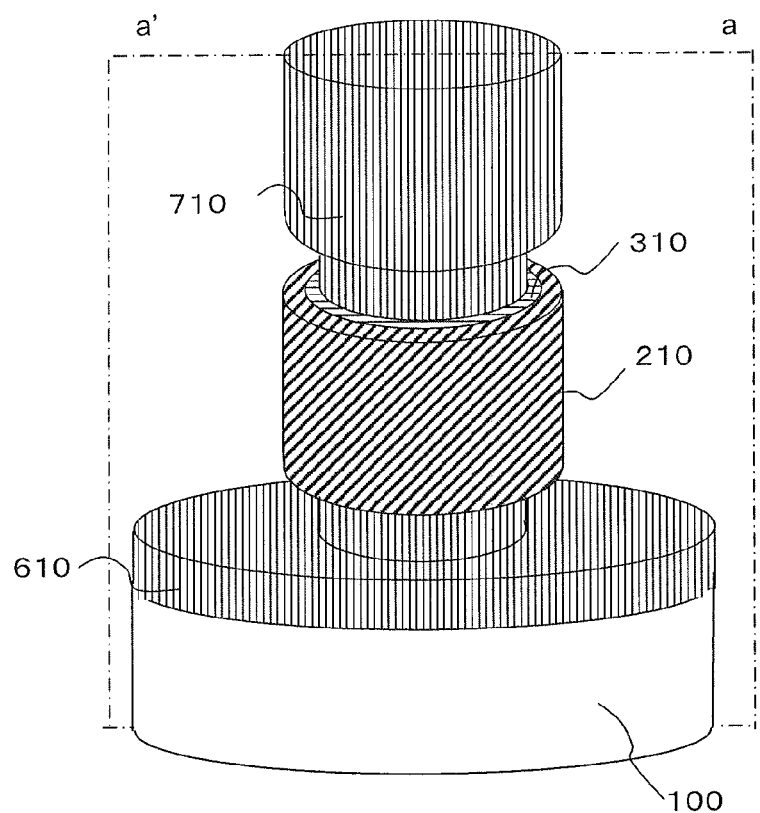
FIG. 82 is a bird's-eye view showing a semiconductor device according to a fourteenth embodiment of the present invention.
Figure 83:
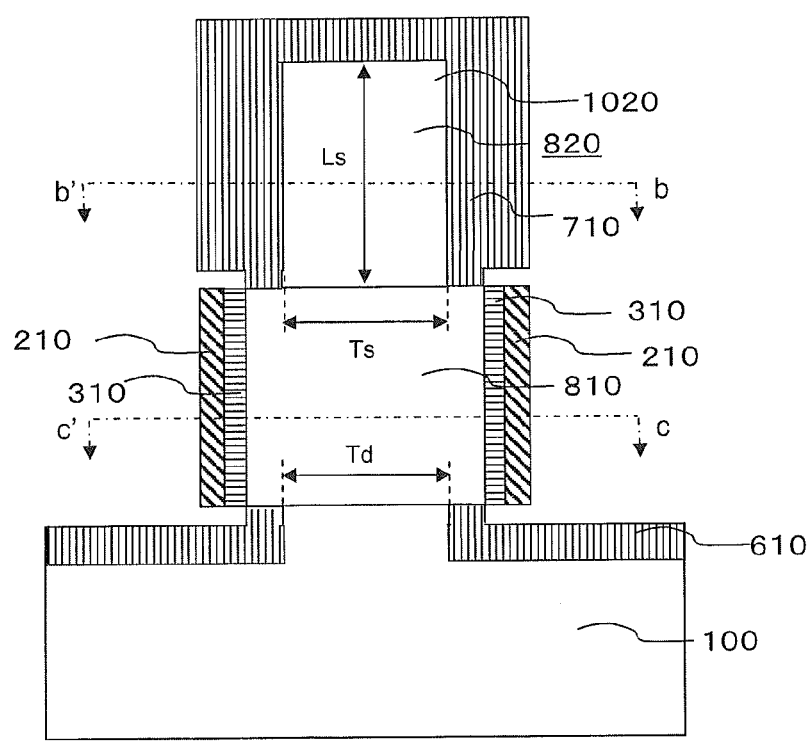
FIG. 83 is a sectional view of the semiconductor device, taken along the cutting-plane line a-a' in FIG. 82.
Figure 84:
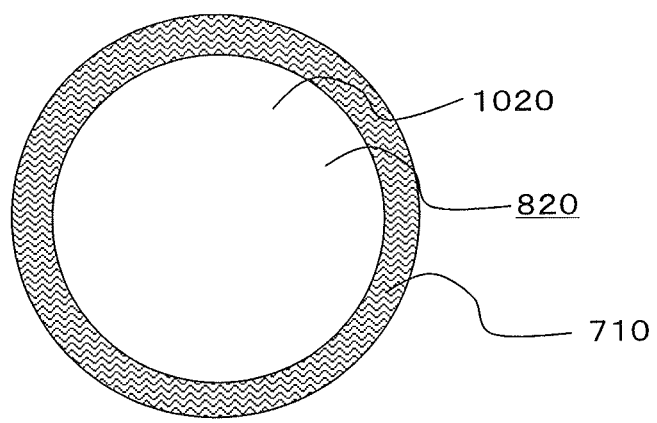
FIG. 84 is a sectional view of the semiconductor device, taken along the cutting-plane line b-b' in FIG. 83.
Figure 85:
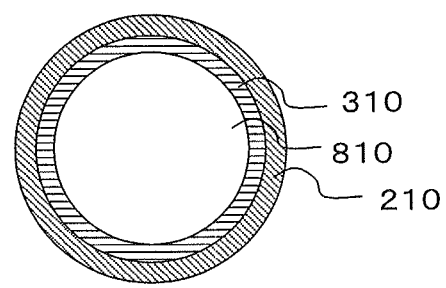
FIG. 85 is a sectional view of the semiconductor device, taken along the cutting-plane line c-c' in FIG. 83.

FIG. 82 is a schematic bird's-eye view of a transistor as a semiconductor device of the present invention, wherein the third silicon pillar 830 in the embodiment is formed as a high resistance region, instead of a first-conductive type impurity region, and the first-conductive type impurity region of the second silicon pillar 820 in the embodiment is formed as a high resistance region. FIG. 83 is a schematic sectional view taken along the cutting-plane line a-a' in FIG. 82. FIG. 84 is a schematic sectional view taken along the cutting-plane line b-b' in FIG. 82, and FIG. 85 is a schematic sectional view taken along the cutting-plane line c-c' in FIG. 82.

In the fourteenth embodiment, in view of providing a higher punch-through voltage, it is desirable that a high resistance region 1020 provided in a second silicon pillar 820 has a sufficiently-large area. In other words, it is desirable that a diameter Ts and a height Ls of the high resistance region 1020 are sufficiently large.

Figure 86:
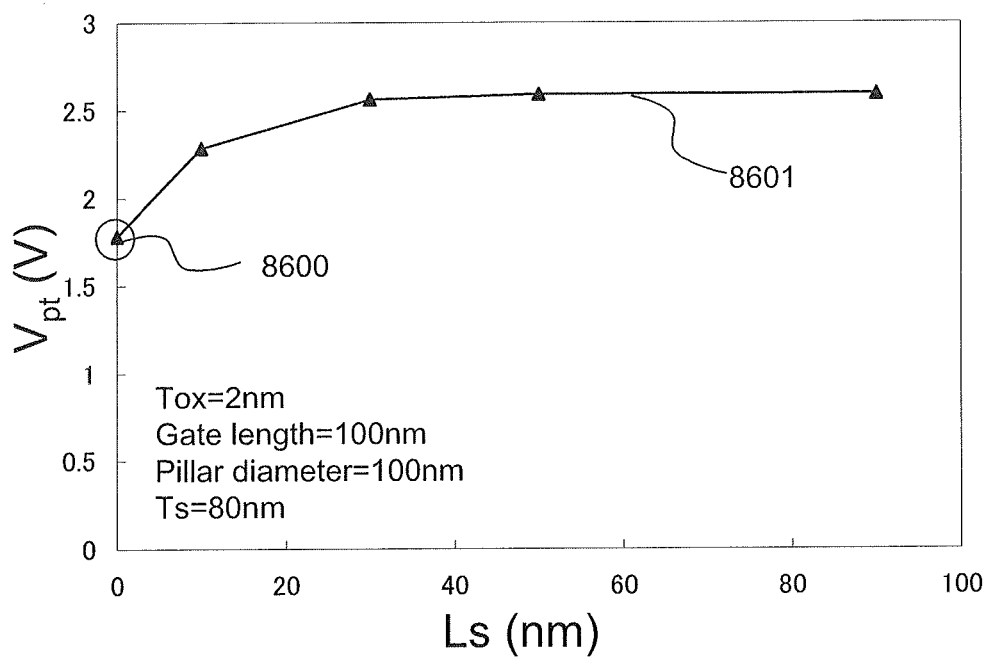
FIG. 86 is a graph showing a relationship between a punch-through voltage and Ls, Ld in the semiconductor device illustrated in FIG. 82.

Specifically, assuming a structure in which: a length of a gate 210 is 100 nm; a film thickness of a gate dielectric is 2 nm; a diameter of a first silicon pillar 810 is 100 nm; and a height of the second silicon pillar 820 is 100 nm, a simulation was performed. As a simulation result on this structure, FIG. 86 shows a structure dependence of the punch-through voltage. The vertical axis of FIG. 86 represents the punch-through voltage Vpt which is a voltage applied to a drain electrode so as to cause a drain current of 1e-7 A/um under a condition that a voltage applied to each of a gate electrode and a source electrode is zero V. The horizontal axis represents the height Ls which varies according to a change in shape of a concave source diffusion layer. As seen in FIG. 86, in the concave source diffusion layer-type SGT structure (polygonal line 8601), a higher punch-through voltage as compared with the horizontally flat source/drain diffusion layer-type SGT structure (conventional SGT structure indicated by the point 8600) is provided at any value of the height Ld other than zero, which is proven that the SGT structure has a small off-leak current.

Figure 87:
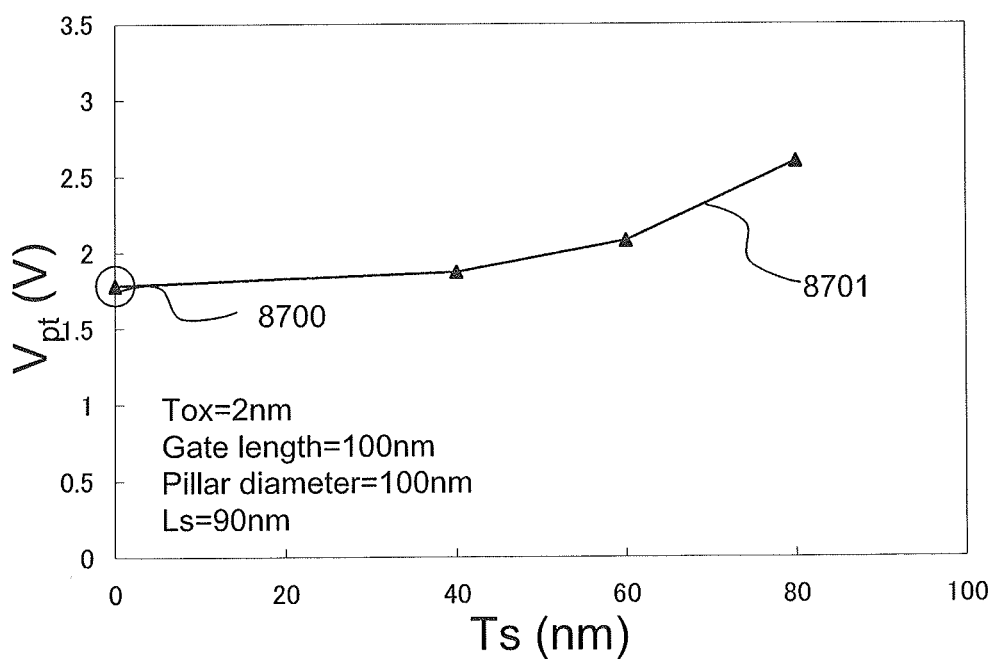
FIG. 87 is a graph showing a relationship between a punch-through voltage and a diameter Ts (Td) in the semiconductor device illustrated in FIG. 82.

FIG. 87 shows a dependence of the punch-through voltage on the diameter Ts which varies according to a change in shape of the concave source diffusion layer. As seen in FIG. 87, in the concave source diffusion layer-type SGT structure (polygonal line 8701), a higher punch-through voltage as compared with the horizontally flat source/drain diffusion layer-type SGT structure (conventional SGT structure indicated by the point 8700) is also provided at any value of the diameter Ts other than zero, which is proven that the SGT structure has a small off-leak current.

In the fourteenth embodiment, as with the thirteenth embodiment, it is desirable to satisfy the following relation (14-1) to provide a higher punch-through voltage:

$$Ls > \frac{Ts}{4} \qquad (14\text{-}1)$$

Further, in the fourteenth embodiment, it is necessary to satisfy the following relation (14-2), as with the third embodiment, to prevent a silicon pillar of a MOSFET adjacent to a target MOSFET from disturbing ion implantation into the target MOSFET:

$$\tan\left(\frac{\pi}{36}\right) \cdot Tspace - Ljs > Ls \qquad (14\text{-}2)$$

(Fifteenth Embodiment) Semiconductor Device

Figure 88:
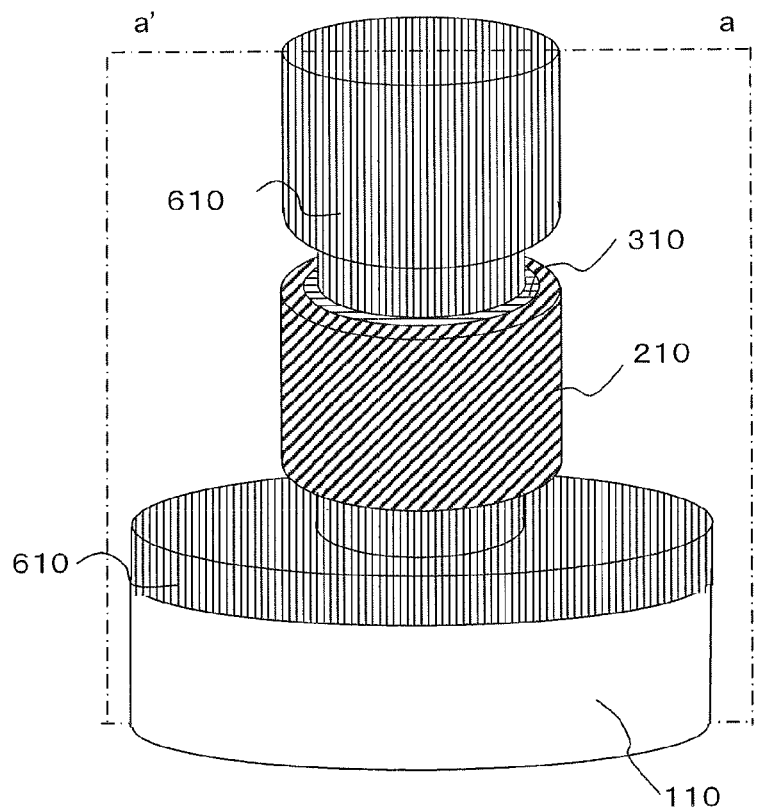
FIG. 88 is a bird's-eye view showing a semiconductor device according to a fifteenth embodiment of the present invention.
Figure 89:
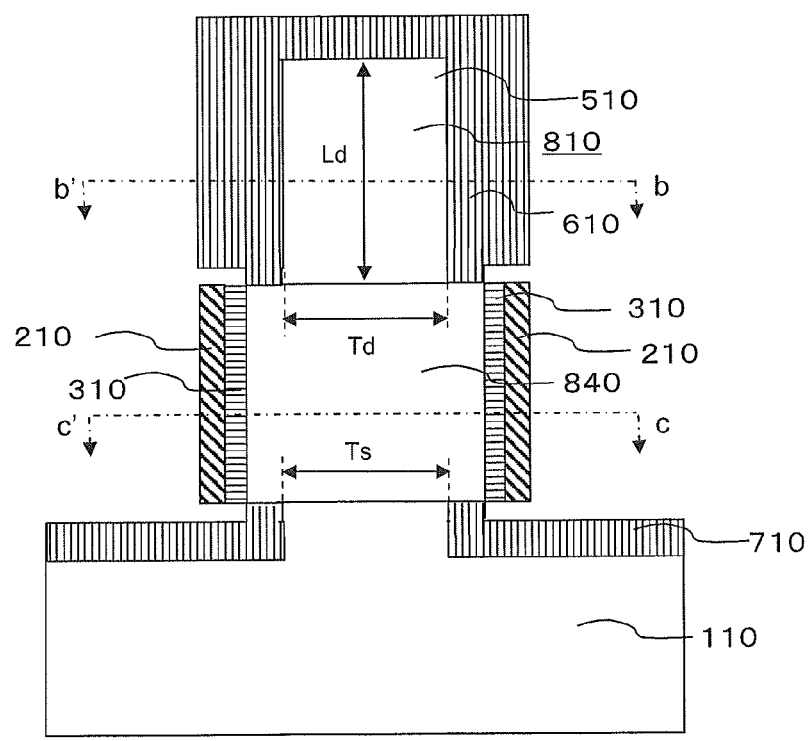
FIG. 89 is a sectional view of the semiconductor device, taken along the cutting-plane line a-a' in FIG. 88.
Figure 90:
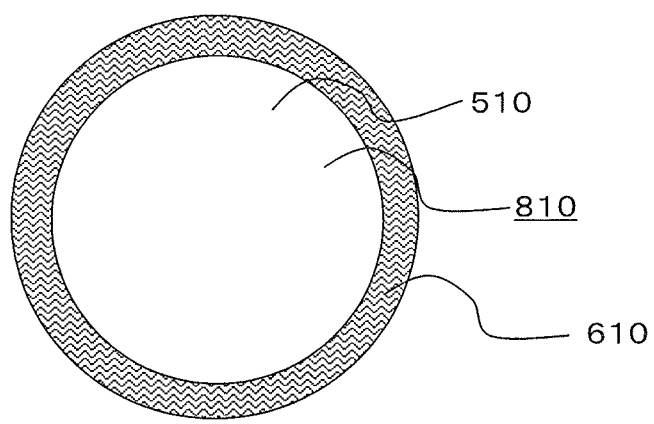
FIG. 90 is a sectional view of the semiconductor device, taken along the cutting-plane line b-b' in FIG. 89.
Figure 91:
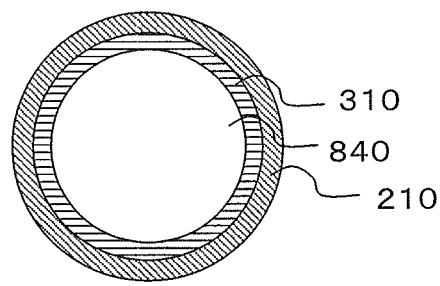
FIG. 91 is a sectional view of the semiconductor device, taken along the cutting-plane line c-c' in FIG. 89.

FIG. 88 is a schematic bird's-eye view of a transistor as a semiconductor device of the present invention. FIG. 89 is a schematic sectional view taken along the cutting-plane line a-a' in FIG. 88. FIG. 90 is a schematic sectional view taken along the cutting-plane line b-b' in FIG. 89, and FIG. 91 is a schematic sectional view taken along the cutting-plane line c-c' in FIG. 89. The semiconductor device according to the fifteenth embodiment comprises a first-conductive type fourth silicon pillar 840 formed on a first-conductive type silicon substrate 100, a first dielectric 310 surrounding the fourth silicon pillar 810, a gate 210 surrounding the dielectric 310, and a first silicon pillar 810 provided on a top of the fourth silicon pillar 840, wherein: the silicon substrate 100 has a second-conductive type high-concentration impurity region 710 formed in a part thereof; and the first silicon layer 810 has a second-conductive type high-concentration impurity region 610 formed in a surface thereof except at least a part of a contact surface region with the fourth silicon pillar, and a first-conductive type impurity region 520 formed therein and surrounded by the second-conductive type high-concentration impurity region 610.

In the fifteenth embodiment, in view of providing a higher punch-through voltage, it is desirable that the first-conductive type impurity region 510 of the first silicon pillar 810 has a sufficiently-large area. In other words, it is desirable that a diameter Ts and a height Td of the first-conductive type impurity region 510 are sufficiently large.

Figure 92:
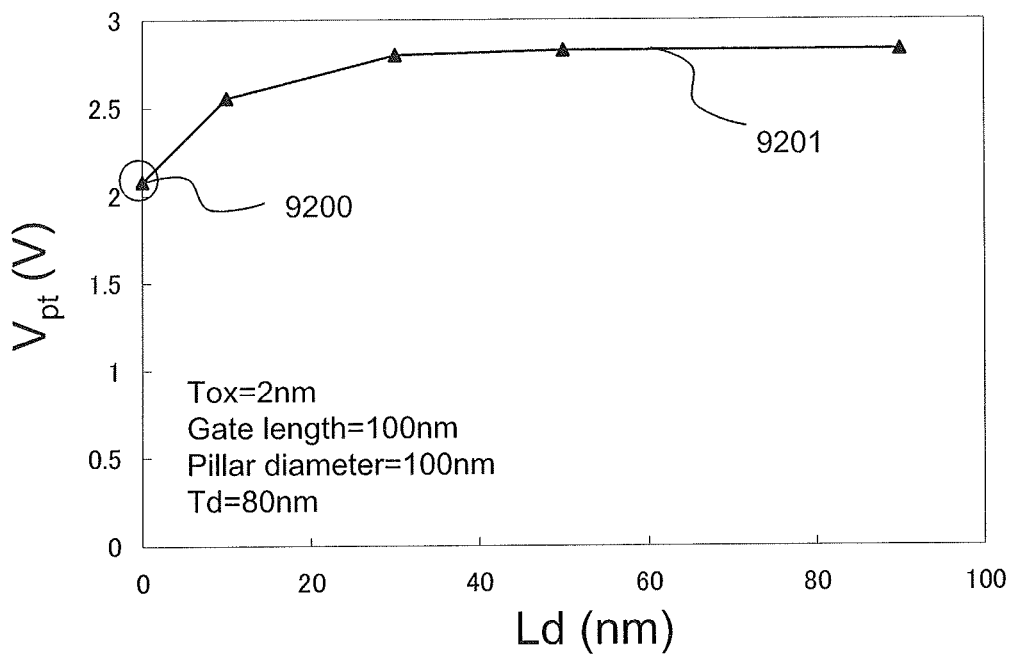
FIG. 92 is a graph showing a relationship between a punch-through voltage and Ls, Ld in the semiconductor device illustrated in FIG. 88.

Specifically, assuming a structure in which: a length of the gate 210 is 100 nm; a film thickness of the gate dielectric is 2 nm; and a diameter of the fourth silicon pillar 840 is 100 nm; a height of the first silicon pillar 810 is 100 nm, a simulation was performed. As a simulation result on this structure, FIG. 92 shows a structure dependence of the punch-through voltage. The vertical axis of FIG. 92 represents the punch-through voltage Vpt which is a voltage applied to a drain electrode so as to cause a drain current of 1e-7 A/um under a condition that a voltage applied to each of a gate electrode and a source electrode is zero V. The horizontal axis represents the height Ls which varies according to a change in shape of the concave source diffusion layer. As seen in FIG. 92, in the concave source and drain diffusion layer-type SGT structures (polygonal line 9201), a higher punch-through voltage as compared with the horizontally flat source/drain diffusion layer-type SGT structure (conventional SGT structure indicated by the point 9200) is provided at any value of the height Ld other than zero, which is proven that the SGT structure has a small off-leak current.

Figure 93:
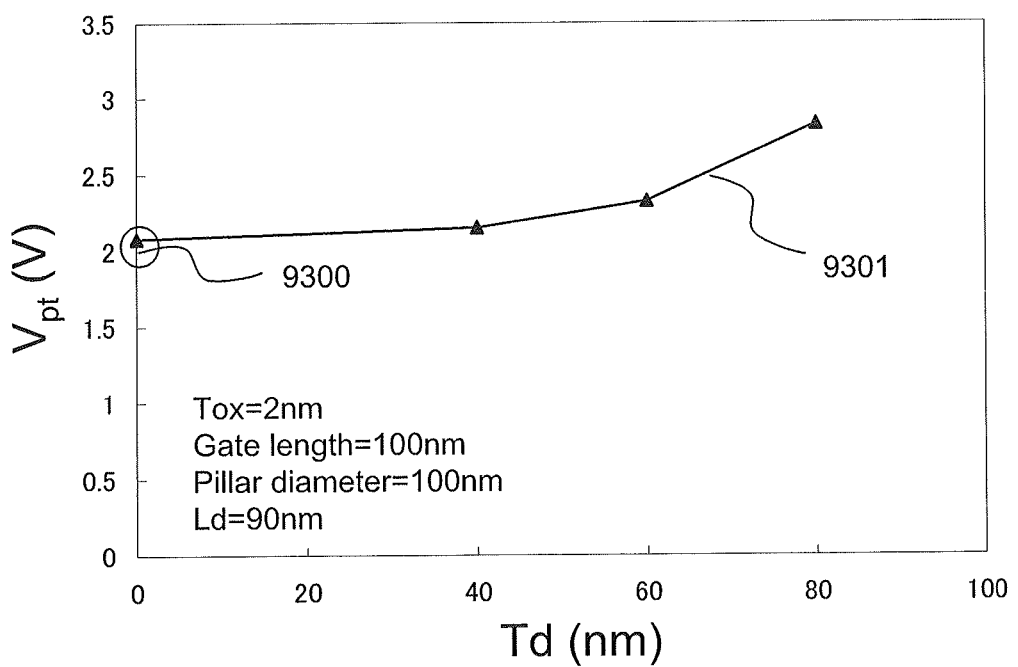
FIG. 93 is a graph showing a relationship between a punch-through voltage and a diameter Ts (Td) in the semiconductor device illustrated in FIG. 88.

FIG. 93 shows a dependence of the punch-through voltage on the diameters Ts which varies according to a change in shape of the concave source diffusion layer. As seen in FIG. 93, in the concave source and drain diffusion layer-type SGT structures (polygonal line 9301), a higher punch-through voltage as compared with the horizontally flat source/drain diffusion layer-type SGT structure (conventional SGT structure indicated by the point 9300) is provided at any value of the diameter Ts other than zero, which is proven that the SGT structure has a small off-leak current.

In the fifteenth embodiment, it is desirable that the height Ls is greater than a depth Ts/4 of a depletion layer to suppress the punch-through effect, as with the first embodiment. In other words, it is desirable to satisfy the following relation (15-1):

$$Ld > \frac{Td}{4} \quad (15\text{-}1)$$

Figure 94:
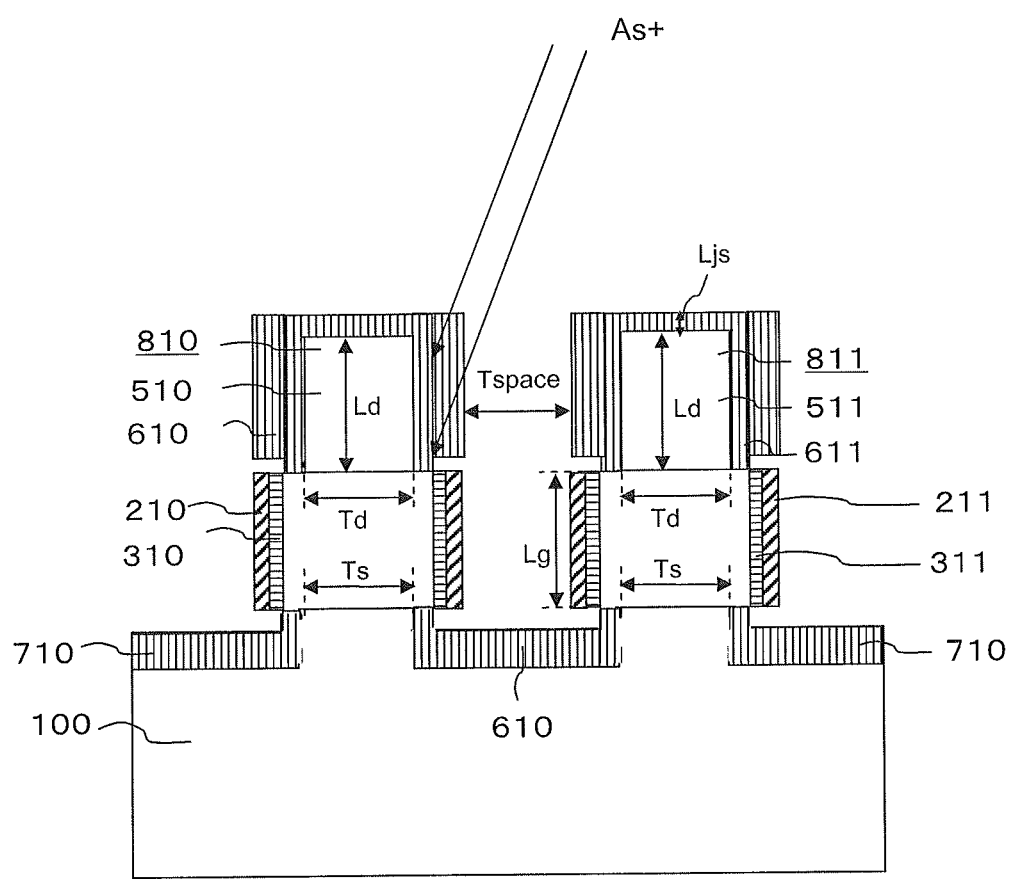
FIG. 94 is a diagram showing a process for performing ion implantation at an oblique angle to form a concave diffusion layer of the semiconductor device illustrated in FIG. 88.

Further, in a process for making the concave diffusion layer-type SGT structure illustrated in FIG. 88, it is necessary to perform ion implantation at an oblique angle as shown in FIG. 94 so as to form the concave diffusion layer. During the ion implantation, for example, when As$^+$ is implanted into an NMOSFET, a silicon pillar of an NMOSFET adjacent to the target NMOSFET is likely to disturb the ion implantation. Thus, it is essential to satisfy the following relation (15-2):

$$\tan\left(\frac{\pi}{36}\right) > \frac{Ld + Ljd}{Tspace}, \quad (15\text{-}2)$$

wherein: Ld is a height of the first-conductive type impurity region 510;

Ljd is a depth of the second-conductive type high-concentration impurity region 610; and Tspace is a distance between silicon pillars of adjacent two SGTs;

Thus, based on the relation (15-2), Ls is required to satisfy the following relation (15-3):

$$\tan\left(\frac{\pi}{36}\right) \cdot Tspace - Ljd > Ld \quad (15\text{-}3)$$

(Sixteenth Embodiment) Semiconductor Device

Figure 95:
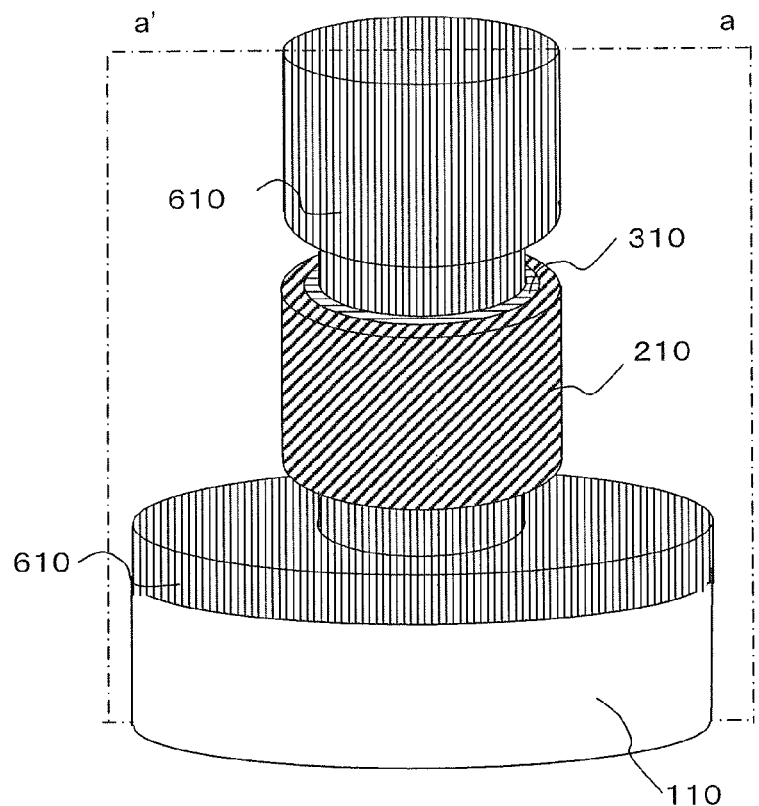
FIG. 95 is a bird's-eye view showing a semiconductor device according to a sixteenth embodiment of the present invention.
Figure 96:
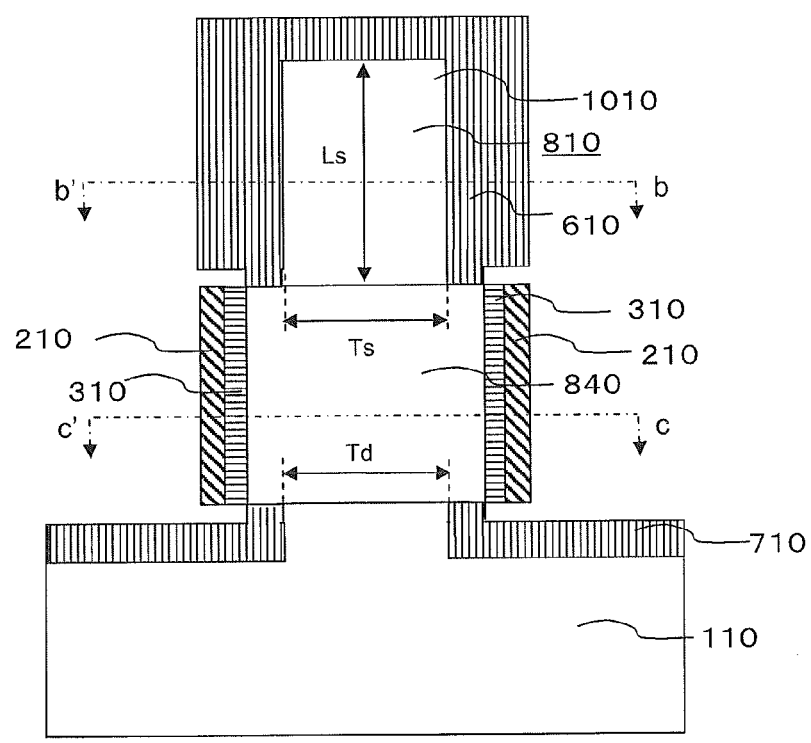
FIG. 96 is a sectional view of the semiconductor device, taken along the cutting-plane line a-a' in FIG. 95.
Figure 97:
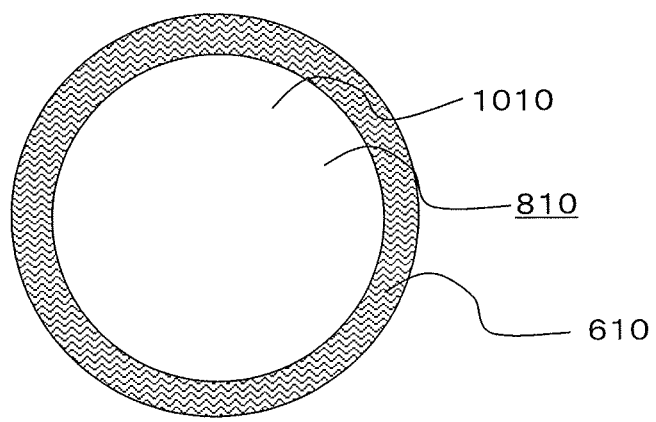
FIG. 97 is a sectional view of the semiconductor device, taken along the cutting-plane line b-b' in FIG. 96.
Figure 98:
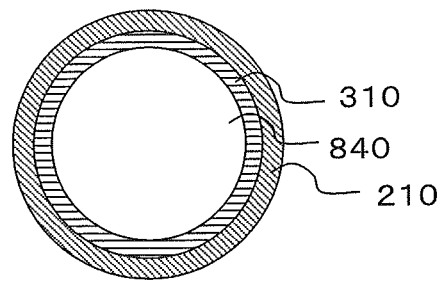
FIG. 98 is a sectional view of the semiconductor device, taken along the cutting-plane line c-c' in FIG. 96.

FIG. 95 is a schematic bird's-eye view of a transistor as a semiconductor device of the present invention, wherein the third silicon pillar 830 in the embodiment is formed as a high resistance region, instead of a first-conductive type impurity region, and the first-conductive type impurity region of the second silicon pillar 820 in the embodiment is formed as a high resistance region. FIG. 96 is a schematic sectional view taken along the cutting-plane line a-a' in FIG. 95. FIG. 97 is a schematic sectional view taken along the cutting-plane line b-b' in FIG. 96, and FIG. 98 is a schematic sectional view taken along the cutting-plane line c-c' in FIG. 96.

In the sixteenth embodiment, in view of providing a higher punch-through voltage, it is desirable that a high resistance region 1010 provided in a first silicon pillar 810 has a sufficiently-large area. In other words, it is desirable that a diameter Ts and a height Ls of the high resistance region 1010 are sufficiently large.

Figure 99:
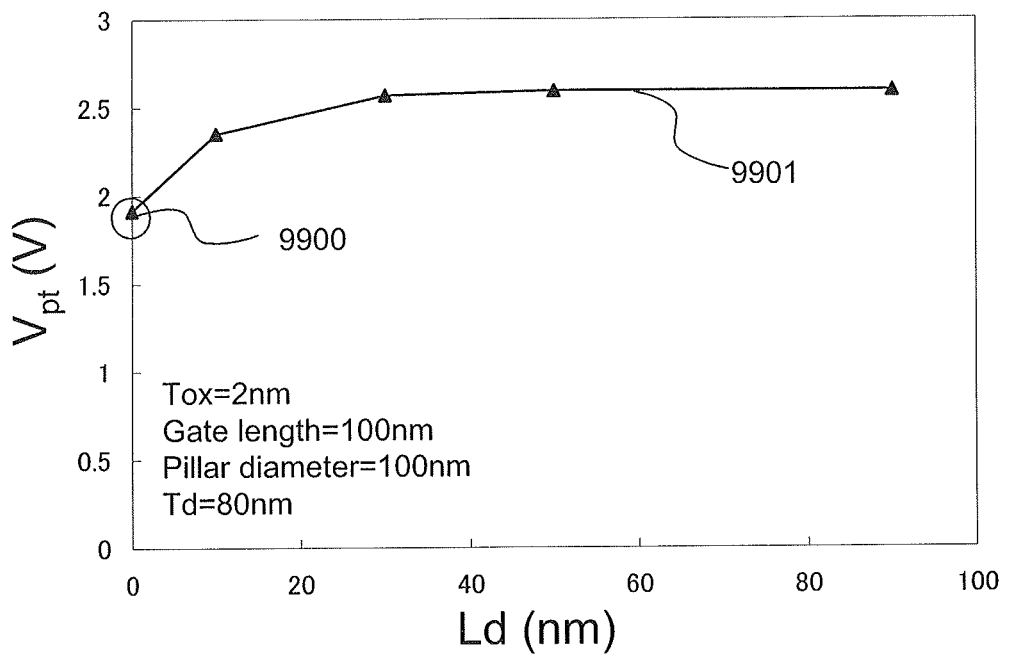
FIG. 99 is a graph showing a relationship between a punch-through voltage and Ls, Ld in the semiconductor device illustrated in FIG. 95.

Specifically, assuming a structure in which: a length of a gate 210 is 100 nm; a film thickness of a gate dielectric is 2 nm; a diameter of a fourth silicon pillar 840 is 100 nm; and a height of the first silicon pillar 810 is 100 nm, a simulation was performed. As a simulation result on this structure, FIG. 99 shows a structure dependence of the punch-through voltage. The vertical axis of FIG. 99 represents the punch-through voltage Vpt which is a voltage applied to a drain electrode so as to cause a drain current of 1e-7 A/um under a condition that a voltage applied to each of a gate electrode and a source electrode is zero V. The horizontal axis represents the height Ld which varies according to a change in shape of a concave source diffusion layer. As seen in FIG. 99, in the concave source diffusion layer-type SGT structure (polygonal line 9901), a higher punch-through voltage as compared with the horizontally flat source/drain diffusion layer-type SGT structure (conventional SGT structure indicated by the point 9900) is provided at any value of the height Ld other than zero, which is proven that the SGT structure has a small off-leak current.

Figure 100:
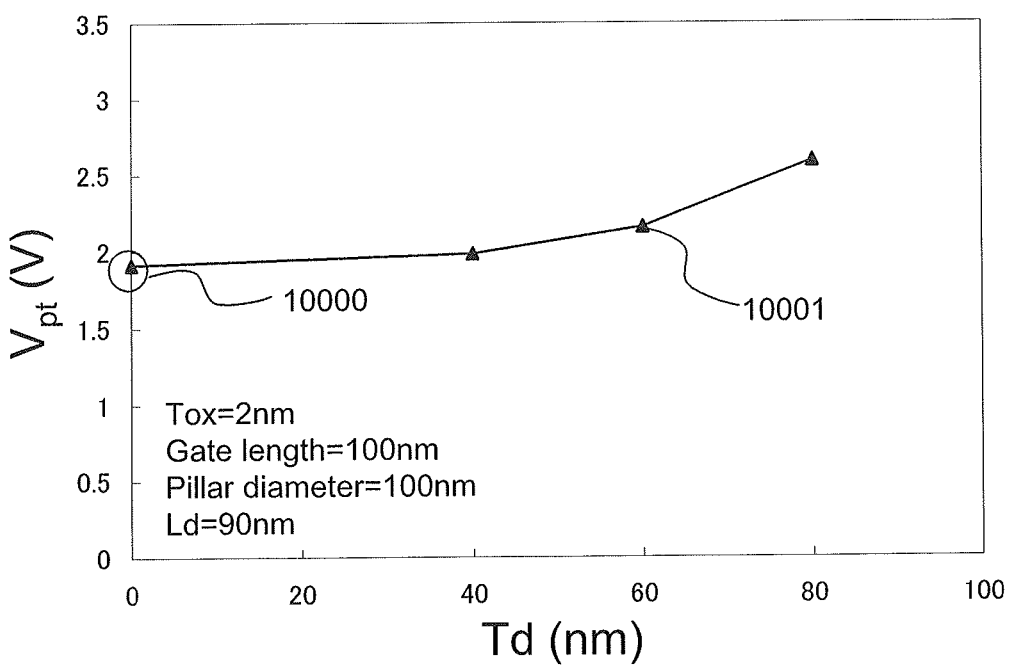
FIG. 100 is a graph showing a relationship between a punch-through voltage and a diameter Ts (Td) in the semiconductor device illustrated in FIG. 95.

FIG. 100 shows a dependence of the punch-through voltage on the diameter Td which varies according to a change in shape of the concave drain diffusion layer. As seen in FIG. 100, in the concave drain diffusion layer-type SGT structure (polygonal line 10001), a higher punch-through voltage as compared with the horizontally flat source/drain diffusion layer-type SGT structure (conventional SGT structure indicated by the point 10000) is also provided at any value of the diameter Ts other than zero, which is proven that the SGT structure has a small off-leak current.

In the sixteenth embodiment, as with the fifteenth embodiment, it is desirable to satisfy the following relation (16-1) to provide a higher punch-through voltage:

$$Ld > \frac{Td}{4} \quad (16\text{-}1)$$

Further, in the sixteenth embodiment, it is necessary to satisfy the following relation (16-2), as with the third embodiment, to prevent a silicon pillar of a MOSFET adjacent to a target MOSFET from disturbing ion implantation into the target MOSFET:

$$\tan\left(\frac{\pi}{36}\right) \cdot Tspace - Ljd > Ld \quad (16\text{-}2)$$

(Seventeenth Embodiment) Semiconductor Device

Figure 101:
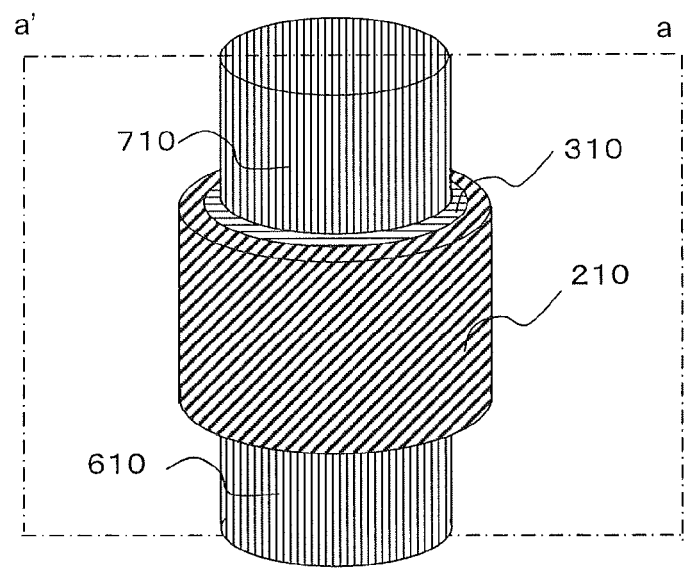
FIG. 101 is a bird's-eye view showing a semiconductor device according to a seventeenth embodiment of the present invention.
Figure 102:
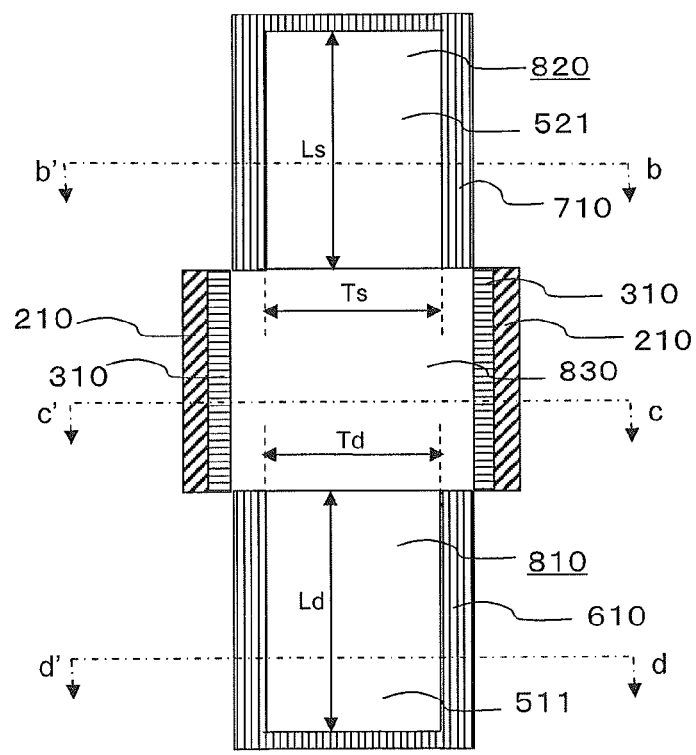
FIG. 102 is a sectional view of the semiconductor device, taken along the cutting-plane line a-a' in FIG. 101.

FIG. 101 is a schematic bird's-eye view of a transistor as a semiconductor device of the present invention, wherein the first-conductive type impurity region of the first silicon layer 810 in the first embodiment is formed as a second-conductive type impurity region 511 including a region having an impurity concentration of 1E18 (cm$^{-3}$) or less, and the first-conductive type impurity region of the second silicon layer 820 in the first embodiment is formed as a second-conductive type impurity region 521 including a region having an impurity concentration of 1E18 (cm$^{-3}$) or less. FIG. 102 is a schematic sectional view taken along the cutting-plane line a-a' in FIG.

Figure 103:
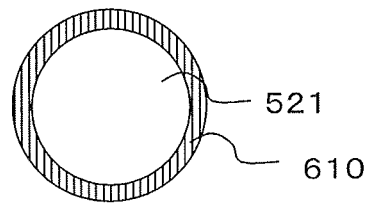
FIG. 103 is a sectional view of the semiconductor device, taken along the cutting-plane line b-b' in FIG. 102.
Figure 104:
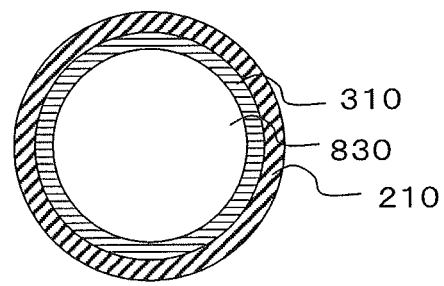
FIG. 104 is a sectional view of the semiconductor device, taken along the cutting-plane line c-c' in FIG. 102.
Figure 105:
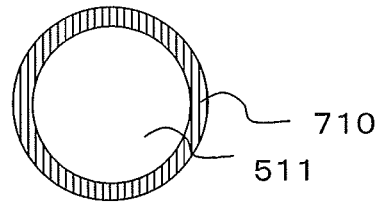
FIG. 105 is a sectional view of the semiconductor device, taken along the cutting-plane line d-d' in FIG. 102.

101, and FIG. 103 is a schematic sectional view taken along the cutting-plane line b-b' in FIG. 102. FIG. 104 is a schematic sectional view taken along the cutting-plane line c-c' in FIG. 102, and FIG. 105 is a schematic sectional view taken along the cutting-plane line d-d' in FIG. 102.

In the seventeenth embodiment, in view of providing a higher punch-through voltage, it is desirable that each of the second-conductive type low-concentration impurity region 511 of the first silicon pillar 810 including a region with an impurity concentration of 1E18 ($cm^{-3}$) or less, and the second-conductive type low-concentration impurity region 521 of the second silicon pillar 820 including a region with an impurity concentration of 1E18 ($cm^{-3}$) or less, has a sufficiently-large area. In other words, it is desirable that a diameter Td and a height Ld of the second-conductive type impurity region 511, and a diameter Ts and a height Ls of the second-conductive type impurity region 521, are sufficiently large.

In the seventeenth embodiment, as with the first embodiment, it is desirable to satisfy the following relations (17-1) and (17-2) to provide a higher punch-through voltage:

$$Ls > \frac{Ts}{4} \qquad (17\text{-}1)$$

$$Ld > \frac{Td}{4} \qquad (17\text{-}2)$$

Further, in the seventeenth embodiment, it is necessary to satisfy the following relation (17-3), as with the first embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ls + Ld \qquad (17\text{-}3)$$

(Eighteenth Embodiment) Semiconductor Device

Figure 106:
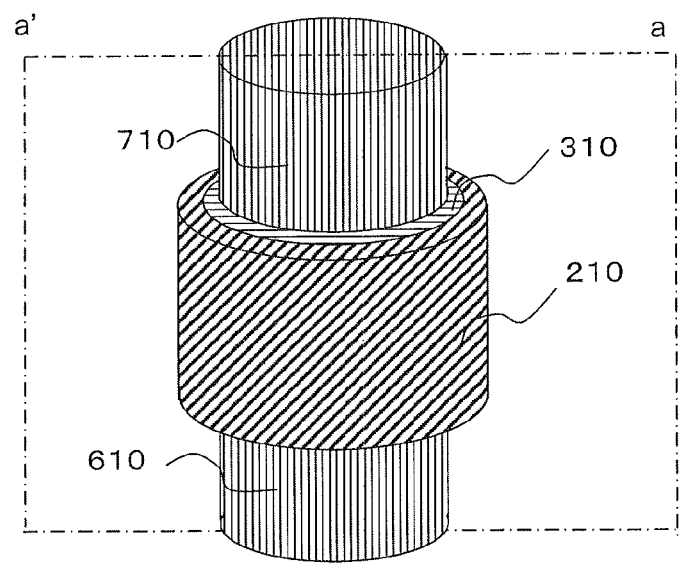
FIG. 106 is a bird's-eye view showing a semiconductor device according to an eighteenth embodiment of the present invention.
Figure 107:
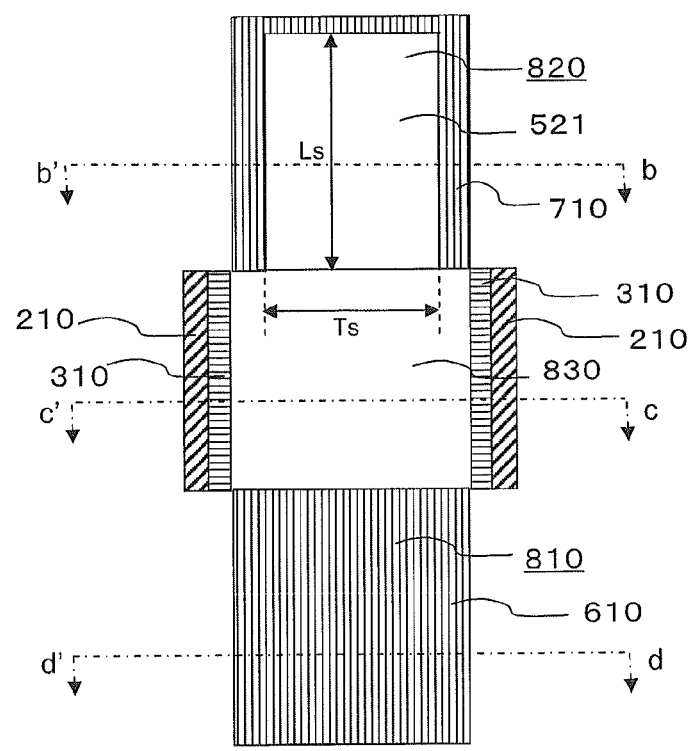
FIG. 107 is a sectional view of the semiconductor device, taken along the cutting-plane line a-a' in FIG. 106.
Figure 108:
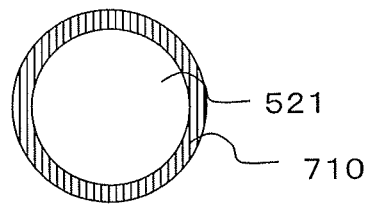
FIG. 108 is a sectional view of the semiconductor device, taken along the cutting-plane line b-b' in FIG. 107.
Figure 109:
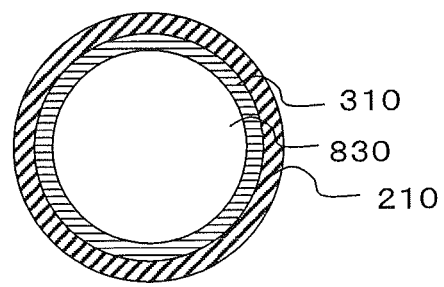
FIG. 109 is a sectional view of the semiconductor device, taken along the cutting-plane line c-c' in FIG. 107.
Figure 110:
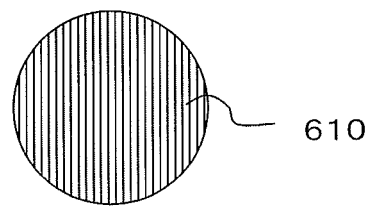
FIG. 110 is a sectional view of the semiconductor device, taken along the cutting-plane line d-d' in FIG. 107.

FIG. 106 is a schematic bird's-eye view of a transistor as a semiconductor device of the present invention, wherein the first-conductive type impurity region of the second silicon layer 820 in the second embodiment is formed as a second-conductive type impurity region 521 including a region having an impurity concentration of 1E18 ($cm^{-3}$) or less. FIG. 107 is a schematic sectional view taken along the cutting-plane line a-a' in FIG. 106, and FIG. 108 is a schematic sectional view taken along the cutting-plane line b-b' in FIG. 107. FIG. 109 is a schematic sectional view taken along the cutting-plane line c-c' in FIG. 107, and FIG. 110 is a schematic sectional view taken along the cutting-plane line d-d' in FIG. 107.

In the eighteenth embodiment, in view of providing a higher punch-through voltage, it is desirable that the second-conductive type low-concentration impurity region 521 of the second silicon pillar 820 including a region with an impurity concentration of 1E18 ($cm^{-3}$) or less has a sufficiently-large area. In other words, it is desirable that a diameter Ts and a height Ls are sufficiently large.

In the eighteenth embodiment, as with the second embodiment, it is desirable to satisfy the following relation (18-1) to provide a higher punch-through voltage:

$$Ls > \frac{Ts}{4} \qquad (18\text{-}1)$$

Further, in the eighteenth embodiment, it is necessary to satisfy the following relation (18-2), as with the second embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ls \qquad (18\text{-}2)$$

(Nineteenth Embodiment) Semiconductor Device

Figure 111:
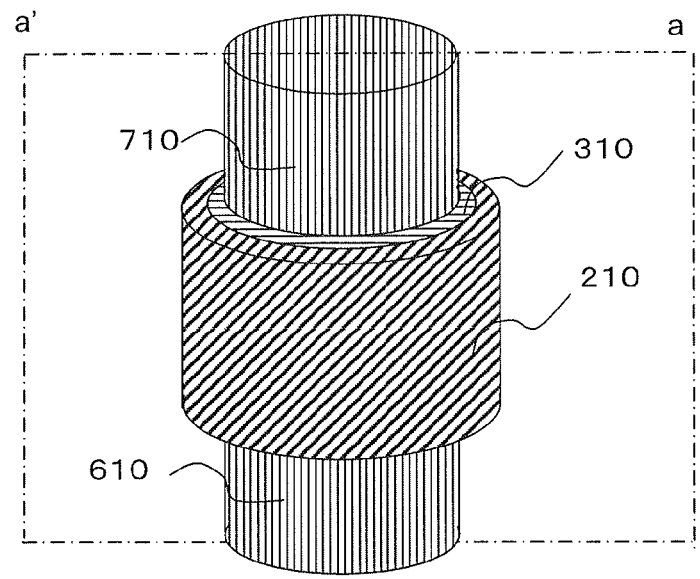
FIG. 111 is a bird's-eye view showing a semiconductor device according to a nineteenth embodiment of the present invention.
Figure 112:
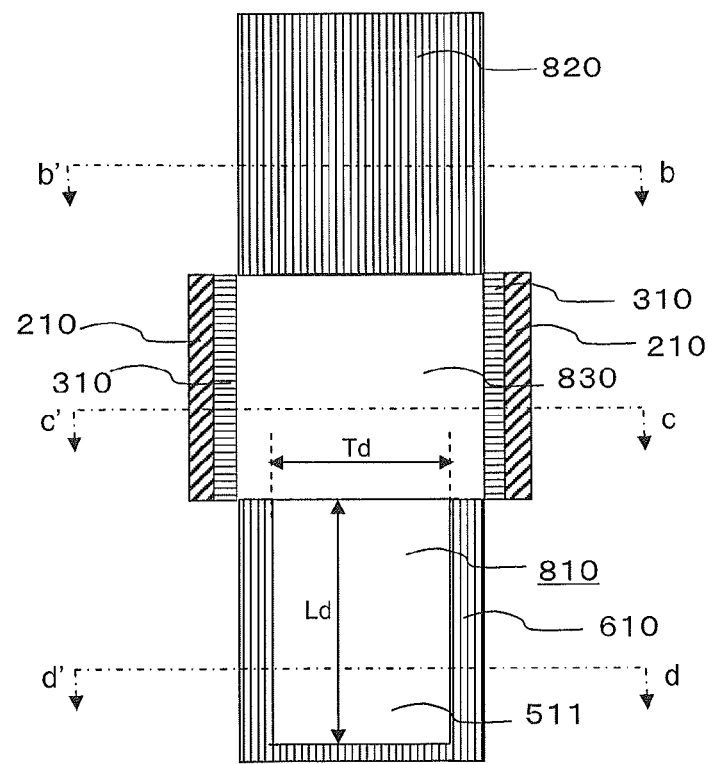
FIG. 112 is a sectional view of the semiconductor device, taken along the cutting-plane line a-a' in FIG. 111.
Figure 113:
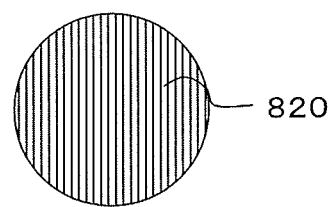
FIG. 113 is a sectional view of the semiconductor device, taken along the cutting-plane line b-b' in FIG. 112.
Figure 114:
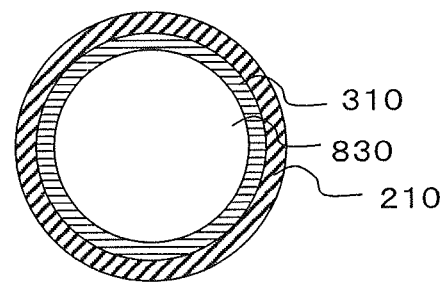
FIG. 114 is a sectional view of the semiconductor device, taken along the cutting-plane line c-c' in FIG. 112.
Figure 115:
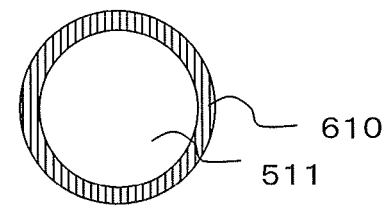
FIG. 115 is a sectional view of the semiconductor device, taken along the cutting-plane line d-d' in FIG. 112.

FIG. 111 is a schematic bird's-eye view of a transistor as a semiconductor device of the present invention, wherein the first-conductive type impurity region of the silicon layer 810 in the third embodiment is formed as a second-conductive type impurity region 511 including a region having an impurity concentration of 1E18 ($cm^{-3}$) or less. FIG. 112 is a schematic sectional view taken along the cutting-plane line a-a' in FIG. 111, and FIG. 113 is a schematic sectional view taken along the cutting-plane line b-b' in FIG. 112. FIG. 114 is a schematic sectional view taken along the cutting-plane line c-c' in FIG. 112, and FIG. 114 is a schematic sectional view taken along the cutting-plane line d-d' in FIG. 112.

The semiconductor device according to the nineteenth embodiment comprises a first-conductive type third silicon pillar 830, a first dielectric 310 surrounding a side surface of the third silicon pillar 830, a gate 210 surrounding the dielectric 310, a first silicon layer 810 provided underneath the third silicon pillar 830, and a second silicon pillar 820 provided on a top of the third silicon pillar 830, wherein: the first silicon pillar 810 has a second-conductive type high-concentration impurity region 610, and a second-conductive type low-concentration impurity region 511 formed therein to have an impurity concentration of 1E18 ($cm^{-3}$) or less and surrounded by the second-conductive type high-concentration impurity region 610; and the second silicon pillar 820 is formed as a second-conductive type high-concentration impurity region 710.

In the nineteenth embodiment, in view of providing a higher punch-through voltage, it is desirable that the first-conductive type impurity region 511 of the first silicon pillar 810 has a sufficiently-large area. In other words, it is desirable that a diameter Ts and a height Ls are sufficiently large.

$$Ld > \frac{Td}{4} \qquad (19\text{-}1)$$

Further, in the nineteenth embodiment, it is necessary to satisfy the following relation (19-2), as with the third embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ld \qquad (19\text{-}2)$$

(Twentieth Embodiment) Semiconductor Device

Figure 116:
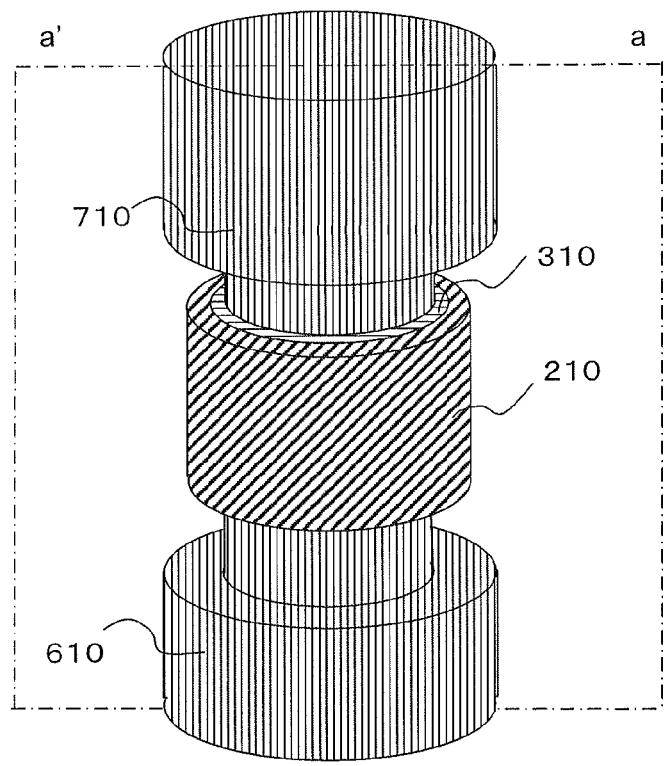
FIG. 116 is a bird's-eye view showing a semiconductor device according to a twentieth embodiment of the present invention.
Figure 117:
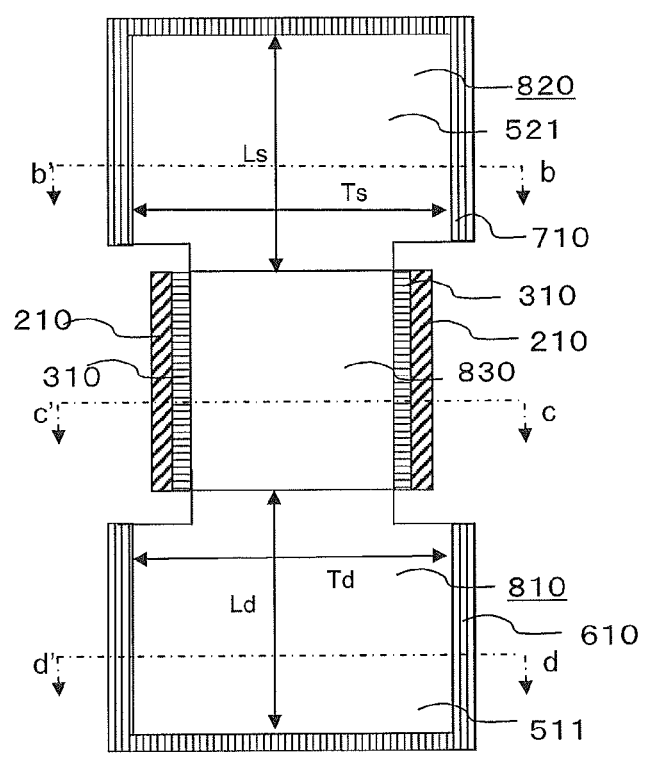
FIG. 117 is a sectional view of the semiconductor device, taken along the cutting-plane line a-a' in FIG. 116.
Figure 118:
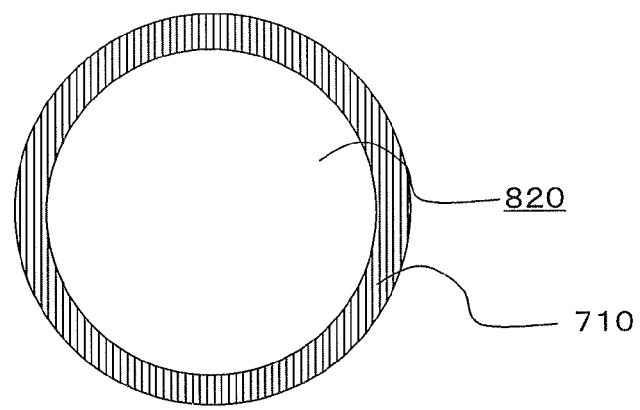
FIG. 118 is a sectional view of the semiconductor device, taken along the cutting-plane line b-b' in FIG. 117.
Figure 119:
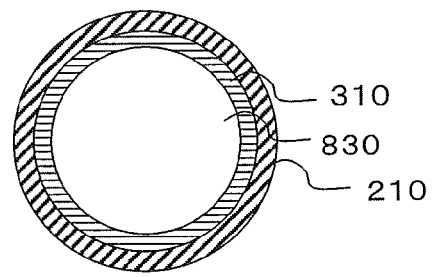
FIG. 119 is a sectional view of the semiconductor device, taken along the cutting-plane line c-c' in FIG. 117.
Figure 120:
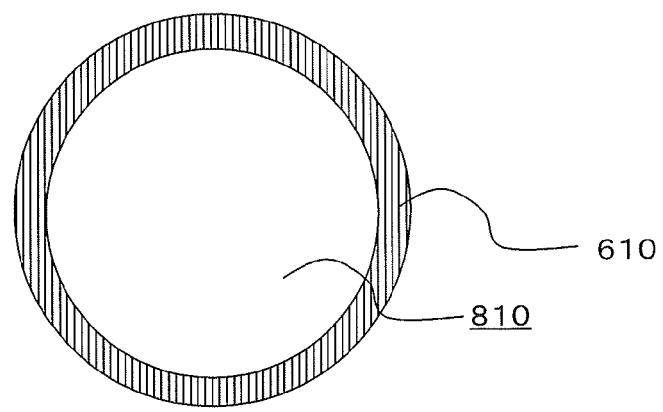

FIG. 116 is a schematic bird's-eye view of a transistor as a semiconductor device of the present invention, wherein the first-conductive type impurity region of the first silicon layer 810 in the seventh embodiment is formed as a second-conductive type impurity region 511 including a region having an impurity concentration of 1E18 (cm$^{-3}$) or less, and the first-conductive type impurity region of the silicon layer 820 in the seventh embodiment is formed as a second-conductive type impurity region 521. FIG. 117 is a schematic sectional view taken along the cutting-plane line a-a' in FIG. 116, and FIG. 118 is a schematic sectional view taken along the cutting-plane line b-b' in FIG. 117. FIG. 118 is a schematic sectional view taken along the cutting-plane line c-c' in FIG. 117, and FIG. 119 is a schematic sectional view taken along the cutting-plane line d-d' in FIG. 117.

In the semiconductor device according to the twentieth embodiment, in view of providing a higher punch-through voltage, it is desirable that each of the second-conductive type low-concentration impurity region 511 of the first silicon pillar 810 including a region with an impurity concentration of 1E18 (cm$^{-3}$) or less, and the second-conductive type low-concentration impurity region 521 of the second silicon pillar 820 including a region with an impurity concentration of 1E18 (cm$^{-3}$) or less, has a sufficiently-large area. In other words, it is desirable that a diameter Td and a height Ld of the second-conductive type impurity region 511, and a diameter Ts and a height Ls of the second-conductive type impurity region 521, are sufficiently large.

In the twentieth embodiment, as with the first embodiment, it is desirable to satisfy the following relations (20-1) and (20-2) to provide a higher punch-through voltage:

$$Ls > \frac{Ts}{4} \qquad (20\text{-}1)$$

$$Ld > \frac{Td}{4} \qquad (20\text{-}2)$$

Further, in the twentieth embodiment, it is necessary to satisfy the following relation (20-3), as with the first embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ls + Ld \qquad (20\text{-}3)$$

(Twenty-First Embodiment) Semiconductor Device

Figure 121:
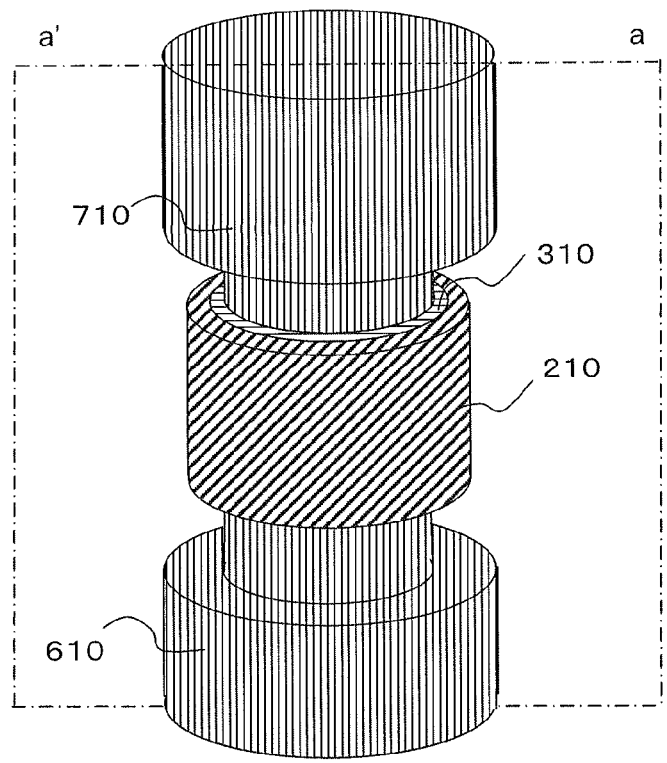
Figure 122:
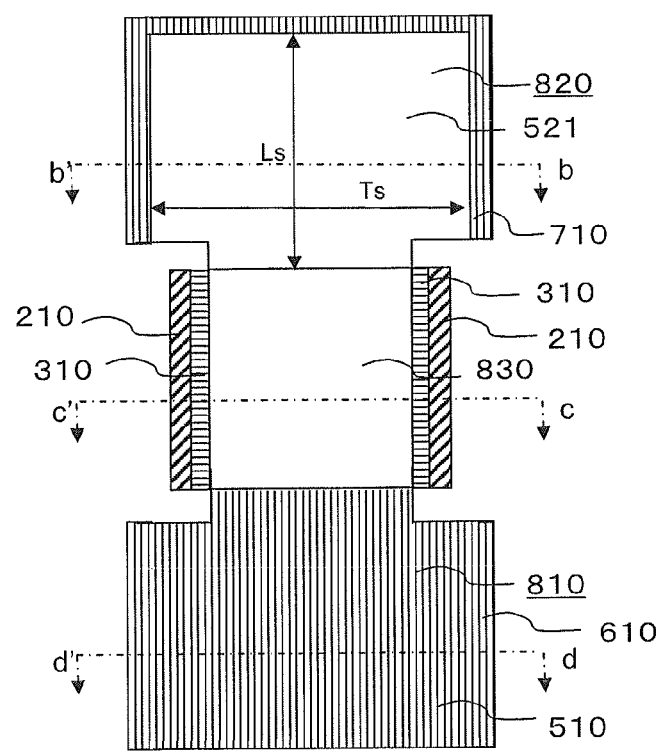

FIG. 121 is a schematic bird's-eye view of a transistor as a semiconductor device of the present invention, wherein the first-conductive type impurity region of the silicon layer 820 in the eighth embodiment is formed as a second-conductive type impurity region 521 including a region having an impurity concentration of 1E18 (cm$^{-3}$) or less. FIG. 122 is a schematic sectional view taken along the cutting-plane line a-a' in FIG. 121, and FIG. 123 is a schematic sectional view taken along the cutting-plane line b-b' in FIG. 122. FIG. 124 is a schematic sectional view taken along the cutting-plane line c-c' in FIG. 122, and FIG. 124 is a schematic sectional view taken along the cutting-plane line d-d' in FIG. 122.

In the twenty-first embodiment, in view of providing a higher punch-through voltage, it is desirable that the second-conductive type low-concentration impurity region 2320 of the second silicon pillar 820 has a sufficiently-large area. In other words, it is desirable that a diameter Ts and a height Ls are sufficiently large.

In the twenty-first embodiment, in view of providing a higher punch-through voltage, it is desirable that the second-conductive type low-concentration impurity region 521 of the second silicon pillar 820 including a region with an impurity concentration of 1E18 (cm$^{-3}$) or less has a sufficiently-large area. In other words, it is desirable that a diameter Ts and a height Ls of the second-conductive type impurity region 521 are sufficiently large.

In the twenty-first embodiment, as with the second embodiment, it is desirable to satisfy the following relation (21-1) to provide a higher punch-through voltage:

$$Ls > \frac{Ts}{4} \qquad (21\text{-}1)$$

Further, in the twenty-first embodiment, it is necessary to satisfy the following relation (21-2), as with the first embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ls \qquad (21\text{-}2)$$

(Twenty-Second Embodiment) Semiconductor Device

Figure 126:
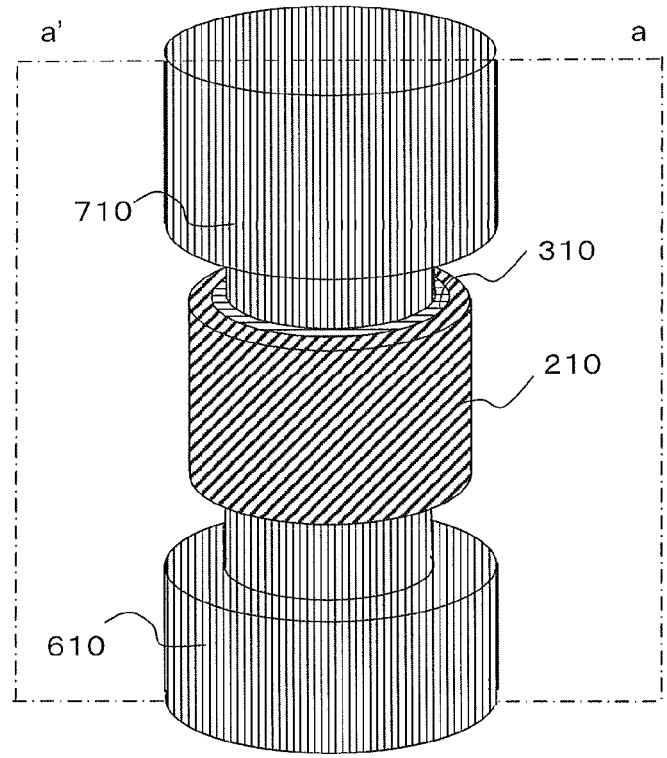
Figure 127:
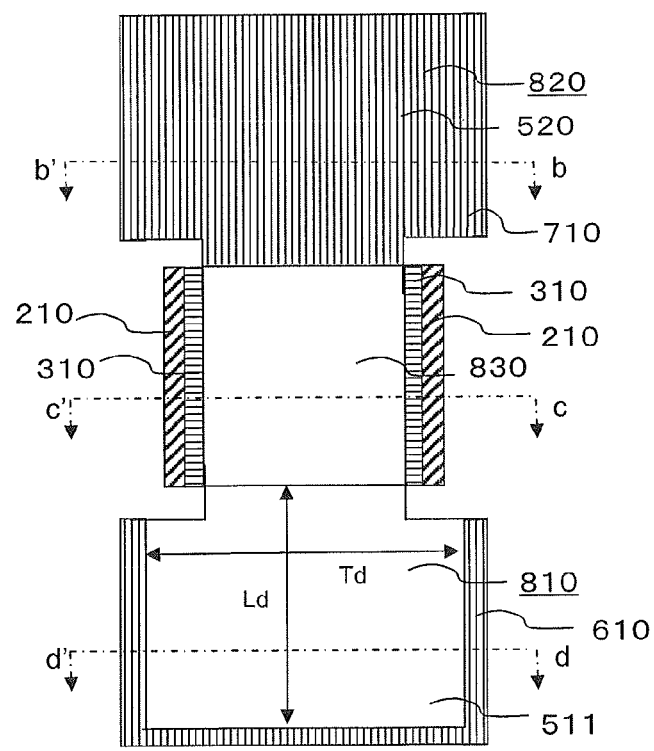
Figure 128:
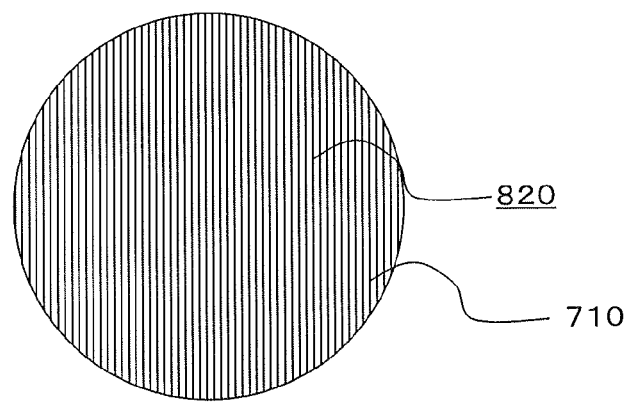
Figure 129:
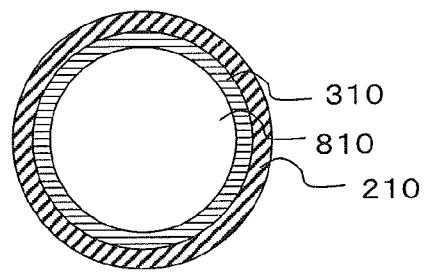
Figure 130:
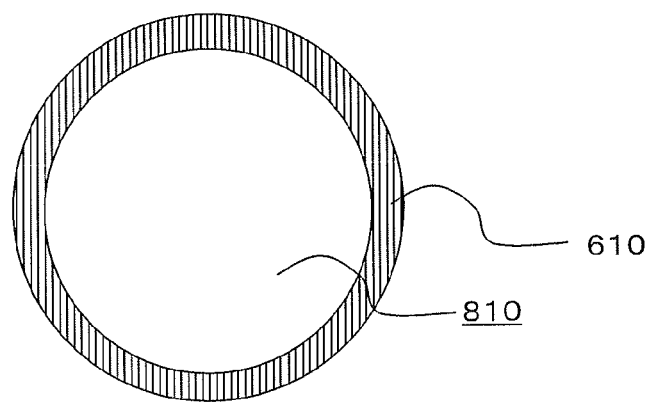

FIG. 126 is a schematic bird's-eye view of a transistor as a semiconductor device of the present invention, wherein the first-conductive type impurity region of the silicon layer 810 in the ninth embodiment is formed as a second-conductive type impurity region 511 including a region having an impurity concentration of 1E18 (cm$^{-3}$) or less. FIG. 127 is a schematic sectional view taken along the cutting-plane line a-a' in FIG. 126, and FIG. 128 is a schematic sectional view taken along the cutting-plane line b-b' in FIG. 127. FIG. 129 is a schematic sectional view taken along the cutting-plane line c-c' in FIG. 127, and FIG. 130 is a schematic sectional view taken along the cutting-plane line d-d' in FIG. 127.

In the twenty-second embodiment, in view of providing a higher punch-through voltage, it is desirable that the second-conductive type low-concentration impurity region 511 of the first silicon pillar 810 including a region with an impurity concentration of 1E18 (cm$^{-3}$) or less has a sufficiently-large area. In other words, it is desirable that a diameter Ts and a height Ls of the second-conductive type impurity region 511 are sufficiently large.

In the twenty-second embodiment, as with the third embodiment, it is desirable to satisfy the following relation (22-1) to provide a higher punch-through voltage:

$$Ld > \frac{Td}{4} \qquad (22\text{-}1)$$

Further, in the twenty-second embodiment, it is necessary to satisfy the following relation (22-2), as with the third embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ld \qquad (22\text{-}2)$$

(Twenty-Third Embodiment) Semiconductor Device

FIG. 131 is a schematic bird's-eye view of a transistor as a semiconductor device of the present invention, wherein the first-conductive type impurity region of the second silicon layer 820 in the fifteenth embodiment is formed as a second-conductive type impurity region 521 including a region having an impurity concentration of 1E18 (cm$^{-3}$) or less. FIG. 132 is a schematic sectional view taken along the cutting-plane line a-a' in FIG. 131. FIG. 133 is a schematic sectional view taken along the cutting-plane line b-b' in FIG. 132, and FIG. 134 is a schematic sectional view taken along the cutting-plane line c-c' in FIG. 132.

In the twenty-third embodiment, in view of providing a higher punch-through voltage, it is desirable that the second-conductive type low-concentration impurity region 521 of the second silicon pillar 820 including a region with an impurity concentration of 1E18 (cm$^{-3}$) or less has a sufficiently-large area. In other words, it is desirable that a diameter Ts and a height Ls of the second-conductive type impurity region 521 are sufficiently large.

In the twenty-third embodiment, as with the fifteenth embodiment, it is desirable to satisfy the following relation (23-1) to provide a higher punch-through voltage:

$$Ls > \frac{Ts}{4} \qquad (23\text{-}1)$$

Further, in the twenty-third embodiment, it is necessary to satisfy the following relation (23-2), as with the fifteenth embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ls \qquad (23\text{-}2)$$

(Twenty-Fourth Embodiment) Semiconductor Device

FIG. 135 is a schematic bird's-eye view of a transistor as a semiconductor device of the present invention, wherein the first-conductive type impurity region of the first silicon layer 810 in the sixteenth embodiment is formed as a second-conductive type impurity region 511 including a region having an impurity concentration of 1E18 (cm$^{-3}$) or less. FIG. 136 is a schematic sectional view taken along the cutting-plane line a-a' in FIG. 135. FIG. 137 is a schematic sectional view taken along the cutting-plane line b-b' in FIG. 136, and FIG. 138 is a schematic sectional view taken along the cutting-plane line c-c' in FIG. 136.

In the twenty-fourth embodiment, in view of providing a higher punch-through voltage, it is desirable that the second-conductive type low-concentration impurity region 511 of the first silicon pillar 810 including a region with an impurity concentration of 1E18 (cm$^{-3}$) or less has a sufficiently-large area. In other words, it is desirable that a diameter Ts and a height Ls of the second-conductive type impurity region 511 are sufficiently large.

In the twenty-fourth embodiment, as with the sixteenth embodiment, it is desirable to satisfy the following relation (24-1) to provide a higher punch-through voltage:

$$Ld > \frac{Td}{4} \qquad (24\text{-}1)$$

Further, in the twenty-fourth embodiment, it is necessary to satisfy the following relation (24-2), as with the sixteenth embodiment, to prevent a silicon pillar of a MOSFET adjacent to a target MOSFET from disturbing ion implantation into the target MOSFET:

$$\tan\left(\frac{\pi}{36}\right) \cdot Tspace - (Lg + Ljs + Ljd) > Ld \qquad (24\text{-}2)$$

What is claimed is:

1. A semiconductor device comprising:
a first-conductive type first silicon pillar:
a first dielectric surrounding a side surface of the first silicon pillar;
a gate surrounding the dielectric;
a second silicon pillar provided underneath the first silicon pillar; and
a third silicon pillar provided on a top of the first silicon pillar,
wherein:
the second silicon pillar includes a second-conductive type high-concentration impurity region in a surface thereof except at least a part of a contact surface region with the first silicon pillar, and a first-conductive type impurity region therein and surrounded by the second-conductive type high-concentration impurity region; and
the third silicon pillar includes a second-conductive type high-concentration impurity region in a surface thereof except at least a part of a contact surface region with the first silicon pillar, and a first-conductive type impurity region therein and surrounded by the second-conductive type high-concentration impurity region of the third silicon pillar,
and wherein:
the first-conductive type impurity region of the second silicon pillar has a length greater than that of a depletion layer extending from a base portion of the second-conductive type high-concentration impurity region of the second silicon pillar; and
the first-conductive type impurity region of the third silicon pillar has a length greater than that of a depletion layer extending from a base portion of the second-conductive type high-concentration impurity region of the third silicon pillar.

2. The semiconductor device as defined in claim 1, which satisfies the following relations (1) and (2):

$$Ls > \frac{Ts}{4}, \qquad (1)$$

wherein: Ls and Ts are, respectively, a length and a diameter of the first-conductive type impurity region of the third silicon pillar on a source side; and $$Ld > \frac{Td}{4}, \quad (2)$$

wherein Ld and Td are, respectively, a length and a diameter of the first-conductive type impurity region of the second silicon pillar on a drain side.

3. The semiconductor device as defined in claim 1, wherein:
the first silicon pillar comprises a high resistance region;
the first-conductive type impurity region of the second silicon pillar comprises a high resistance region; and
the first-conductive type impurity region of the third silicon pillar comprises a high resistance region.

4. The semiconductor device as defined in claim 1, wherein each of the first-conductive type impurity region of the second silicon pillar and the first-conductive type impurity region of the third silicon pillar has a diameter greater than that of the first silicon pillar.

5. The semiconductor device as defined in claim 1, wherein the first silicon pillar comprises a high resistance region or a first-conductive type impurity region, and wherein:
the first-conductive type impurity region of the second silicon pillar comprises a second-conductive type impurity region including a region having an impurity concentration of $1E18/cm^3$ or less; and
the first-conductive type impurity region of the third silicon pillar comprises a second-conductive type impurity region including a region having an impurity concentration of $1E18/cm^3$ or less.

6. The semiconductor device as defined in claim 5, wherein each of the second-conductive type impurity region of the second silicon pillar and the second-conductive type impurity region of the third silicon pillar has a diameter greater than that of the first silicon pillar.

7. A semiconductor device comprising:
a first-conductive type first silicon pillar:
a first dielectric surrounding a side surface of the first silicon pillar;
a gate surrounding the dielectric;
a second silicon pillar underneath the first silicon pillar; and
a third silicon pillar on a top of the first silicon pillar,
wherein:
the second silicon pillar includes a second-conductive type high-concentration impurity region in a surface thereof except at least a part of a contact surface region with the first silicon pillar, and a first-conductive type impurity region therein and surrounded by the second-conductive type high-concentration impurity region; and
the third silicon pillar includes a second-conductive type high-concentration impurity region in a surface thereof except at least a part of a contact surface region with the first silicon pillar, and a first-conductive type impurity region therein and surrounded by the second-conductive type high-concentration impurity region of the third silicon pillar,
and wherein:
each of the first-conductive type impurity region of the second silicon pillar and the first-conductive type impurity region of the third silicon pillar has a length sufficient to accommodate the second-conductive type high-concentration impurity region of the second silicon pillar and the second-conductive type high-concentration impurity region of the third silicon pillar.

8. The semiconductor device as defined in claim 7, which satisfies the following relation:

$$\tan\left(\frac{\pi}{36}\right) \cdot Tspace - (Lg + Ljs + Ljd) > Ls + Ld,$$

wherein: Tspace is a distance between adjacent two of a plurality of the semiconductor devices formed on a silicon substrate;
Lg is a length of the gate;
Ljd is a depth of the second-conductive type high-concentration impurity region formed in the second silicon pillar to serve as a drain;
Ljs is a depth of the second-conductive type high-concentration impurity region formed in the third silicon pillar to serve as a source;
Ld is a length of the first-conductive type impurity region of the second silicon pillar; and
Ls is a length of the first-conductive type impurity region of the third silicon pillar.

9. The semiconductor device as defined in claim 7, wherein:
the first silicon pillar comprises a high resistance region;
the first-conductive type impurity region of the second silicon pillar comprises a high resistance region; and
the first-conductive type impurity region of the third silicon pillar comprises a high resistance region.

10. The semiconductor device as defined in claim 7, wherein each of the first-conductive type impurity region of the second silicon pillar and the first-conductive type impurity region of the third silicon pillar has a diameter greater than that of the first silicon pillar.

11. The semiconductor device as defined in claim 7, wherein the first silicon pillar comprises a high resistance region or a first-conductive type impurity region, and wherein:
the first-conductive type impurity region of the second silicon pillar comprises a second-conductive type impurity region including a region having an impurity concentration of $1E18/cm^3$ or less; and
the first-conductive type impurity region of the third silicon pillar comprises a second-conductive type impurity region including a region having an impurity concentration of $1E18/cm^3$ or less.

12. A semiconductor device comprising:
a first-conductive type first silicon pillar:
a first dielectric surrounding a side surface of the first silicon pillar;
a gate surrounding the dielectric;
a second silicon pillar underneath the first silicon pillar; and
a third silicon pillar on a top of the first silicon pillar,
wherein:
the second silicon pillar comprises a second-conductive type high-concentration impurity region; and
the third silicon pillar includes a second-conductive type high-concentration impurity region in all surfaces thereof except at least a part of a contact surface region with the first silicon pillar, and a first-conductive type impurity region therein and surrounded by the second-conductive type high-concentration impurity region of the third silicon pillar, and wherein the first-conductive type impurity region of the third silicon pillar has a length greater than that of a depletion layer extending from a base portion of the second-conductive type high-concentration impurity region of the third silicon pillar.

13. The semiconductor device as defined in claim 12, which satisfies the following relation:

$$Ls > \frac{Ts}{4},$$

wherein Ls and Ts are, respectively, a length and a diameter of the first-conductive type impurity region of the third silicon pillar on a source side.

14. The semiconductor device as defined in claim 12, wherein:
the first silicon pillar comprises a high resistance region;
the first-conductive type impurity region of the second silicon pillar comprises a high resistance region; and
the first-conductive type impurity region of the third silicon pillar comprises a high resistance region.

15. The semiconductor device as defined in claim 12, wherein each of the first-conductive type impurity region of the second silicon pillar and the first-conductive type impurity region of the third silicon pillar has a diameter greater than that of the first silicon pillar.

16. The semiconductor device as defined in claim 12, wherein the first silicon pillar comprises a high resistance region or a first-conductive type impurity region, and wherein:
the first-conductive type impurity region of the second silicon pillar comprises a second-conductive type impurity region including a region having an impurity concentration of $1E18/cm^3$ or less; and
the first-conductive type impurity region of the third silicon pillar comprises a second-conductive type impurity region including a region having an impurity concentration of $1E18/cm^3$ or less.

17. A semiconductor device comprising:
a first-conductive type first silicon pillar:
a first dielectric surrounding a side surface of the first silicon pillar;
a gate surrounding the dielectric;
a second silicon pillar underneath the first silicon pillar; and
a third silicon pillar on a top of the first silicon pillar, wherein:
the second silicon pillar comprises a second-conductive type high-concentration impurity region; and
the third silicon pillar has a second-conductive type high-concentration impurity region in all surfaces thereof except at least a part of a contact surface region with the first silicon pillar, and a first-conductive type impurity region therein and surrounded by the second-conductive type high-concentration impurity region of the third silicon pillar,
and wherein the first-conductive type impurity region of the third silicon pillar has a length sufficient to accommodate the second-conductive type high-concentration impurity region of the second silicon pillar and the second-conductive type high-concentration impurity region of the third silicon pillar.

18. The semiconductor device as defined in claim 17, which satisfies the following relation:

$$\tan\left(\frac{\pi}{36}\right) \cdot Tspace - (Lg + Ljs + Ljd) > Ld,$$

wherein: Tspace is a distance between adjacent two of a plurality of the semiconductor devices formed on a silicon substrate;
Lg is a length of the gate;
Ljd is a height of the second-conductive type high-concentration impurity region formed in the second silicon pillar to serve as a drain;
Ljs is a depth of the second-conductive type high-concentration impurity region formed in the third silicon pillar to serve as a source; and
Ls is a length of the first-conductive type impurity region of the third silicon pillar.

19. The semiconductor device as defined in claim 17, wherein:
the first silicon pillar comprises a high resistance region;
the first-conductive type impurity region of the second silicon pillar comprises a high resistance region; and
the first-conductive type impurity region of the third silicon pillar comprises a high resistance region.

20. The semiconductor device as defined in claim 17, wherein each of the first-conductive type impurity region of the second silicon pillar and the first-conductive type impurity region of the third silicon pillar has a diameter greater than that of the first silicon pillar.

21. The semiconductor device as defined in claim 17, wherein the first silicon pillar comprises a high resistance region or a first-conductive type impurity region, and wherein:
the first-conductive type impurity region of the second silicon pillar comprises a second-conductive type impurity region including a region having an impurity concentration of $1E18/cm^3$ or less; and
the first-conductive type impurity region of the third silicon pillar comprises a second-conductive type impurity region including a region having an impurity concentration of $1E18/cm^3$ or less.

22. A semiconductor device comprising:
a first-conductive type first silicon pillar:
a first dielectric surrounding a side surface of the first silicon pillar;
a gate surrounding the dielectric and a gate depletion layer extending in the first-conductive type first silicon pillar;
a second silicon pillar underneath the first silicon pillar; and
a third silicon pillar on a top of the first silicon pillar, and comprising a second-conductive type high-concentration impurity region,
wherein the second silicon pillar includes a second-conductive type high-concentration impurity region in a surface thereof except at least a part of a contact surface region with the first silicon pillar, and includes a first-conductive type impurity region therein and surrounded by the second-conductive type high-concentration impurity region of the second silicon pillar,
and wherein the first-conductive type impurity region has a length greater than that of a source/drain depletion layer extending from a base portion of the second-conductive type high-concentration impurity region of the second silicon pillar and the source/drain depletion layer is spaced apart from the gate depletion layer, wherein the first silicon pillar comprises a high resistance region or a first-conductive type impurity region, and wherein:

the first-conductive type impurity region of the second silicon pillar comprises a second-conductive type impurity region including a region having an impurity concentration of 1E18/cm$^3$ or less; and the first-conductive type impurity region of the third silicon pillar comprises a second-conductive type impurity region including a region having an impurity concentration of 1E18/cm$^3$ or less.

23. A semiconductor device comprising:

a first-conductive type first silicon pillar:

a first dielectric surrounding a side surface of the first silicon pillar;

a gate surrounding the dielectric;

a second silicon pillar underneath the first silicon pillar; and a third silicon pillar on a top of the first silicon pillar, the third silicon pillar includes a second-conductive type high-concentration impurity region therein, wherein the second silicon pillar includes a second-conductive type high-concentration impurity region in a surface thereof except at least a part of a contact surface region with the first silicon pillar, and a first-conductive type impurity region therein and surrounded by the second-conductive type high-concentration impurity region of the second silicon pillar, wherein the first-conductive type impurity region of the second silicon pillar has a length which is short enough with respect to a distance between an adjacent two of a plurality of the semiconductor devices on a silicon substrate to enable the second-conductive type high-concentration impurity region of the third silicon pillar and the second-conductive type high-concentration impurity region of the second silicon pillar to comprise injected ions, and wherein $$\tan\left(\frac{\pi}{36}\right) \cdot Tspace - (Lg + Ljs + Ljd) > Ld,$$

where Tspace is the distance between the adjacent semiconductor devices;

Lg is a length of the gate;

Ljd is a height of the second-conductive type high-concentration impurity region in the second silicon pillar to serve as a drain;

Ljs is a depth of the second-conductive type high-concentration impurity region in the third silicon pillar to serve as a source; and Ld is a length of the first-conductive type impurity region of the second silicon pillar, wherein the first silicon pillar comprises a high resistance region or a first-conductive type impurity region, and wherein:

the first-conductive type impurity region of the second silicon pillar comprises a second-conductive type impurity region including a region having an impurity concentration of 1E18/cm$^3$ or less; and the first-conductive type impurity region of the third silicon pillar comprises a second-conductive type impurity region including a region having an impurity concentration of 1E18/cm$^3$ or less.

* * * * *